(12) United States Patent
Sakaguchi et al.

(10) Patent No.: US 11,749,749 B2
(45) Date of Patent: ***Sep. 5, 2023

(54) SEMICONDUCTOR DEVICE

(71) Applicant: ROHM CO., LTD., Kyoto (JP)

(72) Inventors: Takui Sakaguchi, Kyoto (JP); Masatoshi Aketa, Kyoto (JP); Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 72 days.

This patent is subject to a terminal disclaimer.

(21) Appl. No.: 17/371,752

(22) Filed: Jul. 9, 2021

(65) Prior Publication Data

US 2021/0336049 A1 Oct. 28, 2021

Related U.S. Application Data

(63) Continuation of application No. 16/479,886, filed as application No. PCT/JP2018/002357 on Jan. 25, 2018, now Pat. No. 11,088,272.

(30) Foreign Application Priority Data

Jan. 25, 2017 (JP) ................................ 2017-011609

(51) Int. Cl.
   *H01L 29/78* (2006.01)
   *H01L 21/04* (2006.01)
   (Continued)

(52) U.S. Cl.
   CPC ........ *H01L 29/7806* (2013.01); *H01L 21/049* (2013.01); *H01L 29/0696* (2013.01); *H01L 29/1608* (2013.01); *H01L 29/66068* (2013.01)

(58) Field of Classification Search
   None
   See application file for complete search history.

(56) References Cited

U.S. PATENT DOCUMENTS 5,410,170 A 4/1995 Bulucea et al.
8,377,756 B1 2/2013 Arthur et al.
(Continued)

FOREIGN PATENT DOCUMENTS

CN 104900591 A 9/2015
CN 105074921 A 11/2015
(Continued)

OTHER PUBLICATIONS

Chinese Patent Office: Second Office Action of CN 201880008179.1 (related application); dated May 24, 2022; 16 pages.
(Continued)

*Primary Examiner* — J. E. Schoenholtz
(74) *Attorney, Agent, or Firm* — XSENSUS LLP

(57) ABSTRACT

A semiconductor device includes a semiconductor layer having a first main surface on one side and a second main surface on the other side, a unit cell including a diode region of a first conductivity type formed in a surface layer portion of the first main surface of the semiconductor layer, a well region of a second conductivity type formed in the surface layer portion of the first main surface of the semiconductor layer along a peripheral edge of the diode region, and a first conductivity type region formed in a surface layer portion of the well region, a gate electrode layer facing the well region and the first conductivity type region through a gate insulating layer and a first main surface electrode covering the diode region and the first conductivity type region on the first main surface of the semiconductor layer, and forming a Schottky junction with the diode region and an ohmic junction with the first conductivity type region.

20 Claims, 42 Drawing Sheets

(51) Int. Cl.
*H01L 29/06* (2006.01)
*H01L 29/16* (2006.01)
*H01L 29/66* (2006.01)

(56) References Cited

U.S. PATENT DOCUMENTS

| | | | |
|---|---|---|---|
| 9,583,482 B2 | 2/2017 | Matocha et al. | |
| 11,088,272 B2* | 8/2021 | Sakaguchi | H01L 29/7806 |
| 2002/0047176 A1 | 4/2002 | Takahashi | |
| 2004/0056284 A1 | 3/2004 | Nagaoka et al. | |
| 2013/0313576 A1 | 11/2013 | Rohm | |
| 2014/0175508 A1 | 6/2014 | Suzuki et al. | |
| 2015/0349051 A1 | 12/2015 | Uchida et al. | |
| 2016/0079411 A1 | 3/2016 | Hino et al. | |
| 2016/0111499 A1 | 4/2016 | Hisamoto et al. | |
| 2016/0233210 A1 | 8/2016 | Matocha et al. | |
| 2017/0133503 A1 | 5/2017 | Matocha et al. | |

FOREIGN PATENT DOCUMENTS

| | | |
|---|---|---|
| DE | 10322594 A1 | 12/2003 |
| DE | 112014001838 T5 | 12/2015 |
| JP | 2004047923 A | 2/2004 |
| JP | 200735736 A | 2/2007 |
| JP | 2007035736 A | 2/2007 |
| JP | 2012049562 A | 3/2012 |
| JP | 2014127555 A | 7/2014 |
| JP | 2015162577 A | 9/2015 |
| KR | 1020170118129 A | 10/2017 |
| WO | 2011136272 A1 | 11/2011 |
| WO | 2012105611 A1 | 8/2012 |
| WO | 2014155651 A1 | 10/2014 |
| WO | 2014162969 A1 | 10/2014 |
| WO | 2016130783 A1 | 8/2016 |

OTHER PUBLICATIONS

Japanese Patent Office: Notification of Reasons for Refusal of JP Patent Application on No. 2018-564636 (related application); Onda, Kazuhiko; dated Feb. 3, 2022; 17 pages.

Patent Cooperation Treaty: International Search Report and Written Opinion of PCT/JP2018/002357; dated Apr. 10, 2018; 13 pages (including English translation for the International Search Report only).

PCT: International Preliminary Report on Patentability of PCT/JP2018/002357 (related application); dated Aug. 8, 2019; 25 pages.

The State Intellectual Property Office of People's Republic of China; Decision of Refusal for Chinese Patent Application 201880008179.1 (related application); dated Jan. 5, 2023; 13 pages.

The State Intellectual Property Office of People's Republic of China: Notice of Reexamination of CN 201880008179.1 (related application); dated May 24, 2023; 8 pages.

* cited by examiner

FIG. 2
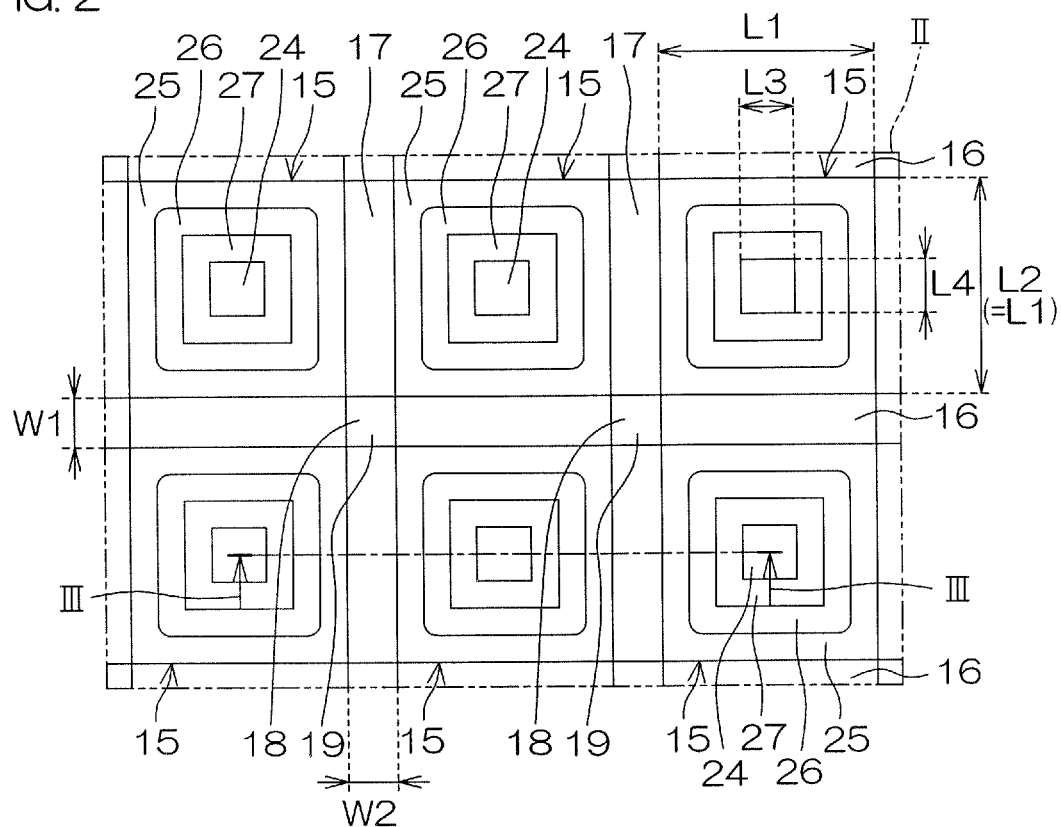
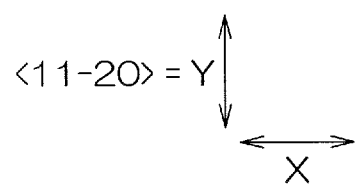

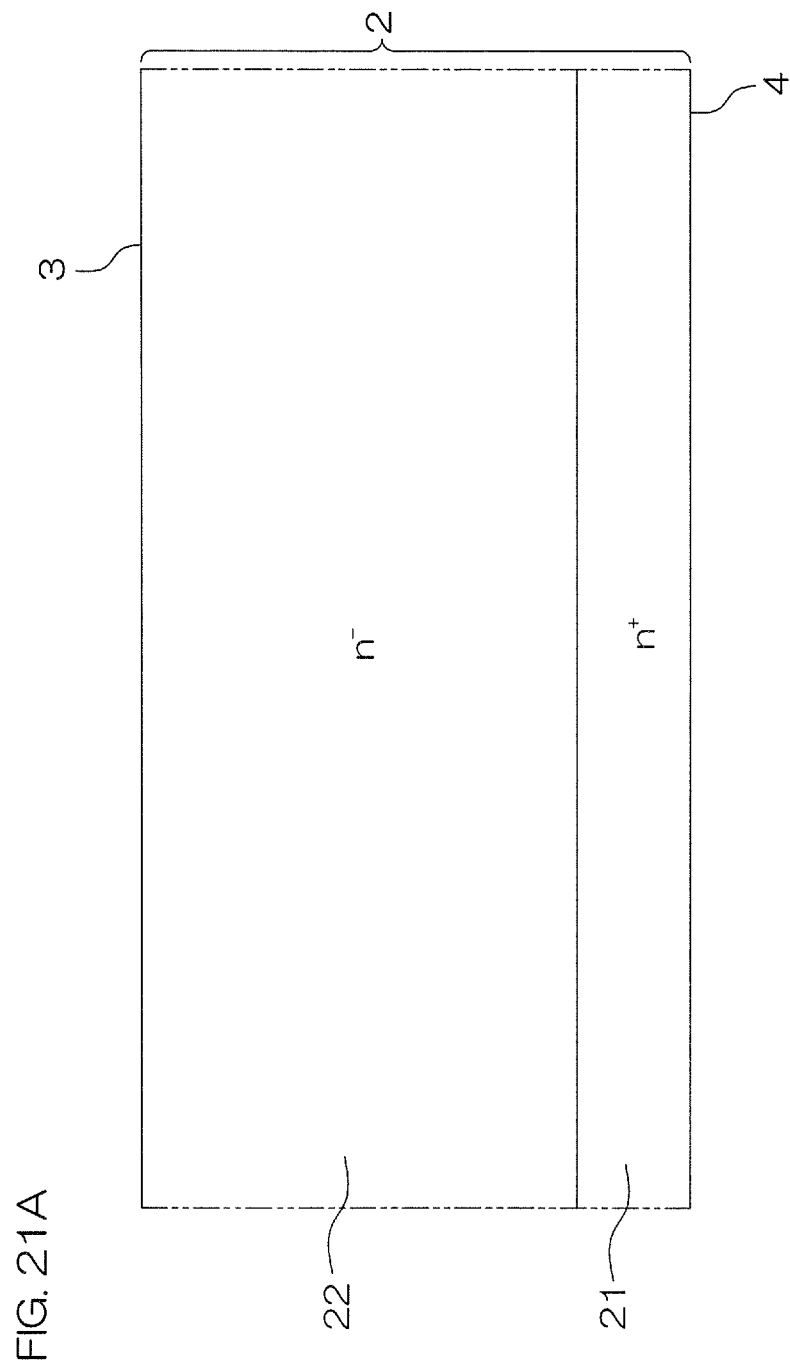

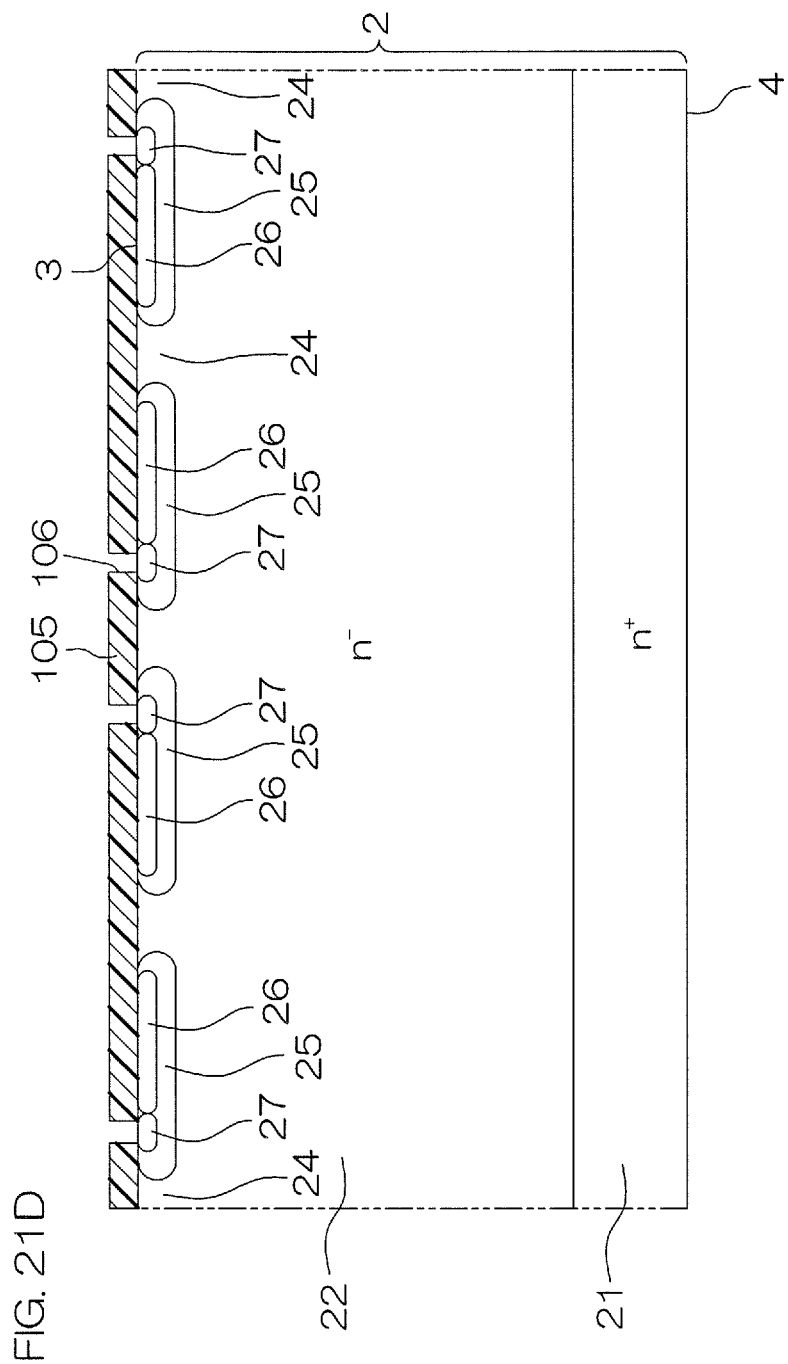

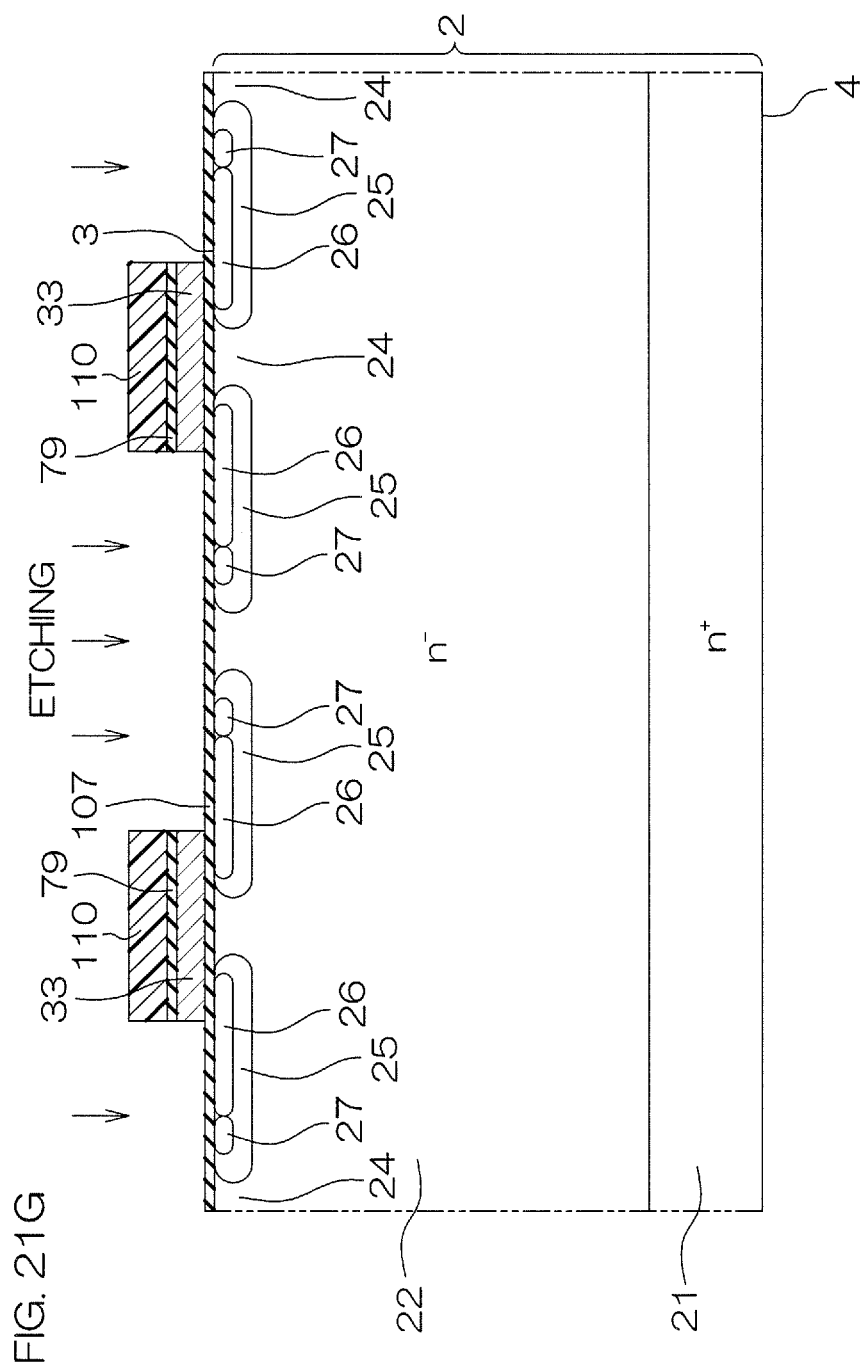

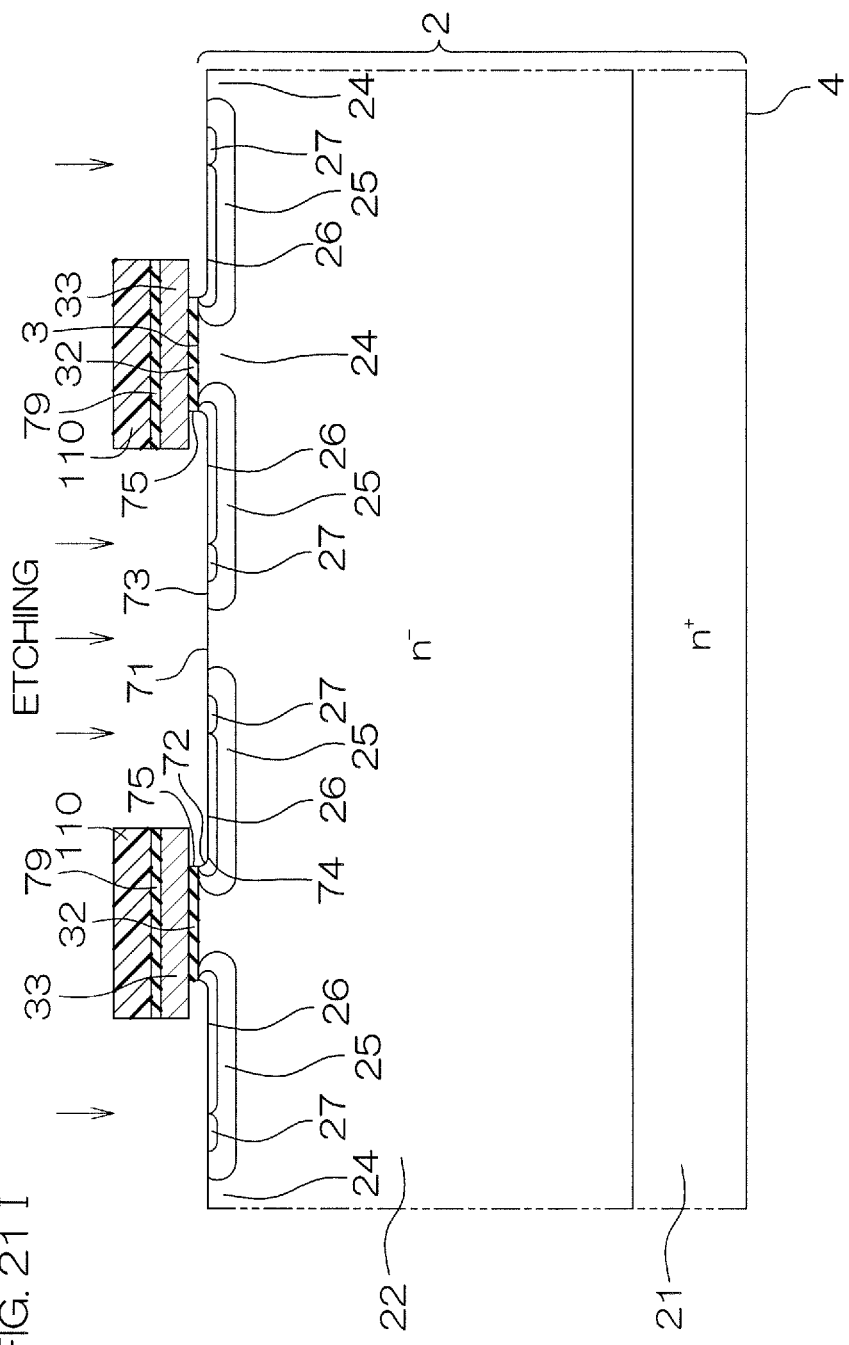

SEMICONDUCTOR DEVICE

CROSS-REFERENCE TO RELATED APPLICATIONS

This application is a Continuation of U.S. patent application Ser. No. 16/479,886, filed Jul. 22, 2019, entitled SEMICONDUCTOR DEVICE, which is a U.S. National Phase application submitted under 35 U.S.C. § 371 of Patent Cooperation Treaty application serial no. PCT/JP2018/002357, filed Jan. 25, 2018, and entitled SEMICONDUCTOR DEVICE, which claims priority to Japanese patent application serial no. 2017-011609, filed Jan. 25, 2017, and entitled 半導体装置.

Patent Cooperation Treaty application serial no. PCT/JP2018/002357, published as WO 2018/139556 A1, and Japanese Patent Application serial no. 2017-011609, are incorporated by reference herein in their entirety.

TECHNICAL FIELD

The present invention relates to a semiconductor device.

BACKGROUND ART

FIG. 14 in Patent Literature 1 discloses a semiconductor device including an SiC epitaxial layer in which a gate trench is formed and a Schottky cell and a p-n diode cell that are formed in the SiC epitaxial layer so as to be separated from each other by the gate trench.

This semiconductor device uses a Schottky cell to form a Schottky barrier diode. The device also uses a p-n diode cell to form a metal insulator semiconductor field effect transistor (MISFET).

In an SiC epitaxial layer, one cell group is formed by single Schottky cell and a plurality of p-n diode cells surrounding the one Schottky cell. A plurality of cell groups each having such a structure are arrayed in a matrix pattern in the SiC epitaxial layer.

CITATION LIST

Patent Literature

Patent Literature 1: WO 2012/105611 A1

SUMMARY OF THE INVENTION

Technical Problem

The present inventors have found as a result of earnest studies on the semiconductor device according to Patent Literature 1 that there is room for reducing the conduction loss of a Schottky barrier diode. The conduction loss of the Schottky barrier diode decreases as the rate of increase in forward current increases with respect to the rate of increase in forward voltage.

The semiconductor device according to Patent Literature 1 has a structure in which the Schottky cell and the p-n diode are formed separately from each other. In this structure, current paths for the Schottky cell and current paths for the p-n diode cell are scattered in the semiconductor layer.

For this reason, even an increase in forward voltage will not lead to an increase in forward current as expected. This problem produces an adverse effect in achieving a reduction in conduction loss of a Schottky barrier diode.

Accordingly, a preferred embodiment of the present invention provides a semiconductor device that can achieve a reduction in conduction loss of a Schottky barrier diode.

Solution to the Problem

A preferred embodiment of the present invention provides a semiconductor device including a semiconductor layer having a first main surface on one side and a second main surface on the other side, a unit cell including a diode region of a first conductivity type formed in a surface layer portion of the first main surface of the semiconductor layer, a well region of a second conductivity type formed in the surface layer portion of the first main surface of the semiconductor layer along a peripheral edge of the diode region, and a first conductivity type region formed in a surface layer portion of the well region, a gate electrode layer facing the well region and the first conductivity type region through a gate insulating layer and a first main surface electrode covering the diode region and the first conductivity type region on the first main surface of the semiconductor layer, and forming a Schottky junction with the diode region and an ohmic junction with the first conductivity type region.

According to this semiconductor device, a first main surface electrode forms a Schottky junction with a diode region and forms an ohmic junction with a first conductivity type region of a transistor. This forms a Schottky barrier diode and an insulating gate type transistor in one unit cell.

Accordingly, current paths for a Schottky barrier diode and current paths for a transistor are formed in a region directly below a unit cell in a semiconductor layer. This makes it possible to suppress the current paths for the Schottky barrier diode and the current paths for the transistor from being scattered in the semiconductor layer. As a consequence, because the rate of increase in forward current can be increased with respect to the rate of increase in forward voltage, it is possible to reduce the conduction loss of the Schottky barrier diode.

The above and other objects, features, and effects of the present invention will be more apparent in the preferred embodiments described next with reference to the accompanying drawings.

BRIEF DESCRIPTION OF THE DRAWINGS

FIG. 2 is an enlarged view of a region II shown in FIG. 1, from which a structure located higher than the first main surface of the semiconductor layer is removed.

FIG. 21A is a sectional view for explaining an example of a method of manufacturing the semiconductor device shown in FIG. 15.

FIG. 21D is a sectional view showing a step after FIG. 21C.

FIG. 21G is a sectional view showing a step after FIG. 21F.

FIG. 21I is a sectional view showing a step after FIG. 21H.

DESCRIPTION OF THE EMBODIMENTS

Figure 1:
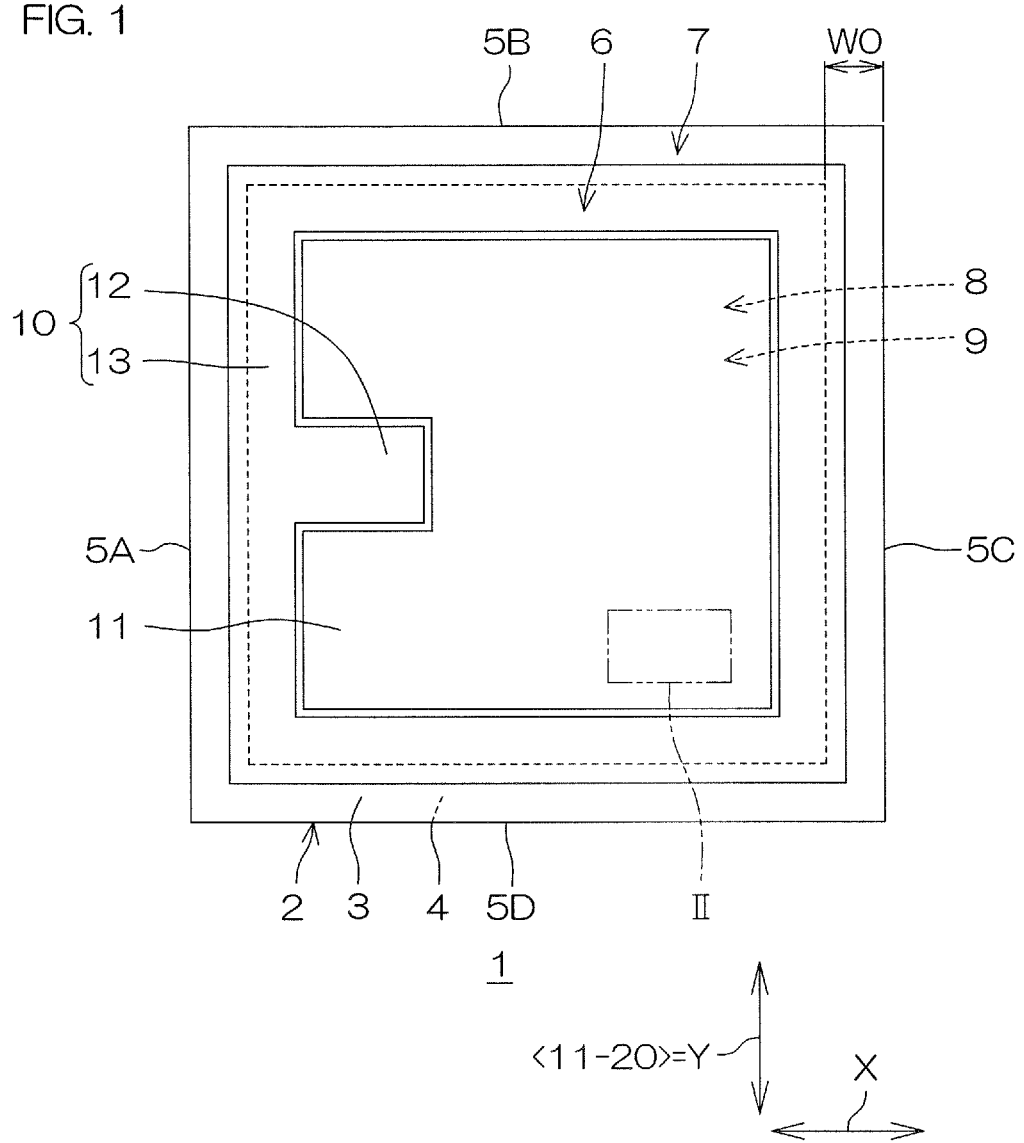
FIG. 1 is a plan view of a semiconductor device according to the first preferred embodiment of the present invention.

FIG. 1 is a plan view of a semiconductor device 1 according to the first preferred embodiment of the present invention.

The semiconductor device 1 includes a semiconductor layer 2 in the form of a chip. The semiconductor layer 2 includes a first main surface 3 on one side, a second main surface 4 on the other side, and four side surfaces 5A, 5B, 5C, and 5D connecting the first main surface 3 and the second main surface 4.

The first main surface 3 and the second main surface 4 of the semiconductor layer 2 are formed in rectangular shapes in plan view seen from the normal line direction to them (to be simply referred to as "plan view" hereinafter). The side surface 5A faces the side surface 5C. The side surface 5B faces the side surface 5D.

A device formation region 6 and an outer region 7 are set in the semiconductor layer 2. The device formation region 6 is a region in which a Schottky barrier diode (SBD) 8 and a metal insulator semiconductor field effect transistor (MISFET) 9 as an example of an insulating gate type transistor are formed. The device formation region 6 is also called an active region.

The device formation region 6 is set in a central region of the semiconductor layer 2 with a space being provided from the peripheral edge of the semiconductor layer 2 to an inward region of the semiconductor layer 2 in plan view. In this preferred embodiment, the device formation region 6 is set to have a rectangular shape having four sides parallel to the side surfaces 5A to 5D of the semiconductor layer 2 in plan view.

The outer region 7 is set as a region between the peripheral edge of the semiconductor layer 2 and the peripheral edge of the device formation region 6. The outer region 7 is set in an endless shape (rectangular ring shape) surrounding the device formation region 6 in plan view.

A ratio SE/SF of a plane area SF of the device formation region 6 with respect to a plane area SE of the first main surface 3 of the semiconductor layer 2 may be between 70% and 85% (inclusive). The plane area SE of the first main surface 3 of the semiconductor layer 2 may be between 16 $mm^2$ and 25 $mm^2$ (inclusive). A width WO of the outer region 7 may be between 0.1 mm and 0.3 mm (inclusive). The width WO of the outer region 7 is defined by the width of the outer region 7 in a direction perpendicular to the extending direction of the outer region 7.

A gate electrode 10 and a source electrode 11 (first main surface electrode) are formed on the first main surface 3 of the semiconductor layer 2. The gate electrode 10 includes a gate pad 12 and a gate finger 13.

The gate pad 12 is formed along an arbitrary side surface (the side surface 5A in this preferred embodiment) in plan view. The gate pad 12 is formed in a central region of the side surface 5A in plan view. In this preferred embodiment, the gate pad 12 is drawn out from the outer region 7 to the device formation region 6 so as to cross the boundary between the outer region 7 and the device formation region 6.

In this preferred embodiment, the gate pad 12 is formed in a quadrilateral shape in plan view. The gate pad 12 may be formed along one corner portion connecting two of the side surfaces 5A to 5D which extend along directions intersecting (orthogonal) each other in plan view.

The gate finger 13 is drawn out in a strip shape from the gate pad 12 so as to extend along the peripheral edge of the device formation region 6. In this preferred embodiment, the gate finger 13 is formed in an endless shape (quadrilateral ring shape) surrounding the device formation region 6 in plan view. The gate finger 13 may be formed to define the device formation region 6 from three directions.

The source electrode 11 is formed into a C-shaped region by being partitioned by the inner edge of the gate electrode 10 in plan view. In this preferred embodiment, the source electrode 11 is formed in a C shape along the inner edge of the gate electrode 10 in plan view.

The source electrode 11 covers most of the device formation region 6. The source electrode 11 may have a structure having a plurality of electrode portions divided from each other, with the plurality of electrode portions covering the device formation region 6.

In this preferred embodiment, a first bonding wire for a gate is connected to the gate pad 12. The first bonding wire may be an aluminum wire. In the preferred embodiment, a second bonding wire for a source is connected to the source electrode 11. The second bonding wire may be an aluminum wire.

FIG. 2 is an enlarged view of a region II shown in FIG. 1, from which a structure located higher than the first main surface 3 of the semiconductor layer 2 is removed.

Referring to FIG. 2, unit cells 15, each forming the SBD 8 and the MISFET 9, are formed in the device formation region 6. FIG. 2 shows an example in which the plurality of unit cells 15 are arrayed in a matrix pattern.

The plurality of unit cells 15 are formed at intervals along an arbitrary first direction X and a second direction Y intersecting the first direction X. The first direction X is a direction along arbitrary side surfaces (the side surfaces 5B and 5D in this preferred embodiment) of the side surfaces 5A to 5D of the semiconductor layer 2. The second direction Y is a direction along side surfaces (the side surfaces 5A and 5C in this preferred embodiment) orthogonal to the arbitrary side surfaces. In this preferred embodiment, the second direction Y is a direction orthogonal to the first direction X.

Each unit cell 15 is formed in a quadrilateral shape in plan view. Here, an aspect ratio L2/L1 of the unit cell 15 is "1." The aspect ratio L2/L1 is defined by the ratio of a length L2 of one side of the unit cell 15 along the second direction Y to a length L1 of one side of the unit cell 15 along the first direction X.

That is, in this preferred embodiment, the unit cell 15 is formed in a square shape in plan view. The length L1 of one side and the length L2 of one side of the unit cell 15 each may be between 5 μm and 15 μm (inclusive) (for example, about 10 μm).

A first line portion 16, a second line portion 17, and an intersecting portion 18 are formed on the first main surface 3 of the semiconductor layer 2. The first line portion 16, the second line portion 17, and the intersecting portion 18 each are formed from the first main surface 3 of the semiconductor layer 2 which is exposed from the unit cell 15.

The first line portion 16 extends in a region between the plurality of unit cells 15 along the first direction X and defines a region between the plurality of unit cells 15 adjacent to each other in the second direction Y. The second line portion 17 extends in a region between the plurality of unit cells 15 along the second direction Y and defines a region between the plurality of unit cells 15 adjacent to each other in the first direction X. The intersecting portion 18 is a portion where the first line portion 16 and the second line portion 17 intersect each other.

A width W1 of the first line portion 16 in the second direction Y may be between 0.8 and 3.0 μm (inclusive). A width W2 of the second line portion 17 in the first direction X may be between 0.8 μm and 3.0 μm (inclusive).

An impurity region 19 is formed in a surface layer portion of the first main surface 3 of the semiconductor layer 2 in each intersecting portion 18. The impurity region 19 relaxes the electric field generated in the surface layer portion of the first main surface 3 of the semiconductor layer 2, particularly between the adjacent unit cells 15. The impurity regions 19 suppress a reduction in the breakdown voltage of the semiconductor device 1.

In this preferred embodiment, each impurity region 19 includes a p-type impurity region or p$^+$-type impurity region. The impurity region 19 forms a p-n junction portion with the semiconductor layer 2 (an n$^-$-type epitaxial layer 22 to be described later).

Figure 3:
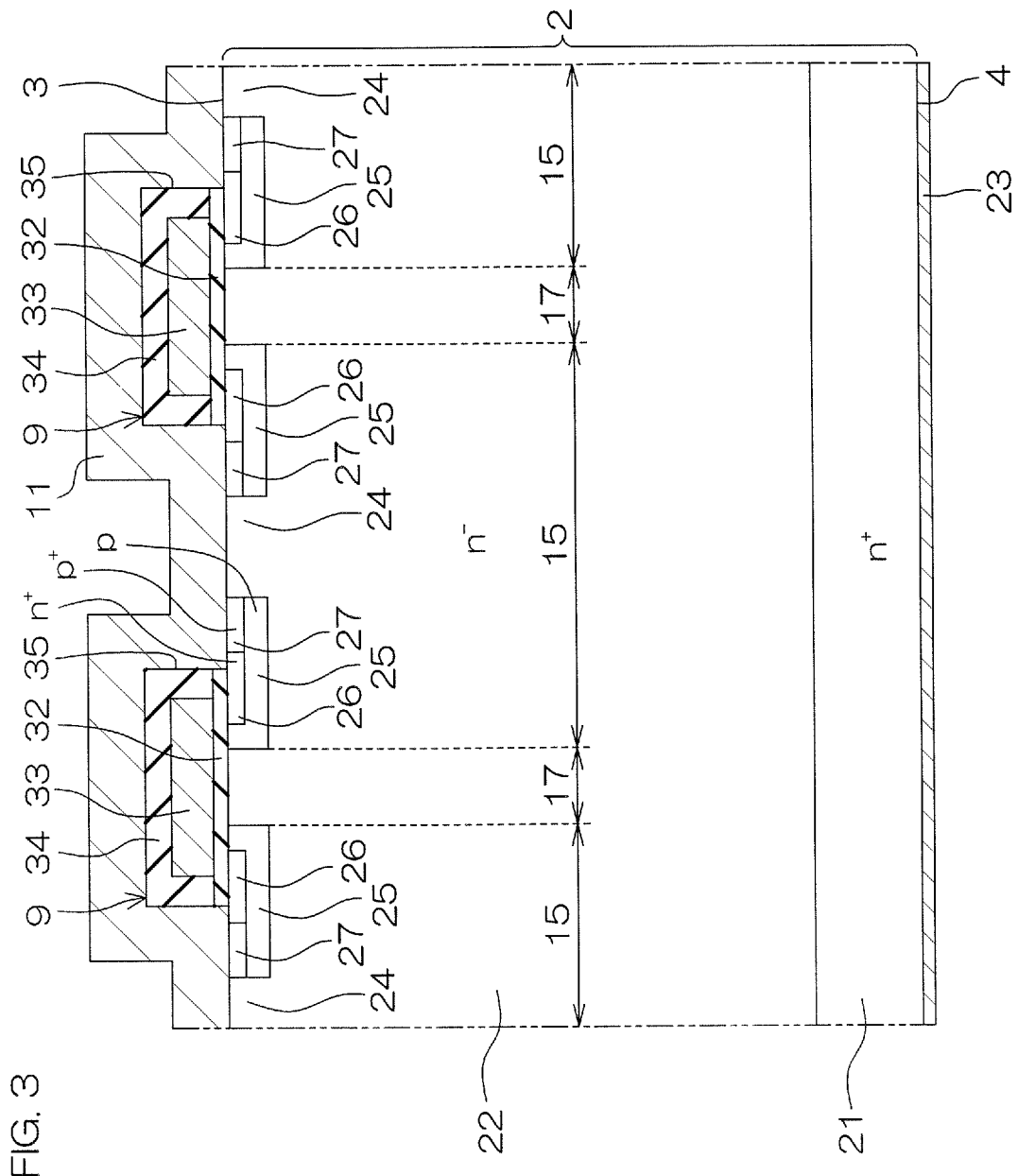
FIG. 3 is a sectional view taken along line in FIG. 2.
Figure 4:
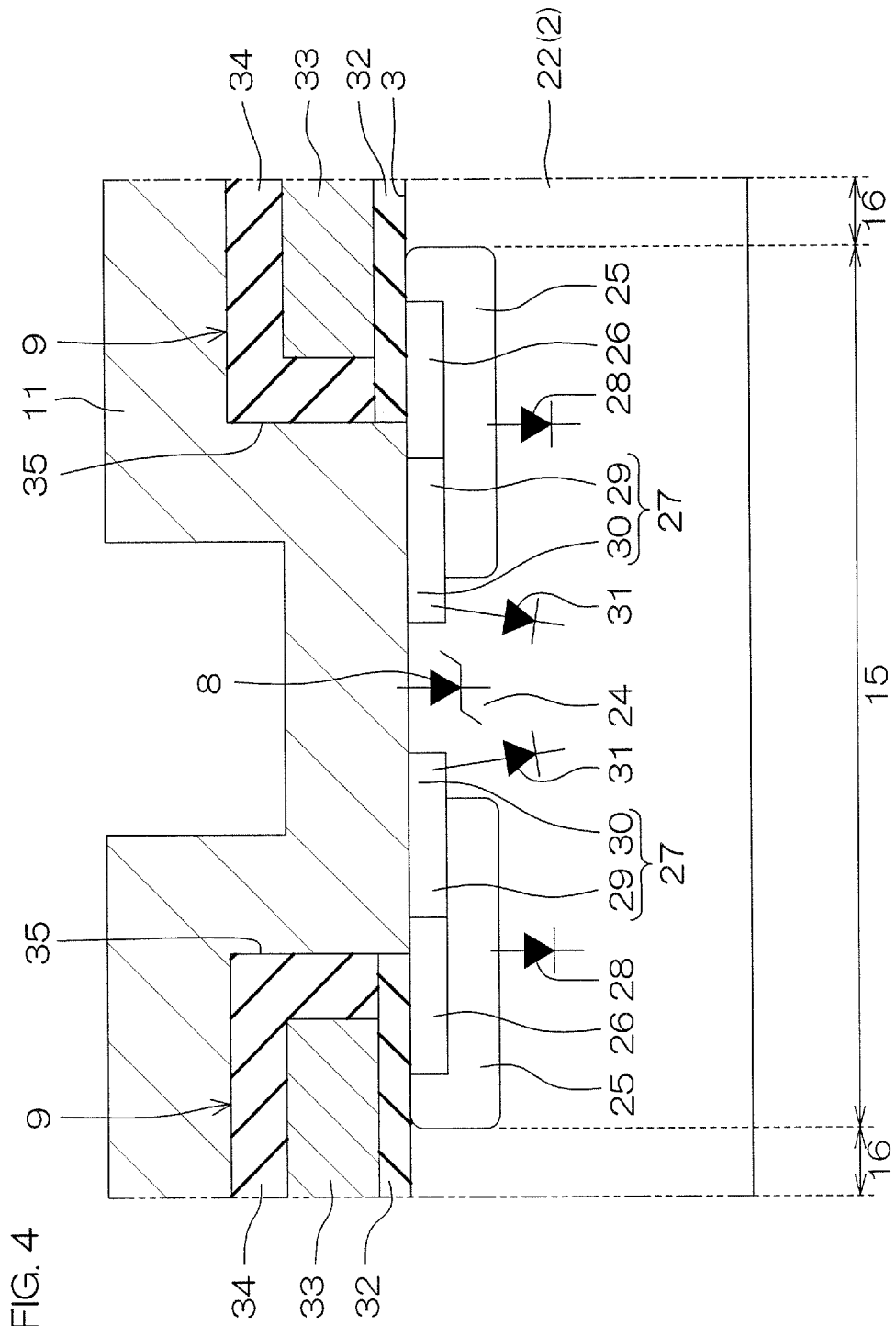
FIG. 4 is an enlarged view of a main portion in FIG. 3.

FIG. 3 is sectional view taken along line in FIG. 2. FIG. 4 is an enlarged view of a main portion in FIG. 3. The following description will also be made with reference to FIG. 2 as needed.

Referring to FIG. 3, the semiconductor layer 2 has a multilayer structure including an n$^+$-type semiconductor substrate 21 and the n$^-$-type epitaxial layer 22 formed on the n$^+$-type semiconductor substrate 21. The first main surface 3 of the semiconductor layer 2 is formed from the n$^-$-type epitaxial layer 22. The second main surface 4 of the semiconductor layer 2 is formed from the n$^+$-type semiconductor substrate 21.

In this preferred embodiment, the n$^+$-type semiconductor substrate 21 contains a wide band gap semiconductor. The n$^+$-type semiconductor substrate 21 may contain SiC, diamond, or a nitride semiconductor. The off-angle of the n$^+$-type semiconductor substrate 21 may be 4°.

In this preferred embodiment, the n$^-$-type epitaxial layer 22 contains a wide band gap semiconductor. The n$^-$-type epitaxial layer 22 may contain SiC, diamond, or a nitride semiconductor. SiC may be 4H—SiC. A nitride semiconductor may be GaN.

The n$^-$-type epitaxial layer 22 may be formed from the same type of material as that used for the n$^+$-type semiconductor substrate 21. The n$^-$-type epitaxial layer 22 may be formed from a different type of material from that used for the n$^+$-type semiconductor substrate 21.

The following is an example in which both the n$^+$-type semiconductor substrate 21 and the n$^-$-type epitaxial layer 22 contain SiC (4H—SiC). That is, the n$^+$-type semiconductor substrate 21 has a main surface having an off-angle of 10° or less with respect to the <11-20> direction from the [0001] plane. More specifically, the off-angle is 2° or 4°.

The n$^-$-type epitaxial layer 22 is formed by epitaxial growth of SiC from the main surface of the n$^+$-type semiconductor substrate 21. Accordingly, the n$^-$-type epitaxial layer 22 has a main surface having an off-angle of 10° or less with respect to the <11-20> direction from the plane. More specifically, the off-angle is 2° or 4°.

In this preferred embodiment, the first direction X is set to a direction orthogonal to the <11-20> direction, and the second direction Y is set to the <11-20> direction. Accordingly, the plurality of unit cells 15 are arrayed at intervals along the <11-20> direction and the direction orthogonal to the <11-20> direction.

When the plurality of unit cells 15 are arrayed along the <11-20> direction by using a 4H—SiC substrate having an off-angle of 10° C. or less, the plurality of unit cells 15 adjacent to each other have the same relationships in terms of electric field and crystalline orientation.

The breakdown voltage strength of the unit cell 15 decreases due to local electric field concentration. For this reason, when an electric field locally concentrates on a given unit cell 15 of the plurality of unit cells 15, the given unit cell 15 imposes limitations in terms of the overall breakdown voltage strength of the plurality of unit cells 15.

Accordingly, arraying the plurality of unit cells 15 so as to have the same relationships in terms of electric field and crystalline orientation makes it possible to suppress local electric field concentration on a given unit cell 15 of the plurality of unit cells 15. This can further equalize the breakdown voltage strength of the respective unit cells 15, and hence can suppress a reduction in the breakdown voltage of the semiconductor device 1.

A drain electrode 23 (second main surface) is connected to the second main surface 4 of the semiconductor layer 2. The drain electrode 23 covers the second main surface 4 of the semiconductor layer 2 and forms an ohmic junction with the $n^+$-type semiconductor substrate 21.

In the semiconductor layer 2, the $n^+$-type semiconductor substrate 21 is formed as a low-resistance region (drain region). In the semiconductor layer 2, the $n^-$-type epitaxial layer 22 is formed as a high-resistance region (drift region).

The thickness of the $n^-$-type epitaxial layer 22 may be between 5 μm and 30 (inclusive). Increasing the thickness of the $n^-$-type epitaxial layer 22 can improve the breakdown voltage of the semiconductor device 1.

For example, setting the thickness of the $n^-$-type epitaxial layer 22 to 5 μm or more can obtain a breakdown voltage of 600 V or more. For example, setting the thickness of the $n^-$-type epitaxial layer 22 to 20 μm or more can obtain a breakdown voltage of 3,000 V or more.

Referring to FIGS. 2 and 3, the plurality of unit cells 15 are formed in the surface layer portion of the first main surface 3 of the semiconductor layer 2. Each unit cell 15 includes an $n^-$-type diode region 24, a p-type well region 25, an $n^+$-type source region 26 (first conductivity type region), and a $p^+$-type contact region 27.

The $n^-$-type diode region 24 is formed in the surface layer portion of the first main surface 3 of the semiconductor layer 2. The $n^-$-type diode region 24 is formed in a quadrilateral shape in plan view. In this preferred embodiment, the $n^-$-type diode region 24 is formed by directly using a partial region of the $n^-$-type epitaxial layer 22. Accordingly, the $n^-$-type diode region 24 has almost the same n-type impurity concentration as that of the $n^-$-type epitaxial layer 22.

The $n^-$-type diode region 24 may be formed by further implanting an n-type impurity into the surface layer portion of the $n^-$-type epitaxial layer 22. In this case, the surface layer portion of the $n^-$-type diode region 24 may have an n-type impurity concentration higher than that of the $n^-$-type epitaxial layer 22.

An area ratio SD/SC of a plane area SD of the $n^-$-type diode region 24 with respect to a plane area SC of the unit cell 15 may be between 0.005 and 0.015 (inclusive) (for example, about 0.01). The area ratio SD/SC will hereinafter be referred to as "the area ratio SD/SC of the $n^-$-type diode region 24 with respect to the unit cell 15."

An aspect ratio L4/L3 of the $n^-$-type diode region 24 may be "1" or more. The aspect ratio L4/L3 is defined by the ratio of a length L4 of one side of the $n^-$-type diode region 24 along the second direction Y with respect to a length L3 of one side of the $n^-$-type diode region 24 along the first direction X.

In this case, an example is shown in which the aspect ratio L4/L3 of the $n^-$-type diode region 24 is "1." Accordingly, the $n^-$-type diode region 24 is formed here in a square shape in plan view. The lengths L3 and L4 of sides of the $n^-$-type diode region 24 each may be between 1 and 1.5 μm (inclusive) (for example, about 1.2 μm).

The p-type well region 25 is formed in the surface layer portion of the first main surface 3 of the semiconductor layer 2 along the peripheral edge of the $n^-$-type diode region 24. More specifically, the p-type well region 25 is formed in an endless shape (quadrilateral ring shape) surrounding the $n^-$-type diode region 24 in plan view.

The outer peripheral edge of the p-type well region 25 forms the outer peripheral edge of the unit cell 15. The p-type well region 25 forms a first p-n junction between the $n^-$-type diode region 24 and the $n^-$-type epitaxial layer 22.

Referring to FIG. 4, the first p-n junction forms a first diode 28 having the p-type well region 25 as an anode and the $n^-$-type diode region 24 (drain electrode 23) as a cathode.

The $n^+$-type source region 26 is formed in the surface layer portion of the p-type well region 25. The $n^+$-type source region 26 has an n-type impurity concentration higher than that of the $n^-$-type diode region 24.

The $n^+$-type source region 26 is formed at distances from the inner peripheral edge and outer peripheral edge of the p-type well region 25. In this preferred embodiment, the $n^+$-type source region 26 is formed in an endless shape (quadrilateral ring shape) along the p-type well region 25 in plan view.

The $p^+$-type contact region 27 is formed in the surface layer portion of the p-type well region 25. The $p^+$-type contact region 27 is formed in a region between the $n^-$-type diode region 24 and the $n^+$-type source region 26 in the surface layer portion of the p-type well region 25. The $p^+$-type contact region 27 has a p-type impurity concentration higher than that of the p-type well region 25.

In this preferred embodiment, the $p^+$-type contact region 27 is formed in an endless shape (quadrilateral ring shape) along the inner peripheral edge of the p-type well region 25 in plan view. In this preferred embodiment, the $p^+$-type contact region 27 is exposed from the inner peripheral edge of the p-type well region 25, and forms a second p-n junction portion with the $n^-$-type diode region 24.

Referring to FIG. 4, the $p^+$-type contact region 27 includes a first region 29 and a second region 30. The first region 29 of the $p^+$-type contact region 27 is formed in the p-type well region 25. The second region 30 of the $p^+$-type contact region 27 is drawn out from the first region 29 into the $n^-$-type diode region 24.

The second region 30 of the $p^+$-type contact region 27 extends across the boundary region between the p-type well region 25 and the $n^-$-type diode region 24. The second region 30 of the $p^+$-type contact region 27 forms a second p-n junction portion with the $n^-$-type diode region 24. The second p-n junction portion forms a second diode 31 having the $p^+$-type contact region 27 as an anode and the $n^-$-type diode region 24 (drain electrode 23) as a cathode.

Each unit cell 15 has a junction barrier Schottky (JBS) structure. The JBS structure includes a first p-n junction portion formed between the n⁻-type diode region 24 and the p-type well region 25. The JBS structure also has a second p-n junction portion formed between the type diode region 24 and the p⁺-type contact region 27.

Further, a junction field effect transistor (JFET) structure is formed in the surface layer portion of the n⁻-type epitaxial layer 22 by using each unit cell 15.

Each JFET structure includes a first p-n-p structure and a second p-n-p structure. The first p-n-p structure is formed from the first line portion 16 of the n⁻-type epitaxial layer 22 and the p-type well region 25 adjacent to the n⁻-type epitaxial layer 22 through the first line portion 16. The second p-n-p structure is formed from the second line portion 17 of the n⁻-type epitaxial layer 22 and the p-type well region 25 adjacent to the n⁻-type epitaxial layer 22 through the second line portion 17.

Referring to FIG. 3, a planar gate structure is formed on the first main surface 3 of the semiconductor layer 2. Each planar gate structure has a multilayer structure including a gate insulating layer 32 and a gate electrode layer 33. In this preferred embodiment, the planar gate structures are formed in a lattice pattern along the first line portions 16 and the second line portions 17 in plan view.

The gate electrode layer 33 is electrically connected to the gate electrode 10. The gate electrode layer 33 faces the p-type well region 25, the n⁺-type source region 26, and the n⁻-type epitaxial layer 22 through the gate insulating layer 32.

More specifically, the gate electrode layer 33 extends from regions on the first line portion 16, the second line portion 17, and the intersecting portion 18 to a region on each unit cell 15, and selectively covers the p-type well region 25 and the n⁺-type source region 26 of each unit cell 15.

An insulating layer 34 is formed on the first main surface 3 of the semiconductor layer 2. The insulating layer 34 covers the gate electrode layer 33. Contact holes 35 are selectively formed in the insulating layer 34 so as to expose the n⁻-type diode regions 24, the n⁺-type source regions 26, and the p⁺-type contact regions 27.

Each source electrode 11 is formed on the insulating layer 34. The source electrode 11 enters the contact hole 35 from above the insulating layer 34. The source electrode 11 collectively covers the n⁻-type diode region 24, the n⁺-type source region 26, and the p⁺-type contact region 27 in each contact hole 35.

The source electrode 11 forms a Schottky junction with the n⁻-type diode region 24. Referring to FIG. 4, this forms the SBD 8 having the source electrode 11 as an anode and the type diode region 24 (drain electrode 23) as a cathode.

The source electrode 11 forms an ohmic junction between the n⁺-type source region 26 and the p⁺-type contact region 27. This forms the MISFET 9 including the semiconductor layer 2, the p-type well region 25, the n⁺-type source region 26, the p⁺-type contact region 27, the gate insulating layer 32, the gate electrode 10 (gate electrode layer 33), the source electrode 11, and the drain electrode 23.

Figure 5:
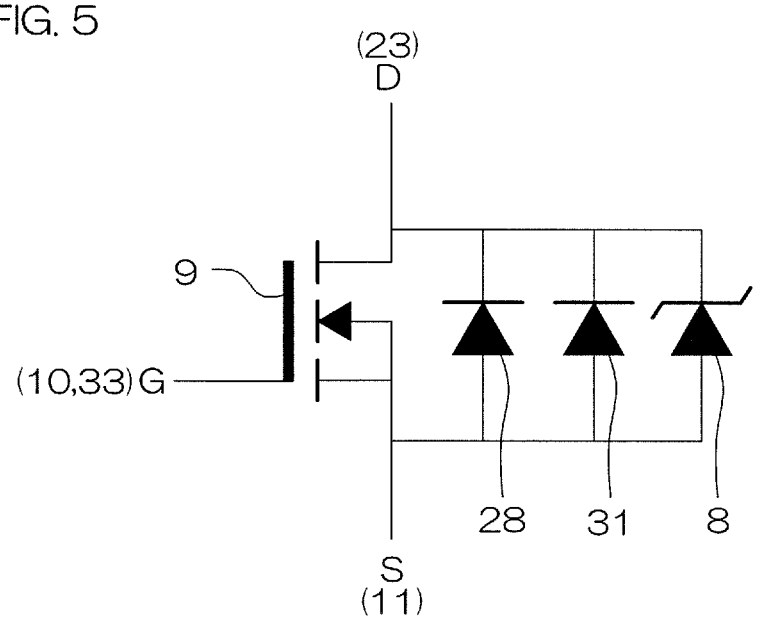
FIG. 5 is a circuit diagram showing the electrical structure of the semiconductor device in FIG. 1.

FIG. 5 is a circuit diagram showing the electrical structure of the semiconductor device 1 in FIG. 1.

Referring to FIG. 5, the semiconductor device 1 includes the SBD 8, the MISFET 9, the first diode 28, and the second diode 31. The SBD 8, the first diode 28, and the second diode 31 form the free wheel diode of the MISFET 9.

The SBD 8 is connected in parallel to the MISFET 9. The anode of the SBD 8 is connected to the source electrode 11 of the MISFET 9. The cathode of the SBD 8 is connected to the drain electrode 23 of the MISFET 9.

The first diode 28 is connected in parallel to the MISFET 9. The anode of the first diode 28 is connected to the source electrode 11 of the MISFET 9. The cathode of the first diode 28 is connected to the drain electrode 23 of the MISFET 9.

The second diode 31 is connected in parallel to the MISFET 9. The anode of the second diode 31 is connected to the source electrode 11 of the MISFET 9. The cathode of the second diode 31 is connected to the drain electrode 23 of the MISFET 9.

The source electrode 11 of the MISFET 9 also serves as the anode electrode of the SBD 8, the anode electrode of the first diode 28, and the anode electrode of the second diode 31. The drain electrode 23 of the MISFET 9 also serves as the cathode electrode of the SBD 8, the cathode electrode of the first diode 28, and the cathode electrode of the second diode 31.

Figure 6:
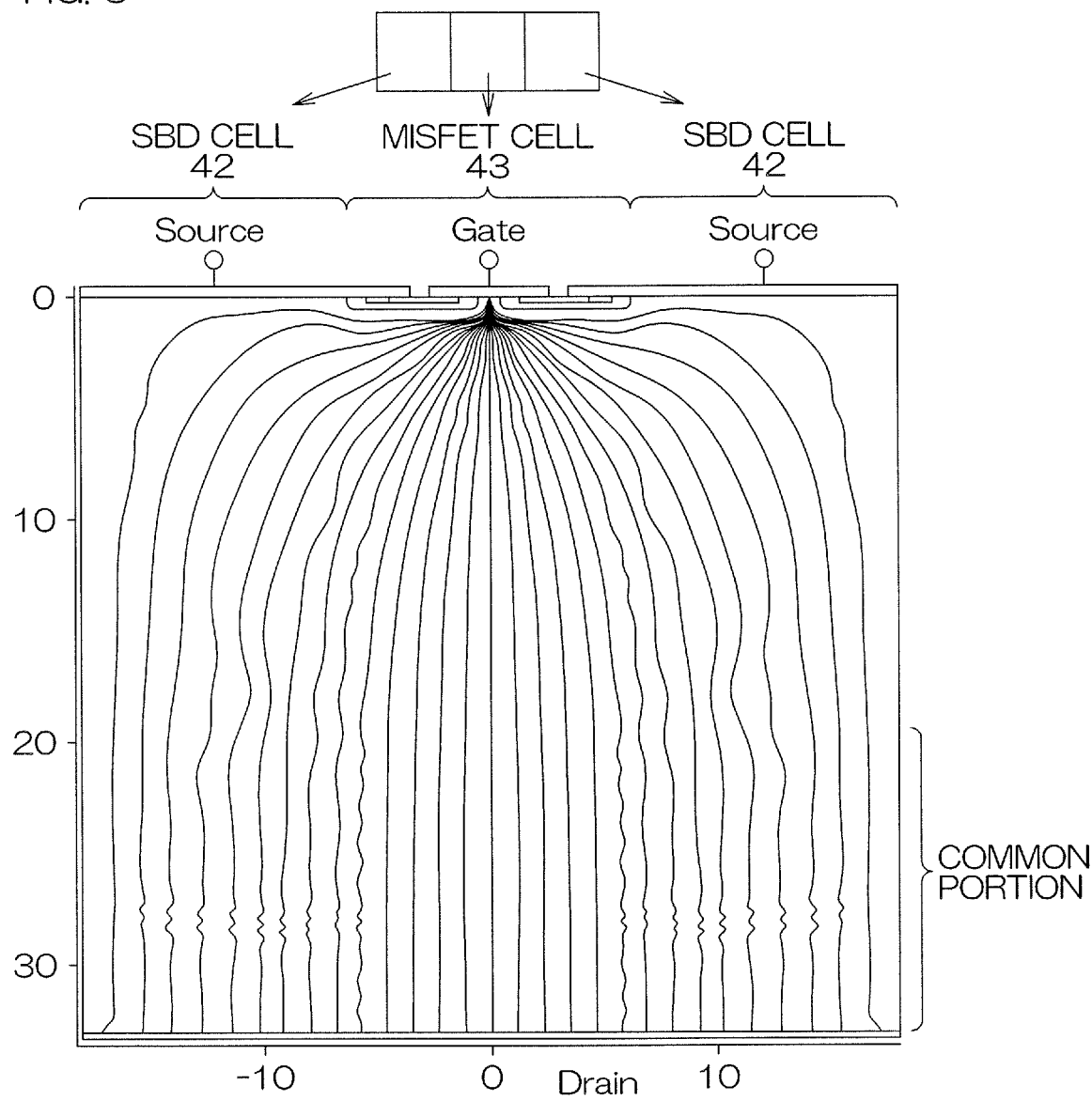
FIG. 6 is a view for explaining the structure of a semiconductor device according to a reference example from an electrical viewpoint.

FIG. 6 is a view for explaining the structure of a semiconductor device 41 according to a reference example from an electrical viewpoint. The following describes only points different from the semiconductor device 1 and omits the description of other points.

The semiconductor device 41 according to the reference example has a structure different from that of the semiconductor device 1 in the point that it does not have the unit cells 15. More specifically, the semiconductor device 41 according to the reference example has a structure in which SBD cells 42 for the SBD 8 and a MISFET cell 43 for the MISFET 9 are arrayed adjacent to each other.

An n⁻-type diode region 24 is formed in the SBD cell 42. A p-type well region 25, an n⁺-type source region 26, and a p⁺-type contact region 27 are formed in the MISFET cell 43.

FIG. 6 shows a current density distribution obtained by simulation. A voltage VGS between a gate electrode 10 and a source electrode 11 was 18 V. A voltage VDS between a drain electrode 23 and the source electrode 11 was 1 V.

In the semiconductor device 41 according to the reference example, currents concentrate on the MISFET cells 43. Accordingly, current paths for the SBD cells 42 and current paths for the MISFET cells 43 are scattered in the semiconductor layer 2. In addition, the common portions between the current paths for the SBD cells 42 and the current paths for the MISFET cells 43 are formed on the bottom portion side of the semiconductor layer 2 and are relatively small.

In the semiconductor device 41 according to the reference example, therefore, even increasing a forward voltage VF will not increase a forward current IF as expected. Such a problem produces an adverse effect in achieving a reduction in conduction loss of the SBD 8.

Figure 7:
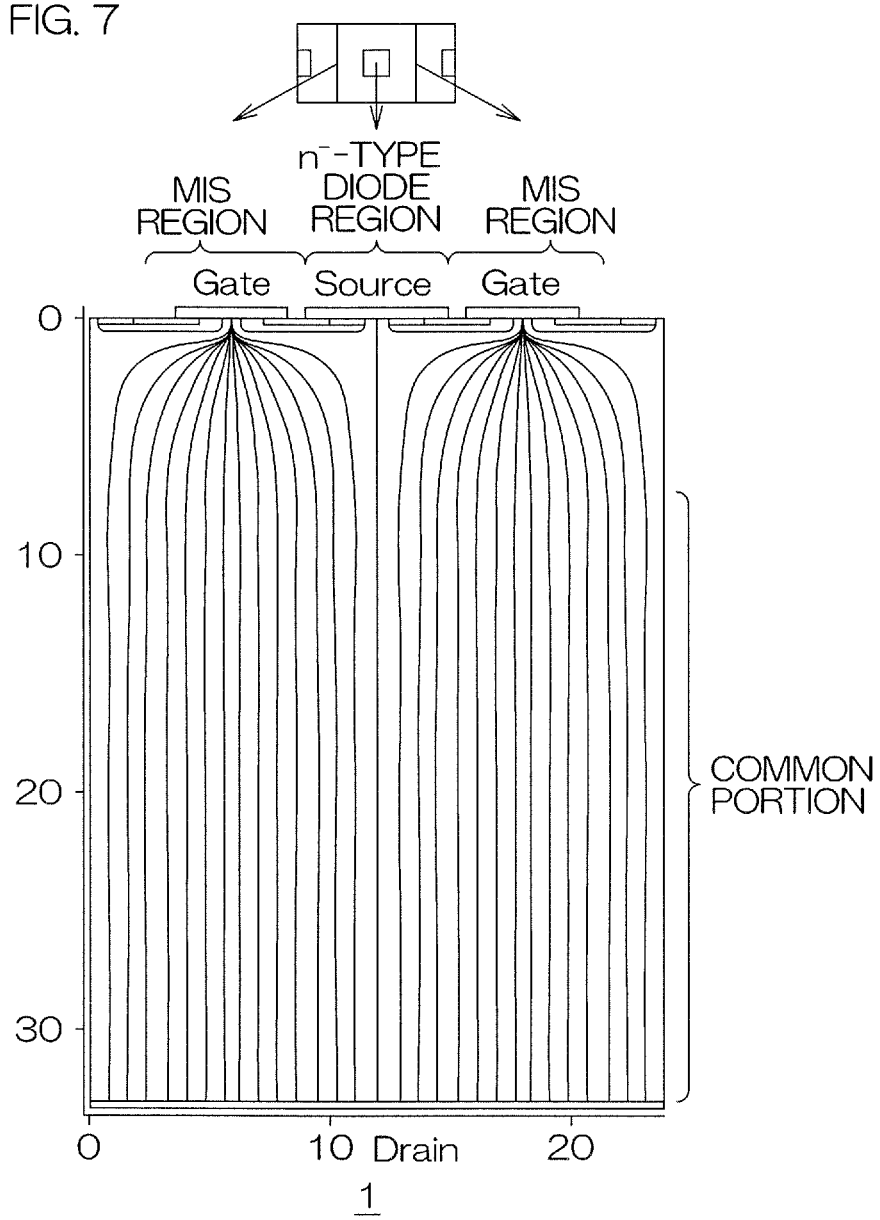
FIG. 7 is a view for explaining the structure of the semiconductor device in FIG. 1 from an electrical viewpoint.

FIG. 7 is a view for explaining the structure of the semiconductor device 1 from an electrical viewpoint.

FIG. 7 shows a current density distribution of the semiconductor device 1 which is obtained by simulation. The voltage VGS between the gate electrode 10 and the source electrode 11 was 18 V. The voltage VDS between the drain electrode 23 and the source electrode 11 was 1 V.

Referring to FIG. 7, the common portions between the current paths for the SBD 8 and the current paths for the MISFETs 9 in the semiconductor device 1 are larger than those in semiconductor device 41 according to the reference example.

The semiconductor device 1 has a structure in which the MISFETs 9 and the SBD 8 are formed by using one unit cell 15. Accordingly, the current paths for the SBD 8 and the current paths for the MISFETs 9 are formed in a region directly below the unit cell 15.

This can suppress the scattering of current paths for the SBD 8 and current paths for the MISFETs 9 in the semiconductor layer 2. In addition, this can communalize current paths for the SBD 8 and current paths for the MISFETs 9. The rate of increase in the forward current IF can thus be increased with respect to the rate of increase in the forward voltage VF, thereby achieving a reduction in conduction loss of the SBD 8.

Figure 8:
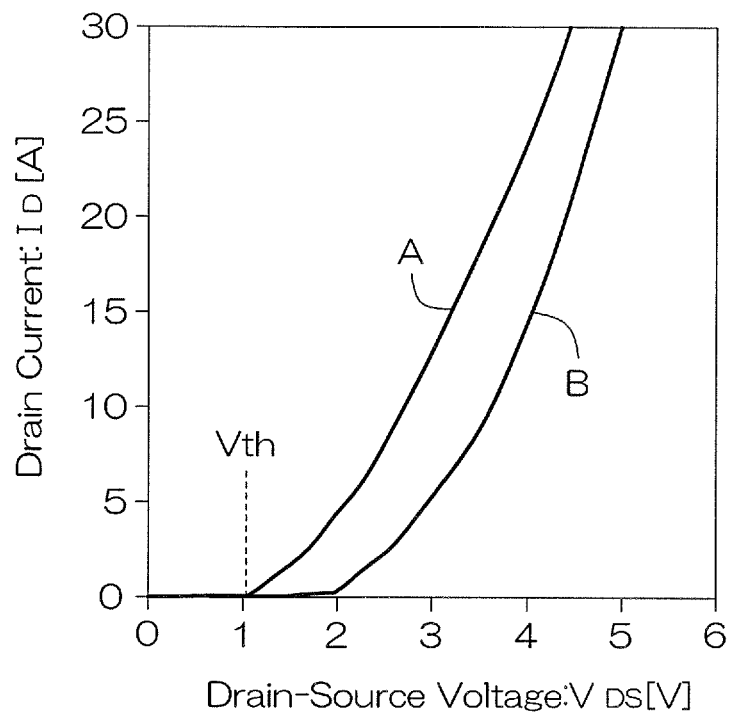
FIG. 8 is a graph showing measurement results of the current-voltage characteristics of SBDs.

FIG. 8 is a graph showing measurement results of the current-voltage characteristics of the SBDs 8.

Referring to FIG. 8, the ordinate represents a drain current ID [A], and the abscissa represents a voltage VDS [V] between the drain electrode 23 and the source electrode 11. The drain current ID is also the forward current IF in the SBD 8. The voltage VDS between the drain electrode 23 and the source electrode 11 is also the forward voltage VF of the SBD 8.

FIG. 8 shows a first characteristic A and a second characteristic B. The first characteristic A represents the current-voltage characteristic of the SBD 8 of the semiconductor device 1. The second characteristic B represents the current-voltage characteristic of the SBD 8 of the semiconductor device 41 according to the reference example.

Referring to the first characteristic A and the second characteristic B, the rate of increase in the drain current ID with respect to the rate of increase in the voltage VDS between the drain electrode 23 and the source electrode 11 is higher than the rate of increase in the drain current ID of the second characteristic B. As described above, the semiconductor device 1 was able to achieve conduction loss smaller than that of the semiconductor device 41 according to the reference example.

Moreover, according to the semiconductor device 1, each unit cell 15 has a JBS structure including the first p-n junction portion formed between the p-type well region 25 and the n⁻-type diode region 24. Accordingly, a first depletion layer extending from the first p-n junction portion can suppress concentration of currents and electric fields in the n⁻-type diode region 24.

In addition to the first p-n junction portion, this JBS structure further includes the second p-n junction portion formed between the p⁺-type contact region 27 and the n⁻-type diode region 24. Accordingly, a second depletion layer extending from the second p-n junction portion can also suppress concentration of currents and electric fields in the n⁻-type diode region 24.

In particular, the second p-n junction portion is formed in the boundary region between the n⁻-type diode region 24 and the second region 30 of the p⁺-type contact region 27. This can reliably make the second depletion layer extend from the second p-n junction portion. This makes it possible to properly suppress concentration of currents and electric fields in the n⁻-type diode region 24.

Figure 9:
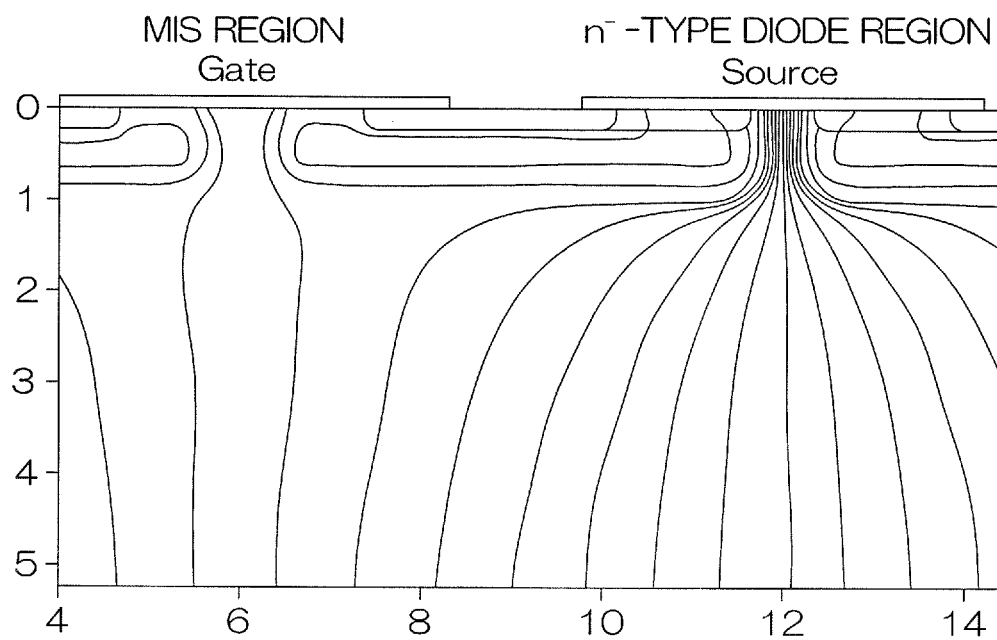
FIG. 9 is a view showing a current density distribution in a main portion of the semiconductor device in FIG. 1 which is obtained by simulation.

FIG. 9 is a view showing a current density distribution in a main portion of the semiconductor device 1 in FIG. 1 which is obtained by simulation. The voltage VGS between the gate electrode 10 and the source electrode 11 was 18 V. The voltage VDS between the drain electrode 23 and the source electrode 11 was 1 V.

Referring to FIG. 9, although the semiconductor device 1 is configured to suppress concentration of currents and electric fields by utilizing the JBS structure, currents still concentrate on the n⁻-type diode region 24. That is, obviously, in the n⁻-type diode region 24, the concentration of currents increases a resistance value.

In the n⁻-type diode region 24, obviously, therefore, the conduction loss of the SBD 8 can be further reduced by suppressing an increase in resistance value caused by the concentration of currents and facilitating the flow of currents.

Based on the above idea, the current-voltage characteristics of the SBD 8 was checked upon adjustment of the aspect ratio L2/L1 and the like with reference to the unit cell 15 shown in FIG. 2.

Figure 10:
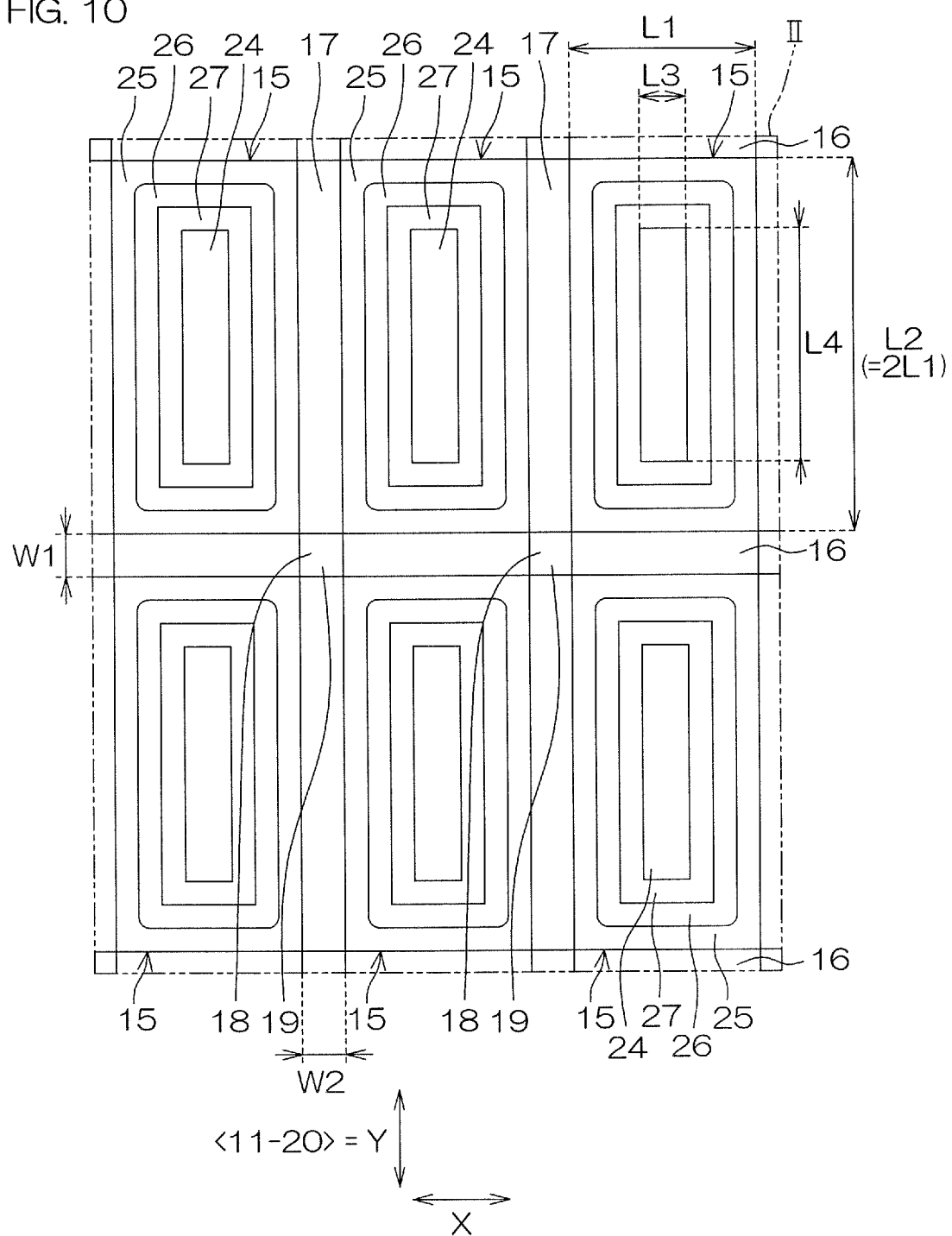
FIG. 10 is a plan view of a portion corresponding to FIG. 2, showing a structure with each unit cell having an aspect ratio of "2."

FIG. 10 is a plan view of a portion corresponding to FIG. 2, showing a structure with the aspect ratio L2/L1 of the unit cell 15 being "2." The aspect ratio L2/L1 of "2" indicates that the aspect ratio L2/L1 is double the aspect ratio L2/L1 (="1") of the unit cell 15 shown in FIG. 2.

More specifically, referring to FIG. 10, each unit cell 15 is formed in a rectangular shape in plan view. Each unit cell 15 is preferably formed in a rectangular shape extending along the second direction Y, that is, the <11-20> direction. Such a structure can suppress local electric field concentration on the unit cell 15, and hence is effective in suppressing a reduction in the breakdown voltage of the semiconductor device 1.

The length L1 of a short side of the unit cell 15 may be between 5 μm and 15 (inclusive) (for example, about 12 μm). The length L2 of a long side of the unit cell 15 may be between 10 μm and 30 μm (inclusive) (for example, about 24 μm).

The n⁻-type diode region 24 is formed in a rectangular shape in plan view. The area ratio SD/SC of the n⁻-type diode region 24 with respect to the unit cell 15 may be between 0.05 and 0.06 (inclusive) (for example, about 0.055).

The length L3 of a short side of the n⁻-type diode region 24 may be between 1 μm and 1.5 μm (inclusive) (for example, about 1.2 μm). The length L4 of a long side of the n⁻-type diode region 24 may be between 10 μm and 15 μm (inclusive) (for example, about 13.2 μm). From the viewpoint of only ratios, the aspect ratio L4/L3 of the n⁻-type diode region 24 is larger than the aspect ratio L2/L1 of the unit cell 15.

Figure 11:
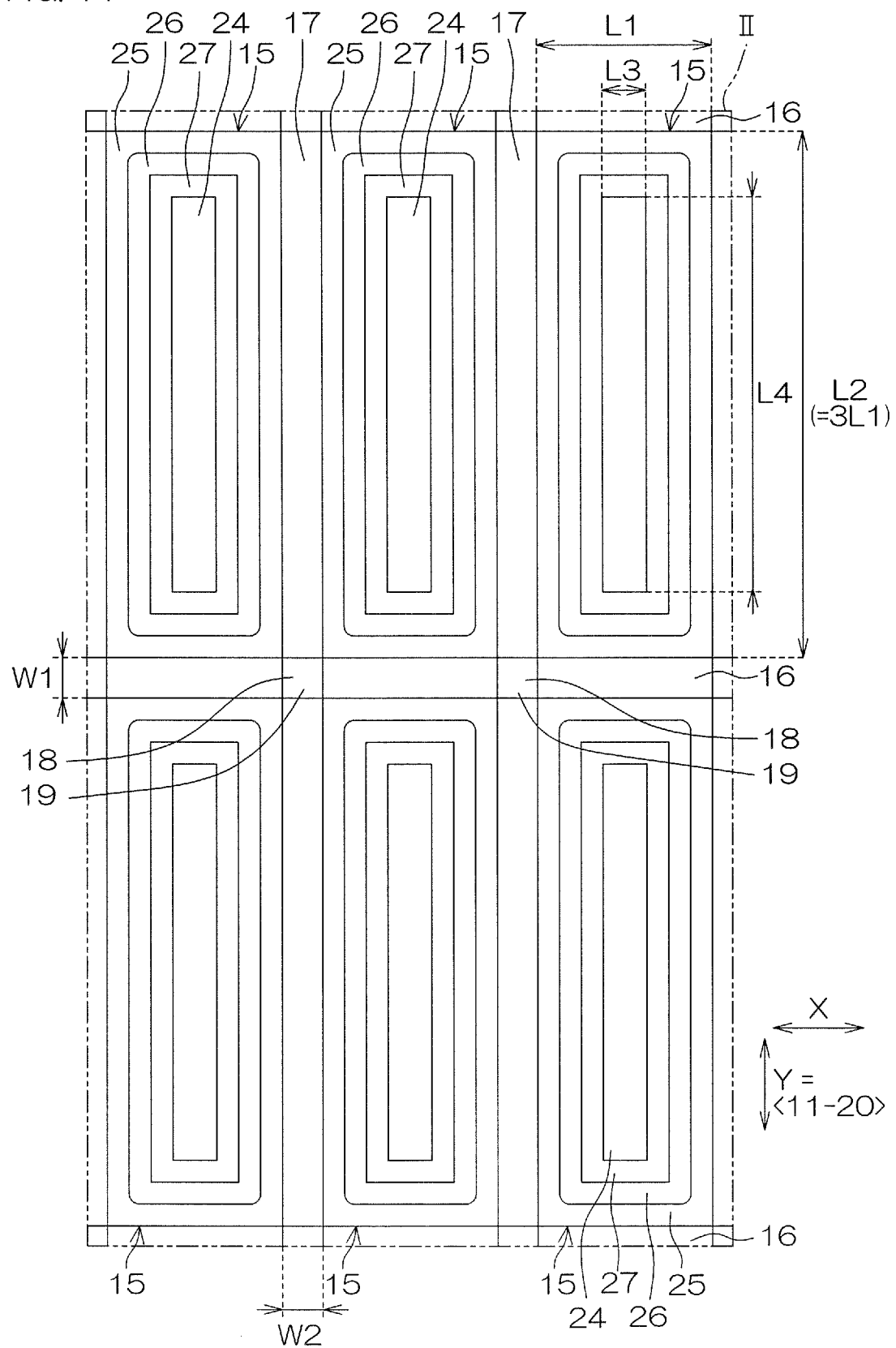
FIG. 11 is a plan view of a portion corresponding to FIG. 2, showing a structure with each unit cell having an aspect ratio of "3."

FIG. 11 is a plan view of a portion corresponding to FIG. 2, showing a structure with the aspect ratio L2/L1 of the unit cell 15 being "3." The aspect ratio L2/L1 of "3" indicates that the aspect ratio L2/L1 is three times the aspect ratio L2/L1 (="1") of the unit cell 15 shown in FIG. 2.

More specifically, referring to FIG. 11, each unit cell 15 is formed in a rectangular shape in plan view. Each unit cell 15 is preferably formed in a rectangular shape extending along the second direction Y, that is, the <11-20> direction. Such a structure can suppress local electric field concentration on the unit cell 15, and hence is effective in suppressing a reduction in the breakdown voltage of the semiconductor device 1.

The length L1 of a short side of the unit cell 15 may be between 5 μm and 15 (inclusive) (for example, about 12 μm). The length L2 of a long side of the unit cell 15 may be between 15 μm and 45 μm (inclusive) (for example, about 36 μm).

The n⁻-type diode region 24 is formed in a rectangular shape in plan view. The area ratio SD/SC of the n⁻-type diode region 24 with respect to the unit cell 15 may be between 0.065 and 0.0075 (inclusive) (for example, about 0.07).

The length L3 of a short side of the n⁻-type diode region 24 may be between 1 μm and 1.5 μm (inclusive) (for example, about 1.2 μm). The length L4 of a long side of the n⁻-type diode region 24 may be between 20 μm and 30 μm (inclusive) (for example, about 25.2 μm). From the viewpoint of only ratios, the aspect ratio L4/L3 of the n⁻-type diode region 24 is larger than the aspect ratio L2/L1 of the unit cell 15.

Figure 12:
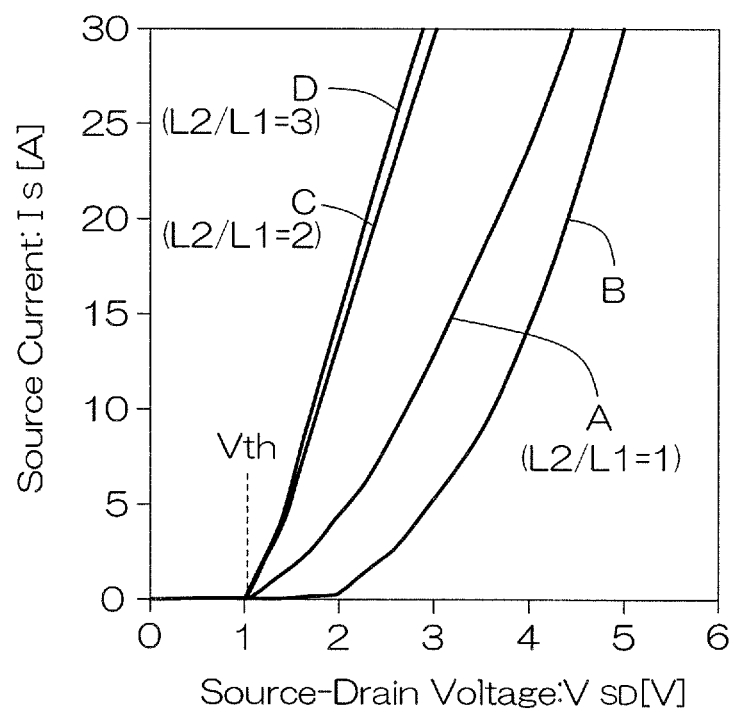
FIG. 12 is a graph showing measurement results of the current-voltage characteristics of SBDs.

FIG. 12 is a graph showing measurement results of the current-voltage characteristics of the SBD 8. Referring to FIG. 12, the ordinate represents a drain current ID [A], and the abscissa represents a voltage VDS [V] between the drain electrode 23 and the source electrode 11. The drain current ID is also the forward current IF in the SBD 8. The voltage VDS between the drain electrode 23 and the source electrode 11 is also the forward voltage VF of the SBD 8.

FIG. 12 shows a third characteristic C and a fourth characteristic D in addition to a first characteristic A and a second characteristic B (also refer to FIG. 8).

The third characteristic C represents the current-voltage characteristic of the SBD 8 of the semiconductor device 1 including the unit cell 15 whose aspect ratio L2/L1 is "2" (also refer to FIG. 10). The fourth characteristic D represents the current-voltage characteristic of the SBD 8 of the semiconductor device 1 including the unit cell 15 whose aspect ratio L2/L1 is "3" (also refer to FIG. 11).

Referring to the first characteristic A and the third characteristic C, the rate of increase in the drain current ID with respect to the rate of increase in the voltage VDS between the drain electrode 23 and the source electrode 11 according to the third characteristic C is higher than the rate of increase in the drain current ID according to the first characteristic A.

Referring to the first characteristic A and the fourth characteristic D, the rate of increase in the drain current ID with respect to the rate of increase in the voltage VDS between the drain electrode 23 and the source electrode 11 according to the fourth characteristic D is higher than the rate of increase in the drain current ID according to the first characteristic A.

Referring to the third characteristic C and the fourth characteristic D, the rate of increase in the drain current ID with respect to the rate of increase in the voltage VDS between the drain electrode 23 and the source electrode 11 does not exhibit much difference between the third characteristic C and the fourth characteristic D.

The first characteristic A, the third characteristic C, and the fourth characteristic D indicated that increasing the aspect ratio L2/L1 of the unit cell 15 was able to improve the rate of increase in the drain current ID with respect to the rate of increase in the voltage VDS between the drain electrode 23 and the source electrode 11. That is, it was found that increasing the aspect ratio L2/L1 of the unit cell 15 was able to reduce the conduction loss of the SBD 8.

On the other hand, the rate of increase in the drain current ID of the fourth characteristic D with respect to the third characteristic C is smaller than the rate of increase in the drain current ID of the third characteristic C with respect to the first characteristic A. Accordingly, it was found that the aspect ratio L2/L1 had its own upper limit.

The aspect ratio L2/L1 of the unit cell 15 may be adjusted within a range between "1" and "4" (inclusive). The area ratio SD/SC of the n⁻-type diode region 24 to the unit cell 15 may be adjusted within a range between 0.005 and 0.01 (inclusive).

Combining the aspect ratio L2/L1 within the range with the area ratio SD/SC within the range can achieve a reduction in conduction loss of the SBD 8, thereby improving the degree of freedom in design.

Figure 13:
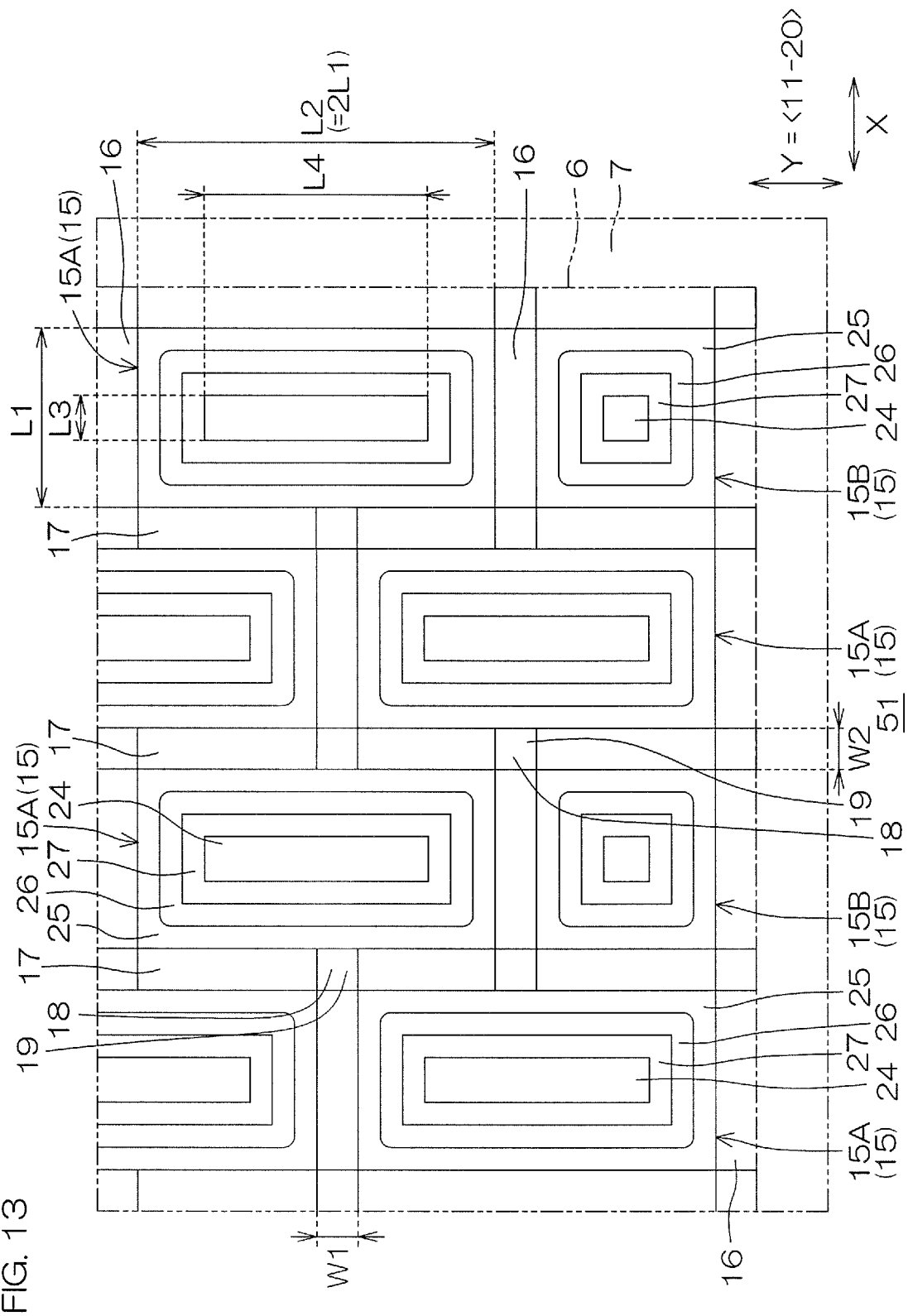
FIG. 13 is a plan view of a portion of a device formation region of a semiconductor device according to the second preferred embodiment of the present invention.

FIG. 13 is a plan view of a portion of a device formation region 6 of a semiconductor device 51 according to the second preferred embodiment of the present invention. In the following, the same reference numerals of the constituent elements of the structure of the semiconductor device 1, which have been described above, denote the same constituent elements of a corresponding structure, and a description of the structure will be omitted.

As shown in FIG. 13, in this preferred embodiment, a plurality of unit cells 15 include a plurality of unit cells 15A each having a relatively large aspect ratio L2/L1 and a plurality of unit cells 15B each having a relatively small aspect ratio L2/L1.

The plurality of unit cells 15A each extend in a strip shape along the second direction Y, that is, the <11-20> direction. The aspect ratio L2/L1 of each of the plurality of unit cells 15A is "2." That is, the unit cells 15 shown in FIG. 11 are used as the plurality of unit cells 15A.

Such a structure can suppress local electric field concentration on each unit cell 15, and hence is effective in suppressing a reduction in the breakdown voltage of the semiconductor device 1. The plurality of unit cells 15A are arrayed in a staggered pattern in plan view instead of a matrix pattern in plan view.

The aspect ratio L2/L1 of each of the unit cells 15B is less than "2." The plurality of unit cells 15B are formed along the peripheral edge of a device formation region 6. The plurality of unit cells 15B may be formed in a region defined by the peripheral edge of the device formation region 6 and the plurality of unit cells 15A.

As described above, the semiconductor device 51 can also obtain the same effects as those described with reference to the semiconductor device 1. In addition, the plurality of unit cells 15B are formed in the regions defined by the peripheral edge of the device formation region 6 and the plurality of unit cells 15A. This allows the plurality of unit cells 15A and 15B to be formed in the device formation region 6 without any waste, and hence can properly increase current paths.

Figure 14:
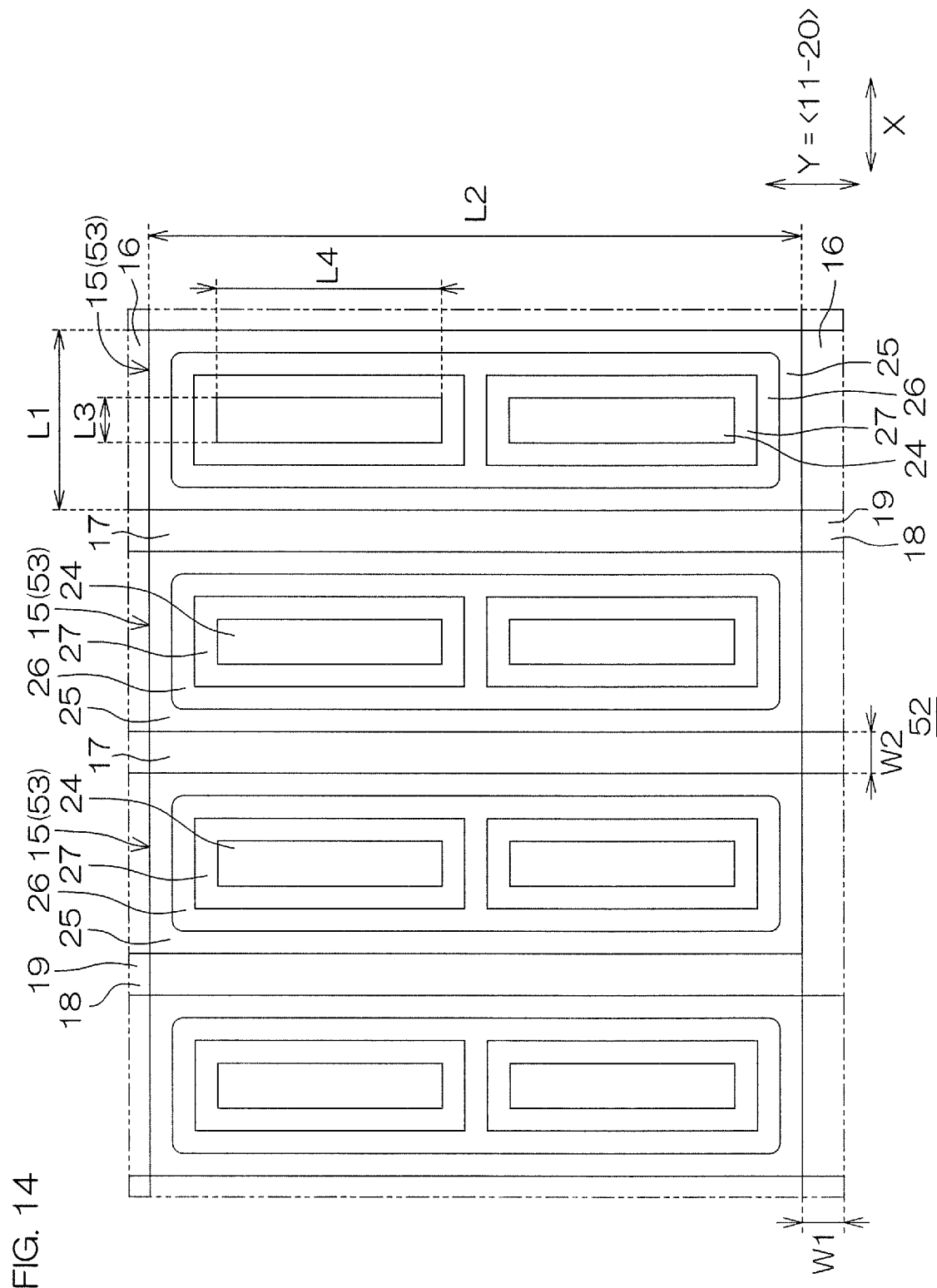
FIG. 14 a plan view of a portion of a device formation region of a semiconductor device according to the third preferred embodiment of the present invention.

FIG. 14 is a plan view showing a portion of a device formation region 6 of a semiconductor device 52 according to the third preferred embodiment of the present invention. In the following, the same reference numerals of the constituent elements of the structure of the semiconductor device 1, which have been described above, denote the same constituent elements of a corresponding structure, and a description of the structure will be omitted.

As shown in FIG. 14, a plurality of unit cells 15 are arrayed along the second direction Y, that is, the <11-20> direction so as to be connected to each other. This makes a plurality of (two or more) unit cells 15 form one linear cell 53 extending in a strip shape along the second direction Y. This structure can suppress local electric field concentration on the linear cell 53 and hence is effective in suppressing a reduction in the breakdown voltage of the semiconductor device 1.

The plurality of linear cells 53 may be arrayed at intervals along the first direction X. FIG. 14 shows a structure using the unit cells 15 shown in FIG. 11, with the aspect ratio L2/L1 being "2."

A p-type well region 25 of one and/or the other of the unit cells 15 adjacent to each other along the second direction Y is interposed between a plurality of n⁻-type diode regions 24 adjacent to each other along the second direction Y. Each linear cell 53 has a structure in which the plurality of n⁻-type diode regions 24 are arrayed at intervals along the second direction Y.

As described above, the semiconductor device 52 can also obtain the same effects as those described with reference to the semiconductor device 1.

The plurality of unit cells 15 may be arrayed along the first direction X instead of the second direction Y so as to be connected to each other. Accordingly, the plurality of unit cells 15 may form one linear cell extending along the first direction X. In addition, a plurality of linear cells each having such a structure may be arrayed at intervals along the second direction Y.

Figure 15:
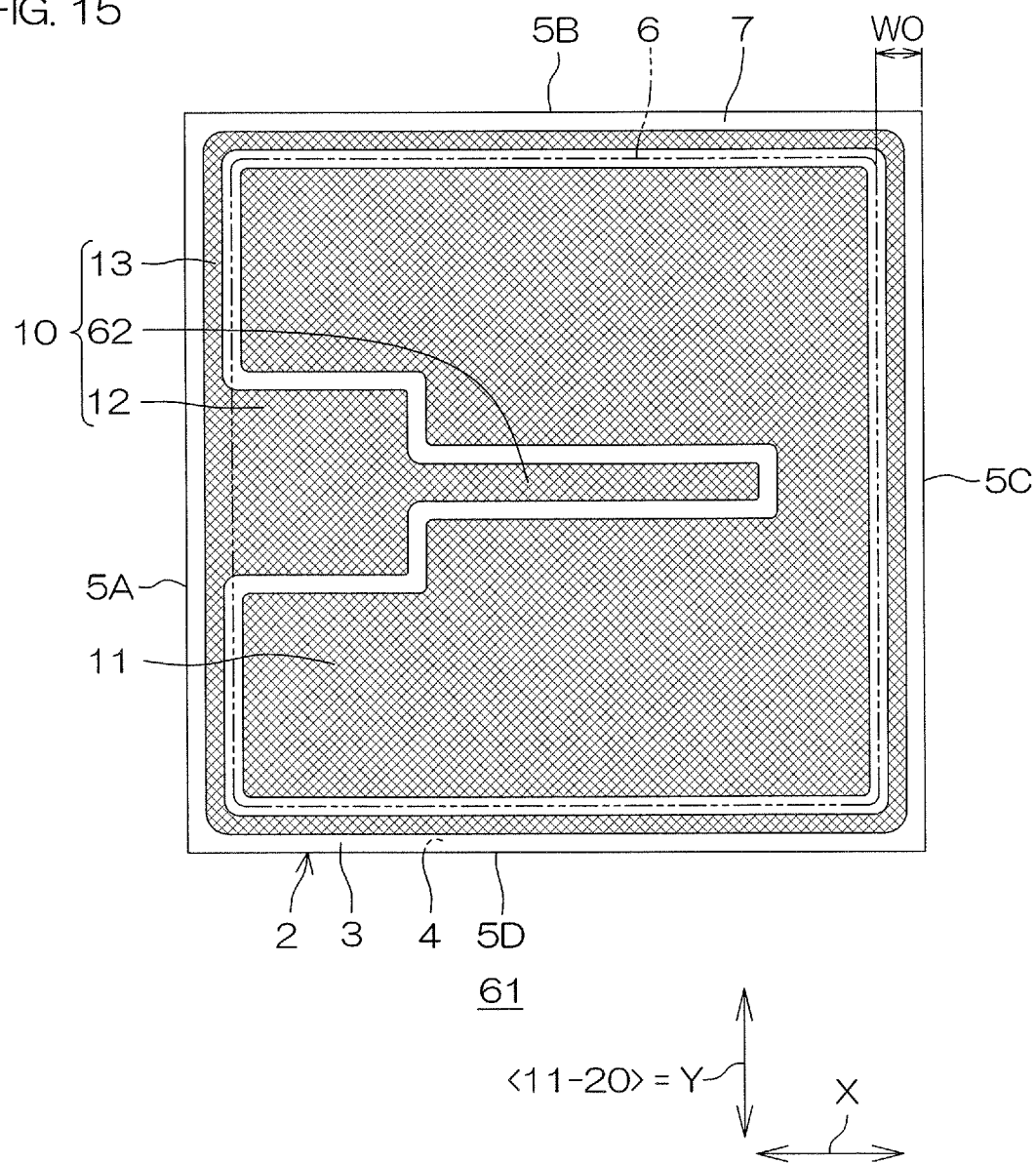
FIG. 15 is a plan view of a semiconductor device according to the fourth preferred embodiment of the present invention.

FIG. 15 is a plan view of a semiconductor device 61 according to the fourth preferred embodiment of the present invention. In the following, the same reference numerals of the constituent elements of the structure of the semiconductor device 1, which have been described above, denote the same constituent elements of a corresponding structure, and a description of the structure will be omitted.

The semiconductor device 61 includes a semiconductor layer 2 in the form of a chip. The semiconductor layer 2 includes a first main surface 3 on one side, a second main surface 4 on the other side, and four side surfaces 5A, 5B, 5C, and 5D connecting the first main surface 3 and the second main surface 4.

The first main surface 3 and the second main surface 4 are formed in quadrilateral shapes in plan view seen from the normal line direction to them (to be simply referred to as "plan view" hereinafter). The side surface 5A faces the side surface 5C. The side surface 5B faces the side surface 5D.

A device formation region 6 and an outer region 7 are set in the semiconductor layer 2. The device formation region 6 is a region in which an SBD 8 and a MISFET 9 are formed. The device formation region 6 is also called an active region.

The device formation region 6 is set in a central region of the semiconductor layer 2 with a space being provided from the peripheral edge of the semiconductor layer 2 to an inward region of the semiconductor layer 2 in plan view. In this preferred embodiment, the device formation region 6 is set to have a quadrilateral shape having four sides parallel to the side surfaces 5A to 5D of the semiconductor layer 2 in plan view.

The outer region 7 is set as a region between the peripheral edge of the semiconductor layer 2 and the peripheral edge of the device formation region 6. The outer region 7 is set in an endless shape (quadrilateral ring shape) surrounding the device formation region 6 in plan view.

A ratio SE/SF of a plane area SF of the device formation region 6 with respect to a plane area SE of the first main surface 3 of the semiconductor layer 2 may be between 70% and 85% (inclusive). The plane area SE of the first main surface 3 of the semiconductor layer 2 may be between 16 mm$^2$ and 25 mm$^2$ (inclusive). A width WO of the outer region 7 may be between 0.1 mm and 0.3 mm (inclusive). The width WO of the outer region 7 is defined by the width of the outer region 7 in a direction perpendicular to the extending direction of the outer region 7.

A gate electrode 10 and a source electrode 11 (first main surface electrode) are formed on the first main surface 3 of the semiconductor layer 2. For the sake of clarity, FIG. 15 shows the gate electrode 10 and the source electrode 11 by hatching. The gate electrode 10 includes a gate pad 12, a gate finger 13, and a gate line 62.

The gate pad 12 is formed along an arbitrary side surface (the side surface 5A in this preferred embodiment) in plan view. The gate pad 12 is formed in a central region of the side surface 5A in plan view. In this preferred embodiment, the gate pad 12 is drawn out from the outer region 7 to the device formation region 6 so as to cross the boundary between the outer region 7 and the device formation region 6.

In this preferred embodiment, the gate pad 12 is formed in a quadrilateral shape in plan view. The gate pad 12 may be formed along one corner portion connecting two of the side surfaces 5A to 5D which extend along directions intersecting (orthogonal) each other in plan view.

The gate finger 13 is drawn out in a strip shape from the gate pad 12 so as to extend along the peripheral edge of the device formation region 6. In this preferred embodiment, the gate finger 13 is formed in an endless shape (quadrilateral ring shape) surrounding the device formation region 6 in plan view. The gate finger 13 may be formed to partition the device formation region 6 from three directions.

The gate line 62 is drawn out from a leading end portion of the gate pad 12 toward a central portion of the device formation region 6. In this preferred embodiment, the gate line 62 is formed in a strip shape linearly extending from the gate pad 12 toward the side surface 5C of the semiconductor layer 2 in plan view.

The source electrode 11 is formed into a C-shaped region by being partitioned by the inner edge of the gate electrode 10 in plan view. In this preferred embodiment, the source electrode 11 is formed in a C shape along the inner edge of the gate electrode 10 in plan view.

The source electrode 11 covers most of the device formation region 6. The source electrode 11 may have a structure having a plurality of electrode portions divided from each other, with the plurality of electrode portions covering the device formation region 6.

In this preferred embodiment, a first bonding wire for a gate is connected to the gate pad 12. The first bonding wire may be an aluminum wire. In the preferred embodiment, a second bonding wire for a source is connected to the source electrode 11. The second bonding wire may be an aluminum wire.

Figure 16:
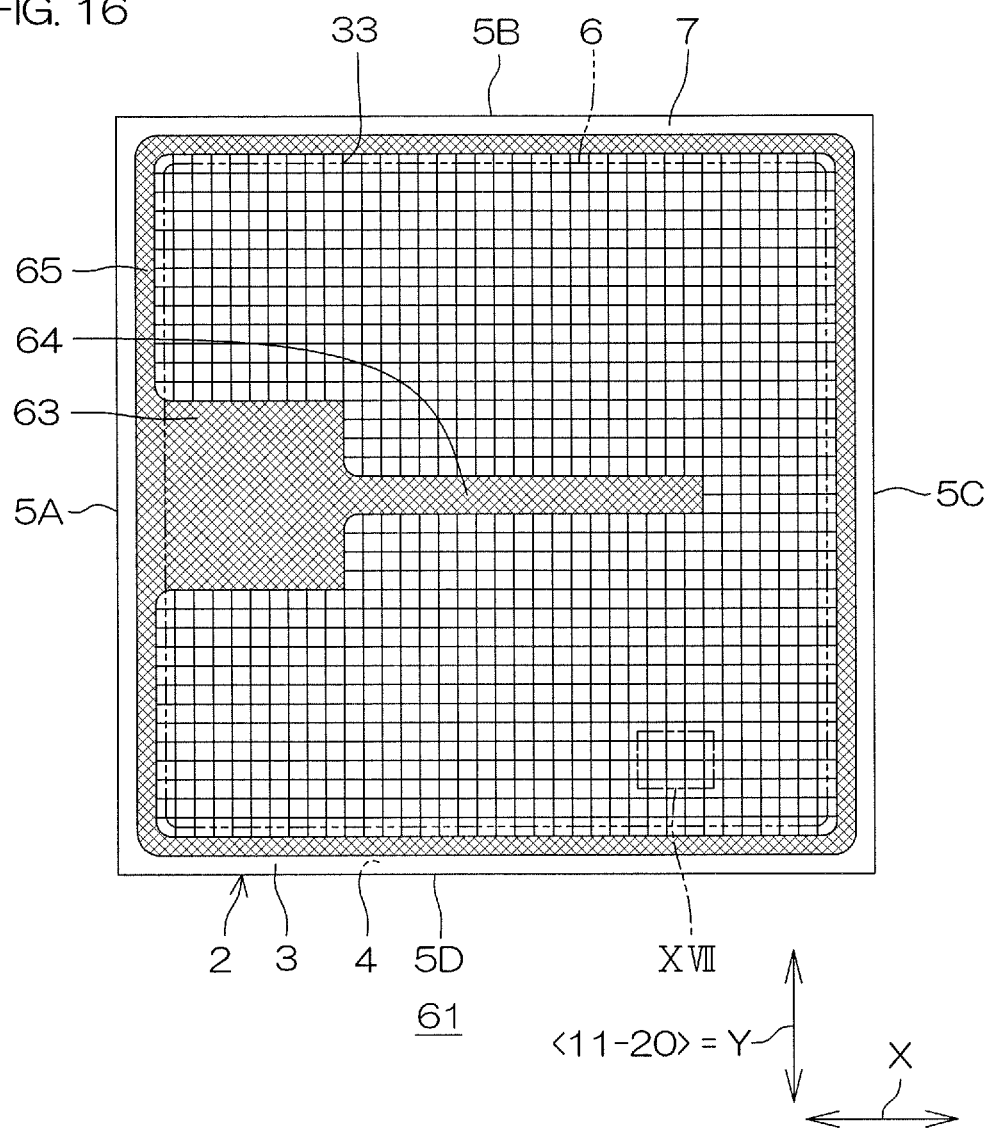
FIG. 16 is a plan view corresponding to FIG. 15, except that a surface electrode is removed, which is for explaining a structure on the first main surface of a semiconductor layer.

FIG. 16 is a plan view corresponding to FIG. 15, except that the gate electrode 10 and the source electrode 11 are removed, which is for explaining a structure on the first main surface 3 of the semiconductor layer 2.

A gate pad layer 63, a gate finger layer 64, and a gate line layer 65 are formed on the first main surface 3 of the semiconductor layer 2. For the sake of clarity, FIG. 16 shows the gate pad layer 63, the gate finger layer 64, and the gate line layer 65 by hatching.

The gate pad layer 63 is formed in a region directly below the gate pad 12. The gate pad layer 63 is electrically connected to the gate pad 12. Although not shown, the gate pad 12 is electrically connected to the gate pad layer 63 via a contact hole formed in the insulating layer 34.

In this preferred embodiment, the gate pad layer 63 is drawn out from the outer region 7 to the device formation region 6 so as to cross the boundary between the outer region 7 and the device formation region 6. In this preferred embodiment, the gate pad layer 63 is formed in a quadrilateral shape in plan view.

The gate finger layer 64 is formed in a region directly below the gate finger 13. The gate finger layer 64 is electrically connected to the gate finger 13. Although not shown, the gate finger 13 is electrically connected to the gate finger layer 64 via a contact hole formed in the insulating layer 34. The gate finger layer 64 is drawn out in a strip shape from the gate pad layer 63 so as to extend along the peripheral edge of the device formation region 6.

In this preferred embodiment, the gate finger layer 64 is formed in an endless shape (quadrilateral ring shape) surrounding the device formation region 6 in plan view. The gate finger layer 64 may be formed to partition the device formation region 6 from three directions.

The gate line layer 65 is formed in a region directly below the gate line 62. The gate line layer 65 is electrically connected to the gate line 62. Although not shown, the gate line 62 is electrically connected to the gate line layer 65 via a contact hole formed in the insulating layer 34.

The gate line layer 65 is drawn out from a leading end portion of the gate pad layer 63 toward a central portion of the device formation region 6. In this preferred embodiment, the gate line layer 65 is formed in a strip shape linearly extending from the gate pad layer 63 toward the side surface 5C of the semiconductor layer 2 in plan view.

A gate electrode layer 33 (planar gate structure) is formed in a C-shaped region defined by the gate pad layer 63, the gate finger layer 64, and the gate line layer 65. In this preferred embodiment, the gate electrode layers 33 are formed in a lattice pattern in plan view.

FIG. 16 shows the gate electrode layers 33 by lines in a lattice pattern. The gate electrode layers 33 are drawn out from the gate pad layer 63, the gate finger layer 64, and the gate line layer 65.

The gate electrode layers 33 are electrically connected to the gate pad 12, the gate finger 13, and the gate line 62 via the gate pad layer 63, the gate finger layer 64, and the gate line layer 65.

Figure 17:
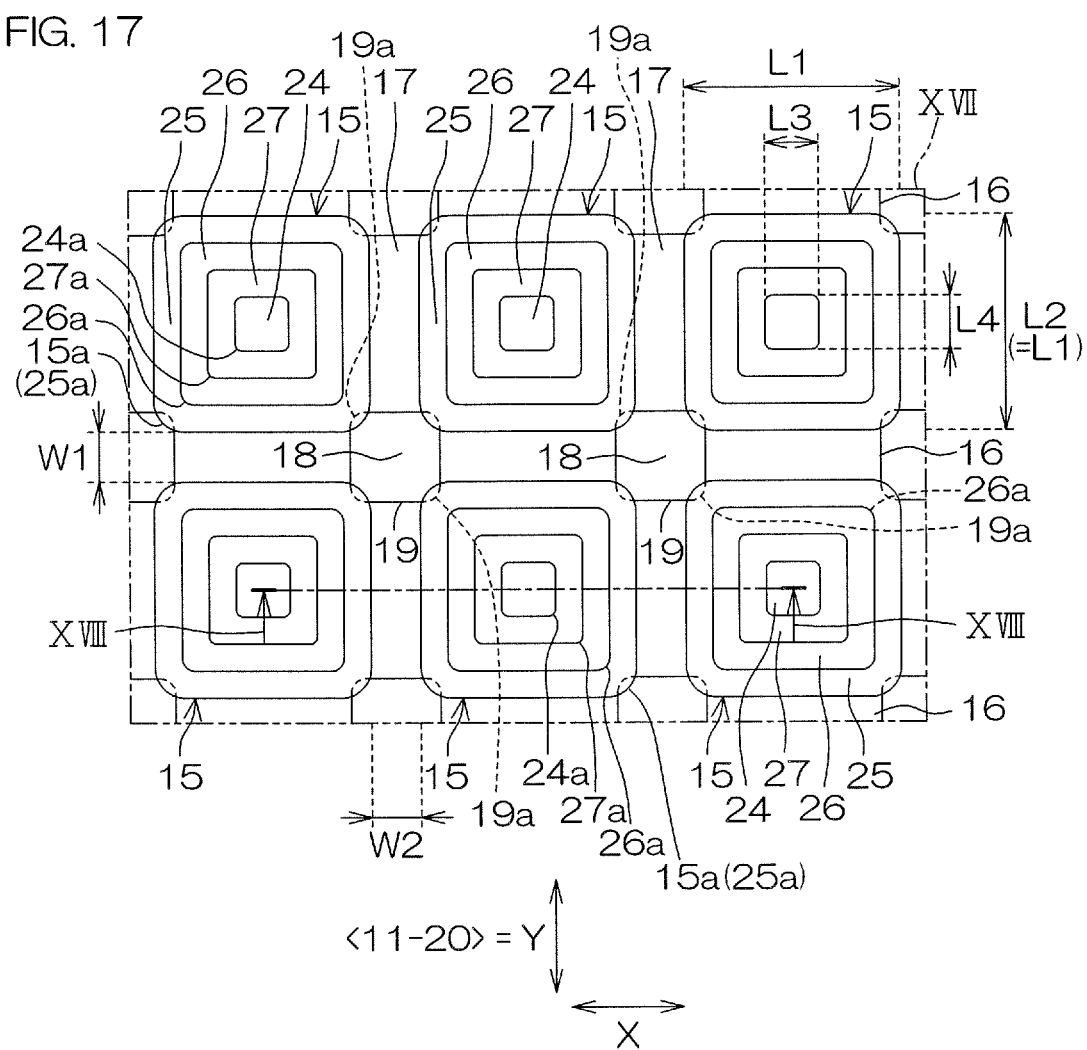
FIG. 17 is an enlarged view of a region XVII shown in FIG. 16, from which a structure located higher than the first main surface of the semiconductor layer is removed.

FIG. 17 is an enlarged view of a region XVII shown in FIG. 16, from which the structure above the first main surface 3 of the semiconductor layer 2 is removed.

Referring to FIG. 17, the unit cells 15 forming the SBDs 8 and the MISFETs 9 are formed in the device formation region 6. FIG. 17 shows an example in which the plurality of unit cells 15 are arrayed in a matrix pattern.

The plurality of unit cells 15 are formed at intervals along an arbitrary first direction and a second direction Y intersecting the first direction X. The first direction X is a direction along an arbitrary one side surface (the side surface 5B or 5D in this preferred embodiment) of the side surfaces 5A to 5D of the semiconductor layer 2. The second direction Y is a direction along side surfaces (the side surface 5A or 5C in this preferred embodiment) orthogonal to the arbitrary one side surface. In this preferred embodiment, the second direction Y is a direction orthogonal to the first direction X.

Each unit cell 15 is formed in a quadrilateral shape in plan view. The unit cell 15 has a corner portion 15a curved outward in a convex shape in plan view. This makes it possible to relax concentration of electric fields on the corner portion 15a of the unit cell 15.

An aspect ratio L2/L1 of the unit cell 15 can take a value of "1" or more (for example, between "1" and "4" (inclusive)), as shown in FIGS. 10 and 11 described above. The following is a case in which the aspect ratio is "1." The aspect ratio L2/L1 is defined by the ratio of a length L2 of one side of the unit cell 15 along the second direction Y to a length L1 of one side of the unit cell 15 along the first direction X.

In this preferred embodiment, the unit cell 15 is formed in a square shape in plan view. The length L1 of one side and the length L2 of one side of the unit cell 15 each may be between 5 and 15 μm (inclusive) (for example, about 10 μm).

A first line portion 16, a second line portion 17, and an intersecting portion 18 are formed on the first main surface 3 of the semiconductor layer 2. The first line portion 16, the second line portion 17, and the intersecting portion 18 each are formed from the first main surface 3 of the semiconductor layer 2 which is exposed from the unit cell 15.

The first line portion 16 extends in a region between the plurality of unit cells 15 along the first direction X and defines a region between the plurality of unit cells 15 adjacent to each other in the second direction Y. The second line portion 17 extends in a region between the plurality of unit cells 15 along the second direction Y and defines a region between the plurality of unit cells 15 adjacent to each other in the first direction X. The intersecting portion 18 is a portion where the first line portion 16 and the second line portion 17 intersect each other.

A width W1 of the first line portion 16 in the second direction Y may be between 0.8 μm and 3.0 μm (inclusive) (for example, about 1.2 μm). A width W2 of the second line portion 17 in the first direction X may be between 0.8 μm and 3.0 μm (inclusive) (for example, about 1.2 μm).

An impurity region 19 is formed in a surface layer portion of the first main surface 3 of the semiconductor layer 2 in each intersecting portion 18. The impurity region 19 relaxes the electric field generated in the surface layer portion of the first main surface 3 of the semiconductor layer 2, particularly between the adjacent unit cells 15. The impurity regions 19 suppress a reduction in the breakdown voltage of the semiconductor device 61.

In this preferred embodiment, each impurity region 19 includes a p-type impurity region or p$^+$-type impurity region. The impurity region 19 forms a p-n junction portion with the semiconductor layer 2 (an n$^-$-type epitaxial layer 22 to be described later). The impurity region 19 has a corner portion 19a curved outward in a convex shape in plan view.

The impurity region 19 overlaps the unit cell 15 at the intersecting portion 18. Specifically, the corner portion 19a of the impurity region 19 overlaps the corner portion 15a of the unit cell 15. More specifically, the four corner portions 19a of one impurity region 19 overlap the corner portions 15a of the four unit cells 15 adjacent to each other. This can properly relax concentration of electric fields on the corner portion 15a of each unit cell 15.

Figure 18:
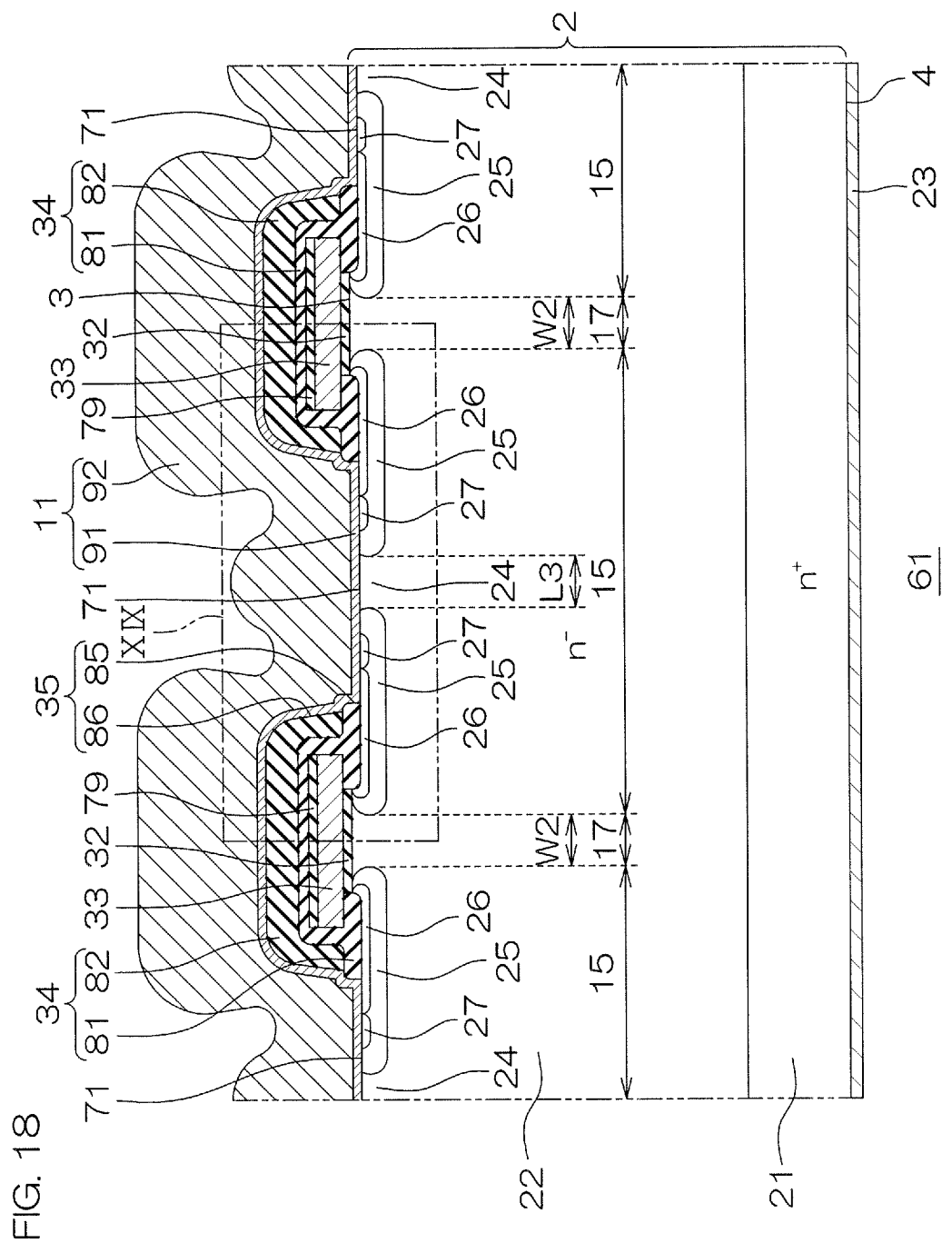
FIG. 18 is a sectional view taken along line XVIII-XVIII in FIG. 17.
Figure 19:
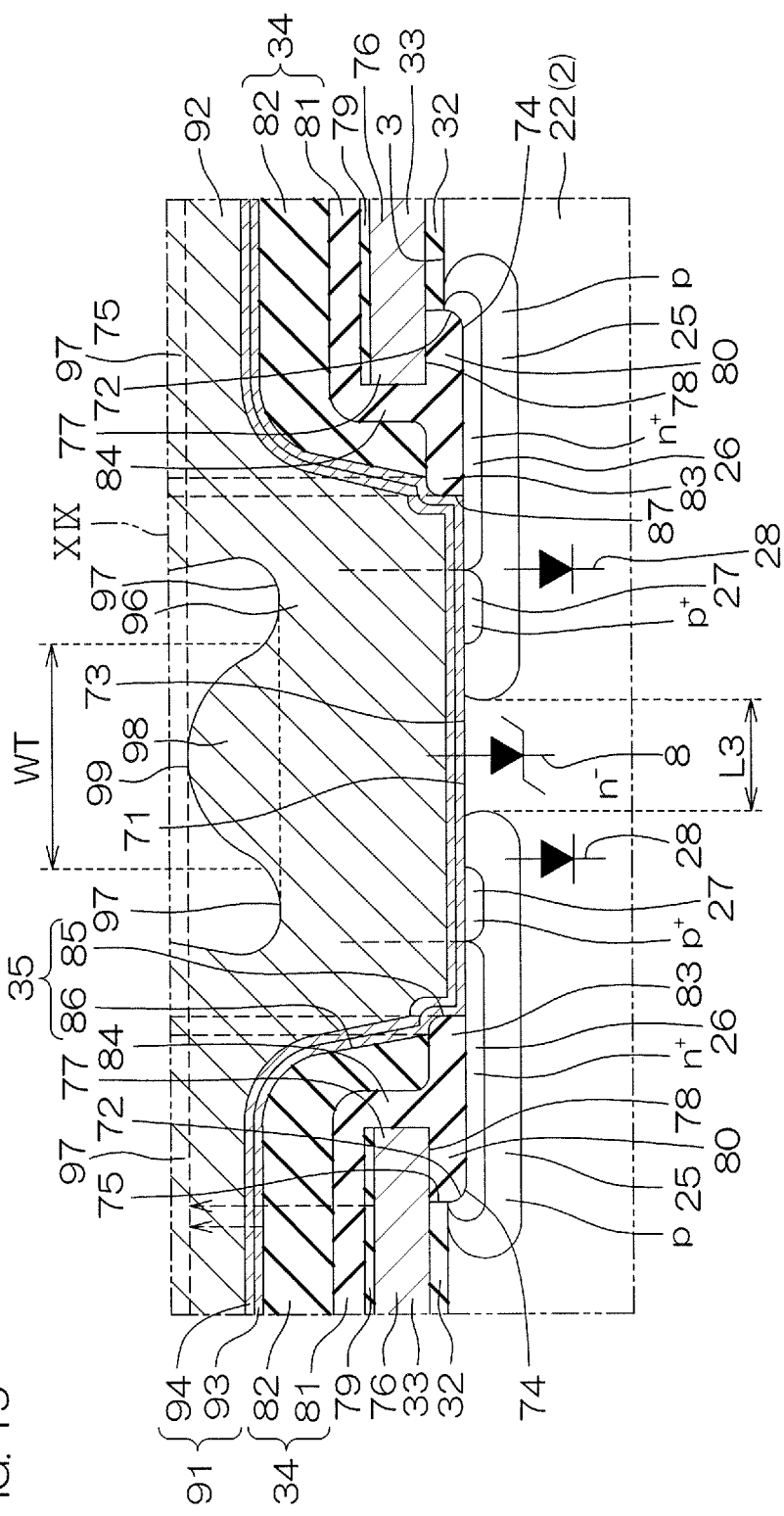
FIG. 19 is an enlarged view of a region XIX shown in FIG. 18.

FIG. 18 is a sectional view taken along line XVIII-XVIII in FIG. 17. FIG. 19 is an enlarged view of a region XIX shown in FIG. 18. The following description will also be made with reference to FIG. 17 as needed.

Referring to FIG. 18, the semiconductor layer 2 has a multilayer structure including an n$^+$-type semiconductor substrate 21 and the n$^-$-type epitaxial layer 22 formed on the n$^+$-type semiconductor substrate 21. The first main surface 3 of the semiconductor layer 2 is formed from the n$^-$-type epitaxial layer 22. The second main surface 4 of the semiconductor layer 2 is formed from the n$^+$-type semiconductor substrate 21.

In this preferred embodiment, the n$^+$-type semiconductor substrate 21 contains a wide band gap semiconductor. The n$^+$-type semiconductor substrate 21 may contain SiC, diamond, or a nitride semiconductor. The off-angle of the n$^+$-type semiconductor substrate 21 may be 4°.

In this preferred embodiment, the n$^-$-type epitaxial layer 22 contains a wide band gap semiconductor. The n$^-$-type epitaxial layer 22 may contain SiC, diamond, or a nitride semiconductor. SiC may be 4H—SiC. A nitride semiconductor may be GaN.

The n$^-$-type epitaxial layer 22 may be formed from the same type of material as that used for the n$^+$-type semiconductor substrate 21. The n$^-$-type epitaxial layer 22 may be formed from a different type of material from that used for the n$^+$-type semiconductor substrate 21. The following is an example in which both the n$^+$-type semiconductor substrate 21 and the n$^-$-type epitaxial layer 22 contain SiC (4H—SiC).

That is, the n$^+$-type semiconductor substrate 21 has a main surface having an off-angle of 10° or less with respect to the <11-20> direction from the [0001] plane. More specifically, the off-angle is 2° or 4°.

The n$^-$-type epitaxial layer 22 is formed by epitaxial growth of SiC from the main surface of the n$^+$-type semiconductor substrate 21. Accordingly, the n⁻-type epitaxial layer 22 has a main surface having an off-angle of 10° or less with respect to the <11-20> direction from the plane. More specifically, the off-angle is 2° or 4°.

In this preferred embodiment, the first direction X is set to a direction orthogonal to the <11-20> direction, and the second direction Y is set to the <11-20> direction. Accordingly, the plurality of unit cells 15 are arrayed at intervals along the <11-20> direction and the direction orthogonal to the <11-20> direction.

When the plurality of unit cells 15 are arrayed along the <11-20> direction by using a 4H—SiC substrate having an off-angle of 10° C. or less, the plurality of unit cells 15 adjacent to each other have the same relationships in terms of electric field and crystalline orientation.

The breakdown voltage strength of the unit cell 15 decreases due to local electric field concentration. For this reason, when an electric field locally concentrates on a given unit cell 15 of the plurality of unit cells 15, the given unit cell 15 imposes limitations in terms of the overall breakdown voltage strength of the plurality of unit cells 15.

Accordingly, arraying the plurality of unit cells 15 so as to have the same relationships in terms of electric field and crystalline orientation makes it possible to suppress local electric field concentration on a given unit cell 15 of the plurality of unit cells 15. This can further equalize the breakdown voltage strength of the respective unit cells 15, and hence can suppress a reduction in the breakdown voltage of the semiconductor device 1.

A drain electrode 23 (second main surface) is connected to the second main surface 4 of the semiconductor layer 2. The drain electrode 23 covers the second main surface 4 of the semiconductor layer 2 and forms an ohmic junction with the n⁺-type semiconductor substrate 21.

In the semiconductor layer 2, the n⁺-type semiconductor substrate 21 is formed as a low-resistance region (drain region). In the semiconductor layer 2, the n⁻-type epitaxial layer 22 is formed as a high-resistance region (drift region).

The thickness of the n⁻-type epitaxial layer 22 may be between 5 μm and 70 (inclusive). Increasing the thickness of the n⁻-type epitaxial layer 22 can improve the breakdown voltage of the semiconductor device 61.

For example, setting the thickness of the n⁻-type epitaxial layer 22 to 5 μm or more can obtain a breakdown voltage of 600 V or more. For example, setting the thickness of the n⁻-type epitaxial layer 22 to 20 μm or more can obtain a breakdown voltage of 3,000 V or more. For example, setting the thickness of the n⁻-type epitaxial layer 22 to 40 μm or more can obtain a breakdown voltage of 6,000 V or more.

Referring to FIGS. 17 to 19, the plurality of unit cells 15 are formed in the surface layer portion of the first main surface 3 of the semiconductor layer 2. A recess portion 71 that is recessed toward the second main surface 4 of the semiconductor layer 2 is formed in the surface of each unit cell 15.

That is, the plurality of recess portions 71 are arrayed in the first main surface 3 of the semiconductor layer 2 at intervals in a matrix pattern along the first direction X and the second direction Y. The unit cells 15 are formed along the recess portions 71. The depth of each recess portion 71 may be between 0.5 μm and 5 (inclusive).

Each recess portion 71 has a side wall 72, a bottom wall 73, and an edge portion 74 that connects the side wall 72 to the bottom wall 73. In this preferred embodiment, the recess portion 71 is set to a quadrilateral shape having four sides parallel to the respective sides of the unit cell 15 in plan view.

The bottom wall 73 of the recess portion 71 has a surface roughness Zr equal to or more than a surface roughness Zs of the first main surface 3 of the semiconductor layer 2 (Zr≥Zs). More specifically, the surface roughness Zr of the bottom wall 73 of the recess portion 71 is higher than the surface roughness Zs of the first main surface 3 of the semiconductor layer 2 (Zr>Zs). The surface roughnesses Zr and Zs each may be an arithmetic average roughness.

An n⁻-type diode region 24, a p-type well region 25, an n⁺-type source region 26, and a p⁺-type contact region 27 forming each unit cell 15 are formed in the bottom wall 73 of the recess portion 71.

The n⁻-type diode region 24 is formed in a central portion of the bottom wall 73 of the recess portion 71. The n⁻-type diode region 24 is formed in a quadrilateral shape in plan view. The n⁻-type diode region 24 has a corner portion 24a curved outward in a convex shape in plan view.

In this preferred embodiment, the n⁻-type diode region 24 is formed by directly using a partial region of the n⁻-type epitaxial layer 22. Accordingly, the n⁻-type diode region 24 has almost the same n-type impurity concentration as that of the n⁻-type epitaxial layer 22.

The n⁻-type diode region 24 may be formed by further implanting an n-type impurity into a surface layer portion of the n⁻-type epitaxial layer 22. In this case, the surface layer portion of the n⁻-type diode region 24 may have an n-type impurity concentration higher than that of the n⁻-type epitaxial layer 22.

An area ratio SD/SC of a plane area SD of the n⁻-type diode region 24 with respect to a plane area SC of the unit cell 15 may be between 0.005 and 0.015 (inclusive) (for example, about 0.01).

An aspect ratio L4/L3 of the n⁻-type diode region 24 may be "1." The aspect ratio L4/L3 is defined by the ratio of a length L4 of one side of the n⁻-type diode region 24 along the second direction Y to a length L3 of one side of the n⁻-type diode region 24 along the first direction X.

That is, in this preferred embodiment, the n⁻-type diode region 24 is formed in a square shape in plan view. The length L3 of one side and the length L4 of one side of the n⁻-type diode region 24 each may be between 0.8 μm and 3.0 μm (inclusive) (for example, about 1.2 μm).

The breakdown voltage of the semiconductor layer 2 is limited by the width (the length L3 or L4) of the narrowest portion of the n⁻-type diode region 24 and the width W1 of the first line portion 16 or the width W2 of the second line portion 17. Accordingly, the width (the length L3 or L4) of a narrowest portion of the n⁻-type diode region 24 is preferably almost equal to the width W1 of the first line portion 16 or the width W2 of the second line portion 17.

If, for example, the n⁻-type diode region 24 is small relative to the first line portion 16 and the second line portion 17, the breakdown voltage of the semiconductor layer 2 is limited by the n⁻-type diode region 24. In contrast to this, if the first line portion 16 and/or the second line portion 17 is small relative to the n⁻-type diode region 24, the breakdown voltage of the semiconductor layer 2 is limited by the first line portion 16 and/or the second line portion 17.

Accordingly, by forming the narrowest portion of the n⁻-type diode region 24 so as to make the width (the length L3 or L4) of the narrowest portion be almost equal to the width W1 of the first line portion 16 and the width W2 of the second line portion 17, it is possible to suppress the n⁻-type diode region 24 and the first line portion 16 or the second line portion 17 from limiting the breakdown voltage of the semiconductor layer 2.

The p-type well region 25 is formed along the peripheral edge of the n⁻-type diode region 24 at the bottom wall 73 of the recess portion 71. More specifically, the p-type well region 25 is formed in an endless shape (quadrilateral ring shape) surrounding the n⁻-type diode region 24 at the bottom wall 73 of the recess portion 71.

The p-type well region 25 extends from the bottom wall 73 of the recess portion 71 and covers the side wall 72 via the edge portion 74. That is, the bottom wall 73 of the recess portion 71 is located closer to the first main surface 3 of the semiconductor layer 2 than a bottom portion of the p-type well region 25.

The outer peripheral edge of the p-type well region 25 forms the outer peripheral edge of the unit cell 15. Accordingly, the p-type well region 25 has a corner portion 25a curved outward in a convex shape in plan view. The corner portion 25a of the p-type well region 25 corresponds to the corner portion 15a of the unit cell 15. This makes it possible to relax concentration of electric fields on the corner portion 25a of the p-type well region 25.

The bottom portion of the p-type well region 25 is formed parallel to the first main surface 3 of the semiconductor layer 2. That is, the bottom portion of the p-type well region 25 is formed parallel to the [0001] plane of the semiconductor layer 2. This structure can relax concentration of electric fields on the p-type well region 25 due to crystal properties.

The p-type well region 25 forms a p-n junction portion between the n⁻-type diode region 24 and the n⁻-type epitaxial layer 22. This p-n junction portion forms the first diode 28 having the p-type well region 25 as an anode and the n⁻-type diode region 24 (drain electrode 23) as a cathode.

The n⁺-type source region 26 is formed in the surface layer portion of the p-type well region 25. The n⁺-type source region 26 has an n-type impurity concentration higher than that of the n⁻-type diode region 24.

The n⁺-type source region 26 is formed at distances from the inner peripheral edge and outer peripheral edge of the p-type well region 25 at the bottom wall 73 of the recess portion 71. The n⁺-type source region 26 extends from the bottom wall 73 of the recess portion 71 and covers the side wall 72 via the edge portion 74.

In this preferred embodiment, the n⁺-type source region 26 is formed in an endless shape (quadrilateral ring shape) along the p-type well region 25 in plan view. The n⁺-type source region 26 has a corner portion 26a curved outward in a convex shape in plan view.

The p⁺-type contact region 27 is formed in a surface layer portion of the p-type well region 25. The p⁺-type contact region 27 has a p-type impurity concentration higher than the p-type well region 25.

The p⁺-type contact region 27 is formed in the region between the inner peripheral edge of the p-type well region 25 and the n⁺-type source region 26 at the bottom wall 73 of the recess portion 71. The boundary region between the p⁺-type contact region 27 and the n⁺-type source region 26 is in contact with the bottom wall 73 of the recess portion 71.

In this preferred embodiment, the p⁺-type contact region 27 is formed in an endless shape (quadrilateral ring shape) along the inner peripheral edge of the p-type well region 25 in plan view. The p⁺-type contact region 27 has a corner portion 27a curved outward in a convex shape in plan view.

Figure 20:
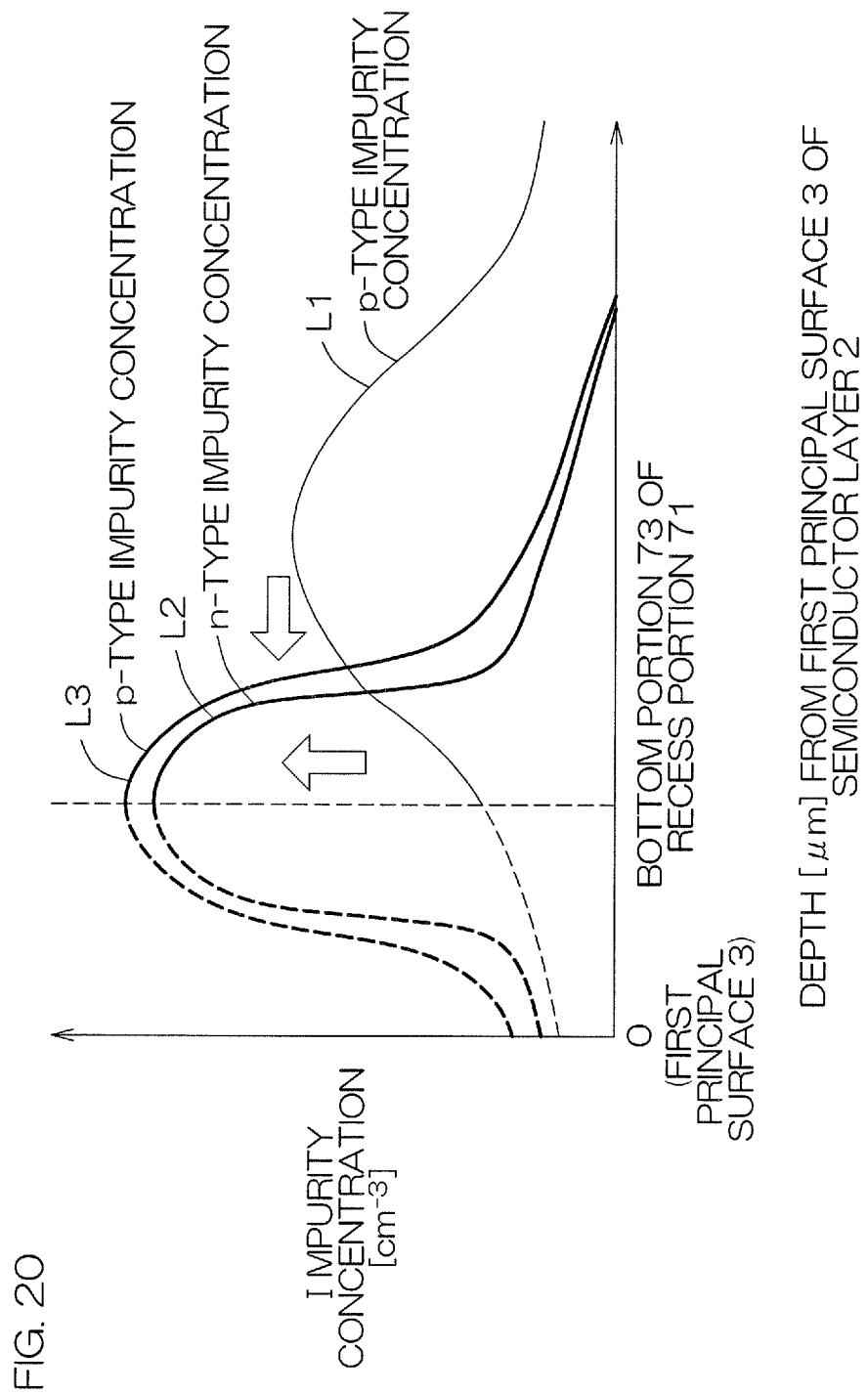
FIG. 20 is a graph showing impurity concentration profiles.

FIG. 20 is a graph showing the impurity concentration profiles of the p-type well region 25, the n⁺-type source region 26, and the p⁺-type contact region 27. Referring to FIG. 20, the ordinate represents impurity concentration [cm⁻³], and the abscissa represents depth [μm] from the first main surface 3 of the semiconductor layer 2.

FIG. 20 shows a first curve L1, a second curve L2, and a third curve L3. The first curve L1 represents the impurity concentration profile of the p-type well region 25. The second curve L2 represents the impurity concentration profile of the n⁺-type source region 26. The third curve L3 represents the impurity concentration profiled of the p⁺-type contact region 27.

Referring to the first curve L1, the p-type impurity concentration of the p-type well region 25 has its peak value (maximal value) in a midway portion in the depth direction. The p-type impurity concentration of the p-type well region 25 decreases from the peak value toward the first main surface 3 and the second main surface 4 of the semiconductor layer 2.

Referring to the first curve L2, the n-type impurity concentration of the n⁺-type source region 26 is higher than the p-type impurity concentration of the p-type well region 25. The n-type impurity concentration of the n⁺-type source region 26 has a concentration profile that gradually decreases from the first main surface 3 of the semiconductor layer 2 (the bottom wall 73 of the recess portion 71) toward the second main surface 4.

Referring to the broken-line portion of the second curve L2, in practice, the n-type impurity concentration of the n⁺-type source region 26 has its peak value (maximal value) in a midway portion in the depth direction like the p-type well region 25.

The recess portion 71 is formed by removing a region in the surface layer portion of the n⁺-type source region 26 which has a relatively low n-type impurity concentration. In this manner, the n⁺-type source region 26 is formed so as to have a concentration profile that exhibits a gradual decrease in n-type impurity concentration from the first main surface 3 of the semiconductor layer 2 toward the second main surface 4.

Referring to the third curve L3, the p-type impurity concentration of the p⁺-type contact region 27 is higher than the p-type impurity concentration of the p-type well region 25. The p-type impurity concentration of the p⁺-type contact region 27 has a concentration profile that gradually decreases from the first main surface 3 of the semiconductor layer 2 (the bottom wall 73 of the recess portion 71) toward the second main surface 4.

Referring to the broken line portion of the third curve L3, in practice, the p-type impurity concentration of the p⁺-type contact region 27 has its peak value (maximal value) in a midway portion in the depth direction like the p-type well region 25.

The recess portion 71 is formed by removing a region in the surface layer portion of the p⁺-type contact region 27 which has a relatively low p-type impurity concentration. In this manner, the p⁺-type contact region 27 is formed so as to have a concentration profile that exhibits a gradual decrease in p-type impurity concentration from the first main surface 3 of the semiconductor layer 2 (the bottom wall 73 of the recess portion 71) toward the second main surface 4.

As described above, portions having relatively low impurity concentrations are exposed in the p-type well region 25, the n⁺-type source region 26, and the p⁺-type contact region 27 at the bottom wall 73 of the recess portion 71. This improves the electrical connection of the source electrode 11 with respect to each semiconductor region, and hence can properly form the SBD 8 and the MISFET 9.

Each unit cell 15 has a JBS structure. The JBS structure includes a p-n junction portion formed between the n⁻-type diode region 24 and the p-type well region 25. In addition, a JFET structure is formed in the surface layer portion of the n⁻-type epitaxial layer 22 by using each unit cell 15.

Each JFET structure includes a first p-n-p structure and a second p-n-p structure. The first p-n-p structure is formed from the first line portion 16 of the n⁻-type epitaxial layer 22 and the p-type well regions 25 adjacent to the n⁻-type epitaxial layer 22 through the first line portion 16. The second p-n-p structure is formed from the second line portion 17 of the n⁻-type epitaxial layer 22 and the p-type well regions 25 adjacent to the n⁻-type epitaxial layer 22 through the second line portion 17.

Referring again to FIG. 18, each planar gate structure is formed on the first main surface 3 of the semiconductor layer 2. The planar gate structure has a multilayer structure including the gate insulating layer 32 and the gate electrode layer 33. The planar gate structures are formed in a lattice pattern along the first line portions 16 and the second line portions 17 in plan view.

Each gate insulating layer 32 may include an oxide film. The oxide film may contain silicon oxide. Referring to FIG. 19, a gate through hole 75 communicating with the recess portion 71 is formed in the gate insulating layer 32. The inner wall of the gate through hole 75 is formed so as to be flush with the side wall 72 of the recess portion 71.

The gate electrode layer 33 faces the p-type well region 25, the n⁺-type source region 26, and the n⁻-type epitaxial layer 22 through the gate insulating layer 32. The gate electrode layers 33 extend from regions on the first line portions 16, the second line portions 17, and the intersecting portions 18 to regions on the respective unit cells 15, and selectively cover the p-type well regions 25 and the n⁺-type source regions 26 of the respective unit cells 15.

More specifically, each gate electrode layer 33 includes a main body portion 76 and an overhanging portion 77. The main body portion 76 of the gate electrode layer 33 is located on the gate insulating layer 32. The overhanging portion 77 of the gate electrode layer 33 overhangs from the main body portion 76 of the gate electrode layer 33 to a region on the unit cell 15.

The overhanging portion 77 of the gate electrode layer 33 has a counter portion 78 that faces the bottom wall 73 of the recess portion 71 through a space. More specifically, the overhanging portion 77 of the gate electrode layer 33 faces the n⁺-type source region 26 through a space.

An upper surface insulating layer 79 is formed on the upper surface of the gate electrode layer 33. The upper surface insulating layer 79 covers almost the entire upper surface of the gate electrode layer 33. The upper surface insulating layer 79 is formed to improve the flatness of the region on the gate electrode layer 33. The upper surface insulating layer 79 may include a nitride film. The nitride film may contain silicon nitride.

The insulating layer 34 is formed on the first main surface 3 of the semiconductor layer 2. The insulating layer 34 covers the gate electrode layer 33. Although not shown, the insulating layer 34 also covers the gate pad layer 63, the gate finger layer 64, and the gate line layer 65.

The insulating layer 34 fills the space between the overhanging portion 77 of the gate electrode layer 33 and the bottom wall 73 of the recess portion 71 and covers the outer surface of the gate electrode layer 33. The insulating layer 34 includes a buried portion 80 buried in the space. The buried portion 80 of the insulating layer 34 is in contact with the gate insulating layer 32 in the space.

The overhanging portion 77 of the gate electrode layer 33 faces the n⁺-type source region 26 through the buried portion 80 of the insulating layer 34. Accordingly, the buried portion 80 of the insulating layer 34 functions as part of the gate insulating layer 32.

The thickness of the buried portion 80 of the insulating layer 34 may be equal to or more than that of the gate insulating layer 32. That is, the insulating layer 34 can be regarded as having a thin-film portion in contact with an inward portion (main body portion 76) of the gate electrode layer 33 and a thick-film portion that has a thickness larger than that of the thin-film portion and is in contact with a peripheral edge portion (overhanging portion 77) of the gate electrode layer 33.

In this preferred embodiment, each insulating layer 34 has a multilayer structure obtained by stacking a plurality of insulating films on each other in layers. More specifically, the plurality of insulating films include an insulating film 81 and an insulating film 82 stacked in the order named from the first main surface 3 side of the semiconductor layer 2. The insulating film 82 contains an insulating material having properties different from those of the insulating material of the insulating film 81.

The insulating film 81 may contain undoped silica glass (USG). The insulating film 82 may contain phosphosilicate glass (PSG). The insulating film 82 may contain borophosphosilicate glass (BPSG) instead of PSG.

The insulating film 81 is formed on the first main surface 3 of the semiconductor layer 2 so as to cover the gate electrode layer 33. The insulating film 81 extends from the bottom wall 73 of the recess portion 71 and covers the outer surface of the gate electrode layer 33. More specifically, the insulating film 81 includes a first covering portion 83 that covers the bottom wall 73 of the recess portion 71 and a second covering portion 84 that covers the outer surface of the gate electrode layer 33.

The first covering portion 83 of the insulating film 81 is formed in the form of a film along the bottom wall 73 of the recess portion 71. The first covering portion 83 of the insulating film 81 is buried in the space between the overhanging portion 77 of the gate electrode layer 33 and the bottom wall 73 of the recess portion 71. The buried portion 80 of the insulating layer 34 is formed from the first covering portion 83 of the insulating film 81.

The second covering portion 84 of the insulating film 81 is formed in the form of a film along the outer surface of the gate electrode layer 33. The second covering portion 84 of the insulating film 81 faces the upper surface of the gate electrode layer 33 through the upper surface insulating layer 79.

A first contact hole 85 is formed in the insulating film 81 so as to expose the n⁻-type diode region 24, the n⁺-type source region 26, and the p⁺-type contact region 27. More specifically, the first contact hole 85 is formed in the first covering portion 83 of the insulating film 81.

The inner wall of the first contact hole 85 is formed directly above the n⁺-type source region 26. The opening edge portion of the first contact hole 85 has a convex curved surface curved outward in a convex shape.

The insulating film 82 covers the insulating film 81. The insulating film 82 covers the second covering portion 84 of the insulating film 81 from above the first covering portion 83 of the insulating film 81. A second contact hole 86 communicating with the first contact hole 85 is formed in the insulating film 82.

In this preferred embodiment, the second contact hole 86 forms one contact hole 35 together with the first contact hole

85. The opening edge portion of the second contact hole 86 has a convex curved surface curved outward in a convex shape.

The opening width of the second contact hole 86 is equal to or more than that of the first contact hole 85. The inner wall of the second contact hole 86 surrounds the inner wall of the first contact hole 85. The inner wall of the first contact hole 85 is located in an inward region of the second contact hole 86. A stepped portion 87 including the opening edge portion of the first contact hole 85 is formed in the region between the inner wall of the first contact hole 85 and the inner wall of the second contact hole 86.

The source electrode 11 is formed on the insulating layer 34. The source electrode 11 enters the contact hole 35 from above the insulating layer 34. The source electrode 11 collectively covers the $n^-$-type diode region 24, the $n^+$-type source region 26, and the $p^+$-type contact region 27 in the contact hole 35.

The source electrode 11 forms a Schottky junction with the $n^-$-type diode region 24. This forms the SBD 8 having the source electrode 11 as an anode and the $n^-$-type diode region 24 (drain electrode 23) as a cathode.

The source electrode 11 forms an ohmic junction between the $n^+$-type source region 26 and the $p^+$-type contact region 27. This forms the MISFET 9 including the semiconductor layer 2, the p-type well region 25, the $n^+$-type source region 26, the $p^+$-type contact region 27, the gate insulating layer 32, the gate electrode 10 (gate electrode layer 33), the source electrode 11, and the drain electrode 23.

In this preferred embodiment, the source electrode 11 has a multilayer structure including an electrode layer 91 and an electrode layer 92.

The electrode layer 91 is formed in the form of a film and enters the contact hole 35 from above the insulating layer 34. The electrode layer 91 covers the stepped portion 87 including the opening edge portion of the first contact hole 85 in the contact hole 35. The electrode layer 91 collectively covers the $n^-$-type diode region 24, the $n^+$-type source region 26, and the $p^+$-type contact region 27 in the contact hole 35.

The electrode layer 91 covers the bottom wall 73 of the recess portion 71 which has the relatively large surface roughness Zr. This increases the adhesion force of the electrode layer 91 (source electrode 11) with respect to the bottom wall 73 of the recess portion 71. This can properly form the SBD 8 in the region between the electrode layer 91 (source electrode 11) and the $n^-$-type diode region 24.

In this preferred embodiment, the electrode layer 91 has a multilayer structure including a first barrier electrode film 93 and a second barrier electrode film 94. The first barrier electrode film 93 includes a titanium (Ti) film. The second barrier electrode film 94 includes a titanium nitride (TiN) film. The electrode layer 91 may have a single-layer structure including only a titanium (Ti) film or a titanium nitride (TiN) film.

The electrode layer 92 is formed on the electrode layer 91. The electrode layer 92 has a thickness larger than that the electrode layer 91. The electrode layer 92 is formed in the form of a film along the electrode layer 91, and enters the contact hole 35 from above the insulating layer 34.

The electrode layer 91 collectively covers the $n^-$-type diode region 24, the $n^+$-type source region 26, and the $p^+$-type contact region 27, with the electrode layer 91 being interposed between them, in the contact hole 35. The electrode layer 92 may contain aluminum.

Referring to FIGS. 18 and 19, each source electrode 11 includes a first covering portion 95 that covers the insulating layer 34 and a second covering portion 96 that covers the bottom wall 73 of the recess portion 71. The first covering portion 95 bulges upward from above the insulating layer 34. The second covering portion 96 has a thickness equal to or less than that of the first covering portion 95.

The upper surface of the second covering portion 96 is located on the bottom wall 73 side of the recess portion 71 relative to the upper surface of the first covering portion 95. The upper surface of the second covering portion 96 and the upper surface of the first covering portion 95 are formed from the electrode layer 92.

In this preferred embodiment, the upper surface of the second covering portion 96 is located at almost the same height position as that of the upper surface of the insulating layer 34. With this structure, a recess is defined by the first covering portion 95 and the second covering portion 96 in the source electrode 11.

A depression 97 is formed in a corner portion of the upper surface of the second covering portion 96 at the source electrode 11. More specifically, the corner portion of the second covering portion 96 is a connecting portion that connects the first covering portion 95 to the second covering portion 96.

Each depression 97 depresses toward the first main surface 3 of the semiconductor layer 2. The depression 97 may depress toward a corner portion of the insulating layer 34 (insulating film 82). The depression 97 faces the bottom wall 73 of the recess portion 71. The depression 97 faces the $n^+$-type source region 26. The depression 97 faces the $p^+$-type contact region 27.

The depressions 97 form, at a central portion of the second covering portion 96, a thick-film portion 98 having a thickness equal to or more than those of other regions. The thick-film portion 98 is formed at a portion of the second covering portion 96 which covers the $n^-$-type diode region 24.

A width WT of the thick-film portion 98 may be equal to or more than the length L3 or L4 of the $n^-$-type diode region 24 (WT≤L3 or L4). The thick-film portion 98 forms, on the upper surface of the second covering portion 96, a protruding portion 99 protruding to an upper side relative to the depression 97.

The top portion of the protruding portion 99 is located higher than the upper surface of the gate electrode layer 33. The top portion of the protruding portion 99 may be located in the region between the upper surface of the insulating layer 34 and the upper surface of the first covering portion 95. The top portion of the protruding portion 99 may be located on the bottom wall 73 side of the recess portion 71 relative to the upper surface of the insulating layer 34.

Although not shown, a plurality of contact holes are selectively formed in the insulating layer 34 so as to expose the gate pad layer 63, the gate finger layer 64, and the gate line layer 65.

The gate pad 12, the gate finger 13, and the gate line 62 respectively enter the corresponding contact holes (not shown) from above the insulating layer 34. The gate pad 12, the gate finger 13, and the gate line 62 are electrically connected to the gate pad layer 63, the gate finger layer 64, and the gate line layer 65 in the corresponding contact holes.

The gate pad 12, the gate finger 13, and the gate line 62 each may have a multilayer structure including the electrode layer 91 and the electrode layer 92 like the source electrode 11.

As shown in FIGS. 10 and 11 described above, in the semiconductor device 61, the aspect ratio L2/L1 of each of the plurality of unit cells 15 may be adjusted within a range between "1" and "4" (inclusive). The area ratio SD/SC of the n⁻-type diode region 24 with respect to the unit cell 15 may be adjusted within a range between 0.005 and 0.01 (inclusive).

Arbitrarily combining the aspect ratio L2/L1 in the range and the area ratio SD/SC in the range can reduce the conduction loss of the SBD 8 and increase the degree of freedom in design as described with reference to the semiconductor device 1.

The specific structure of each of the plurality of unit cells 15 with the aspect ratio L2/L1 being between "1" and "4" (inclusive) is the same as that described with reference to FIGS. 10 and 11, etc., and hence a description of the structure will be omitted.

As described above, the semiconductor device 61 can also obtain the same effects as those described with reference to the semiconductor device 1.

Figure 21B:
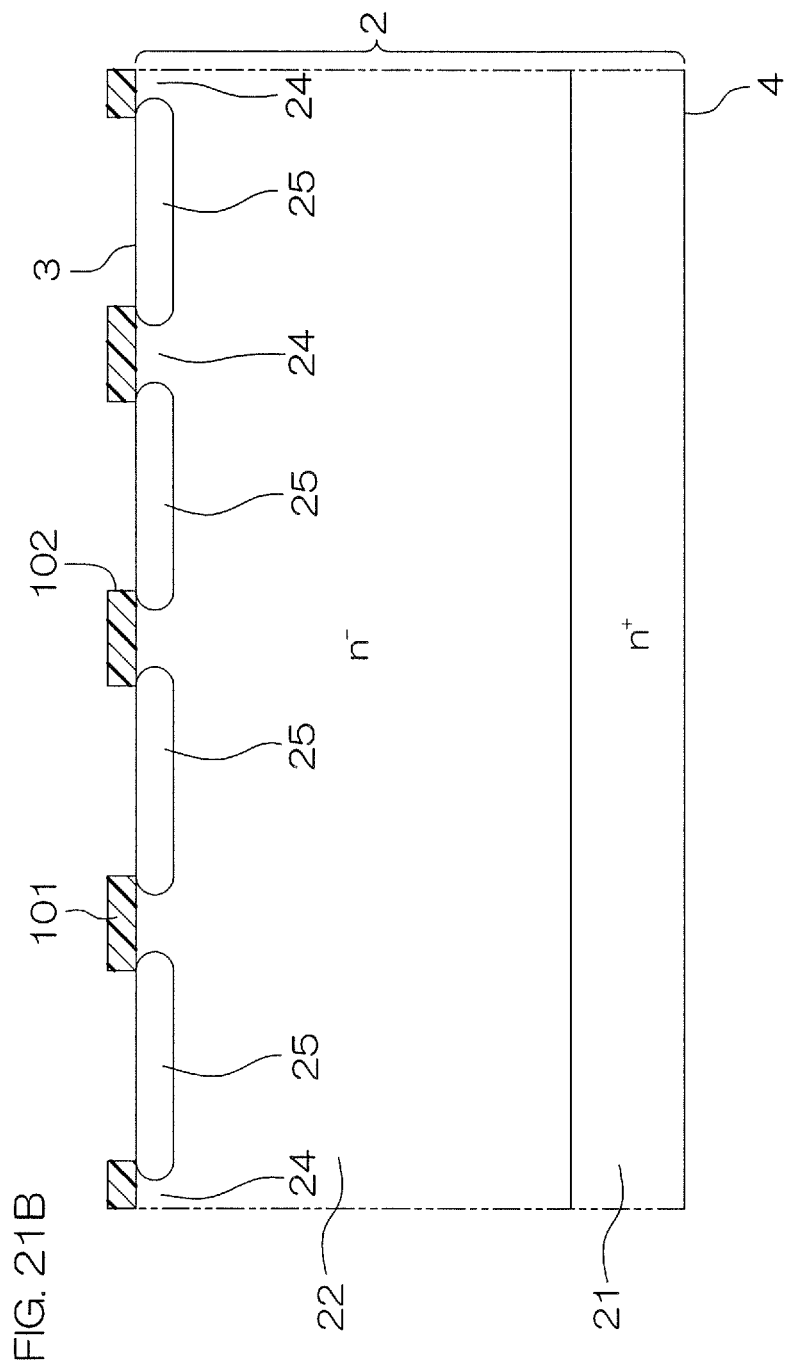
FIG. 21B is a sectional view showing a step after FIG. 21A.
Figure 21C:
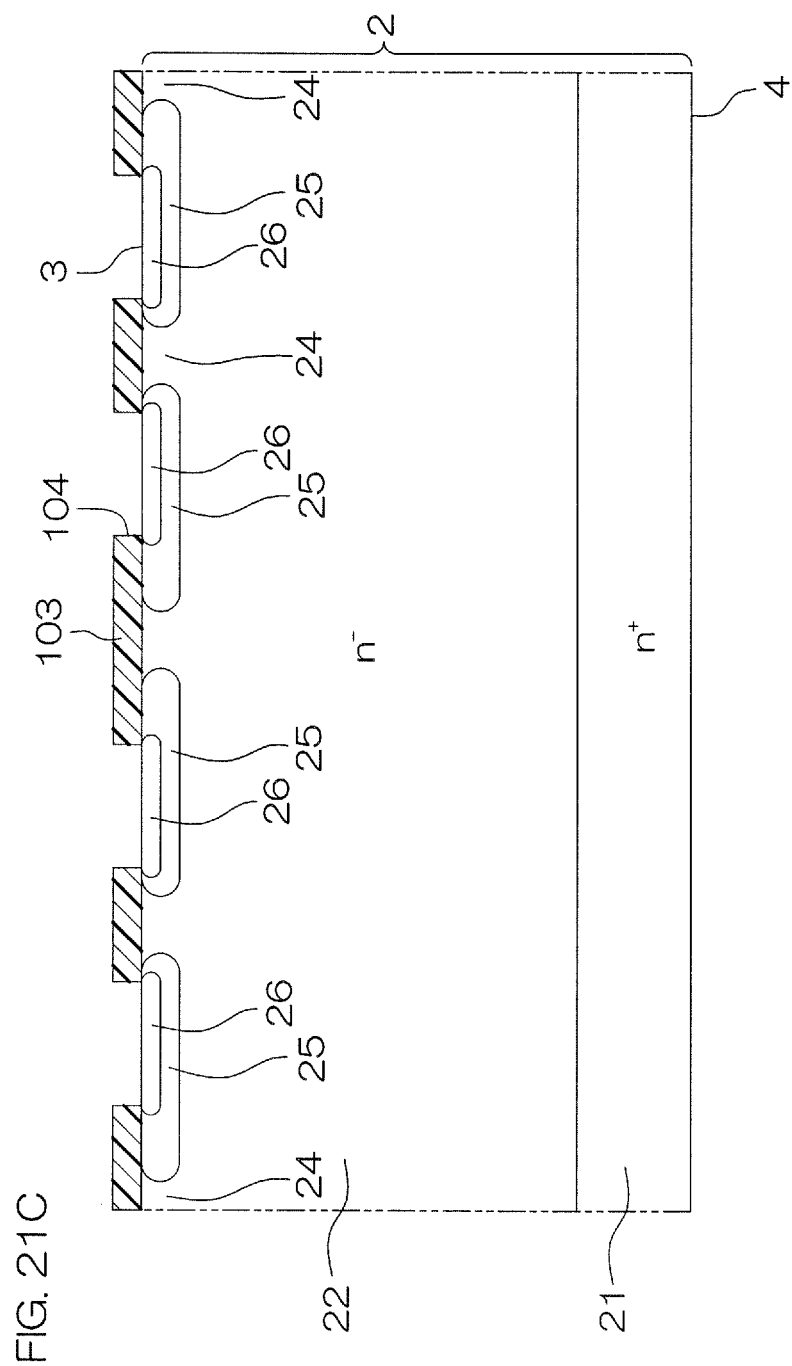
FIG. 21C is a sectional view showing a step after FIG. 21B.
Figure 21E:
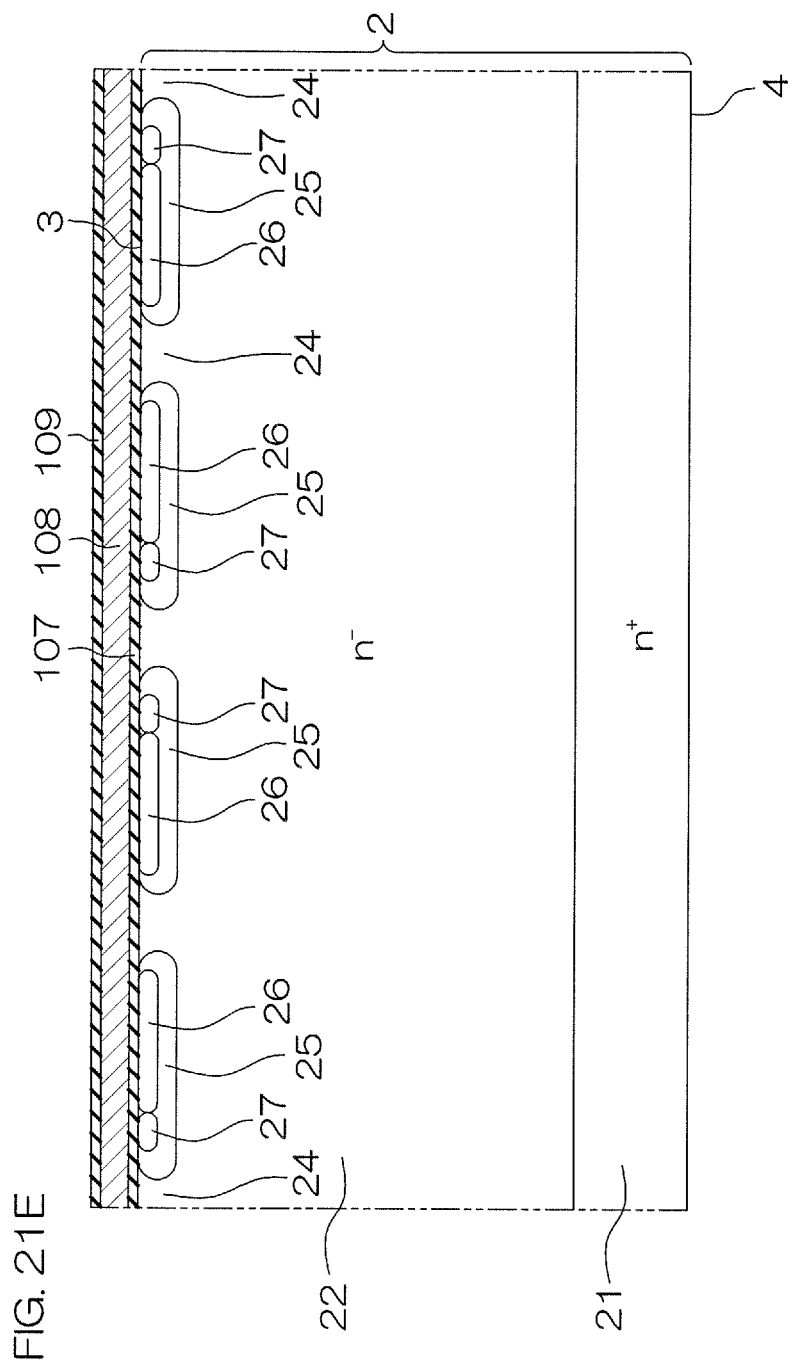
FIG. 21E is a sectional view showing a step after FIG. 21D.
Figure 21F:
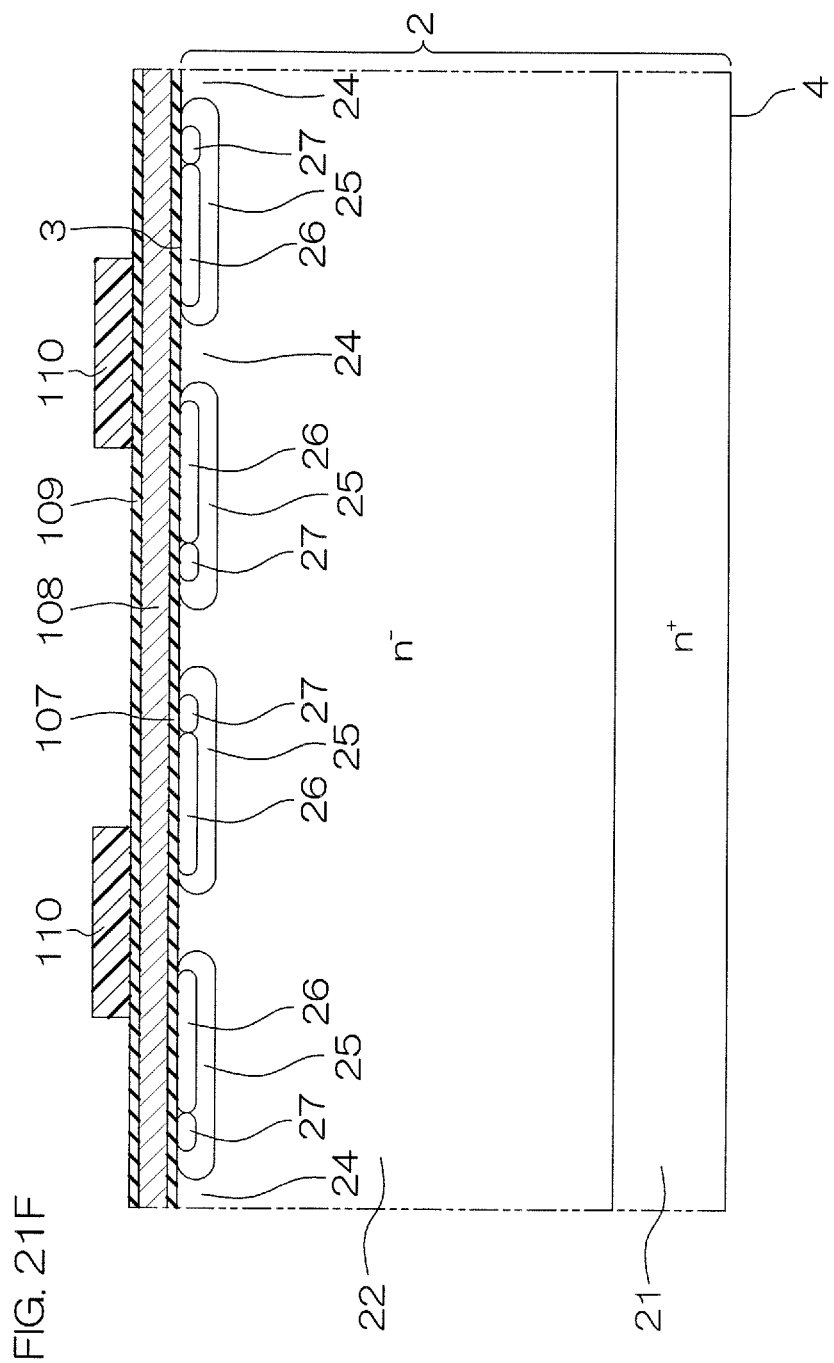
FIG. 21F is a sectional view showing a step after FIG. 21E.
Figure 21H:
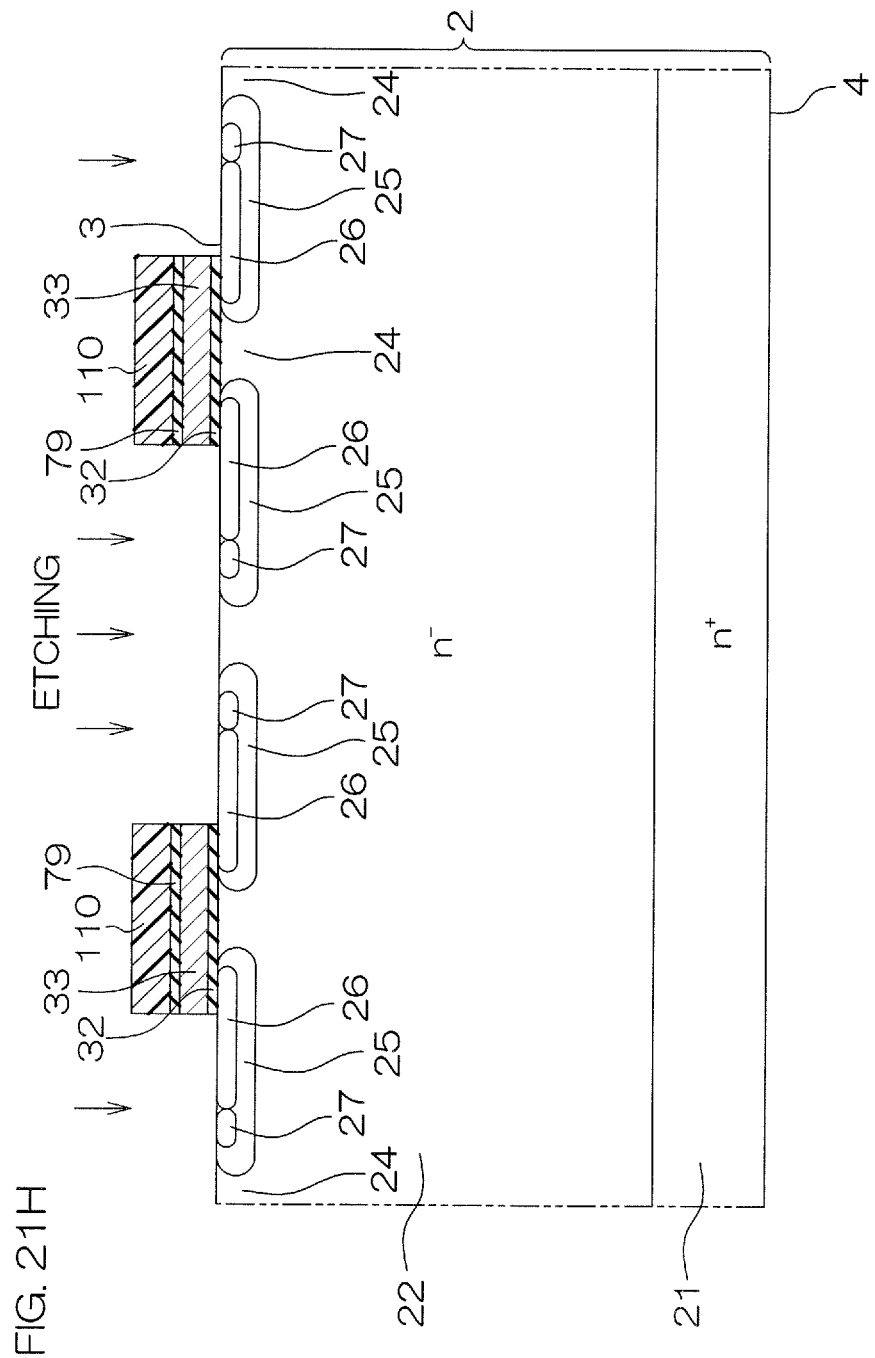
FIG. 21H is a sectional view showing a step after FIG. 21G.
Figure 21J:
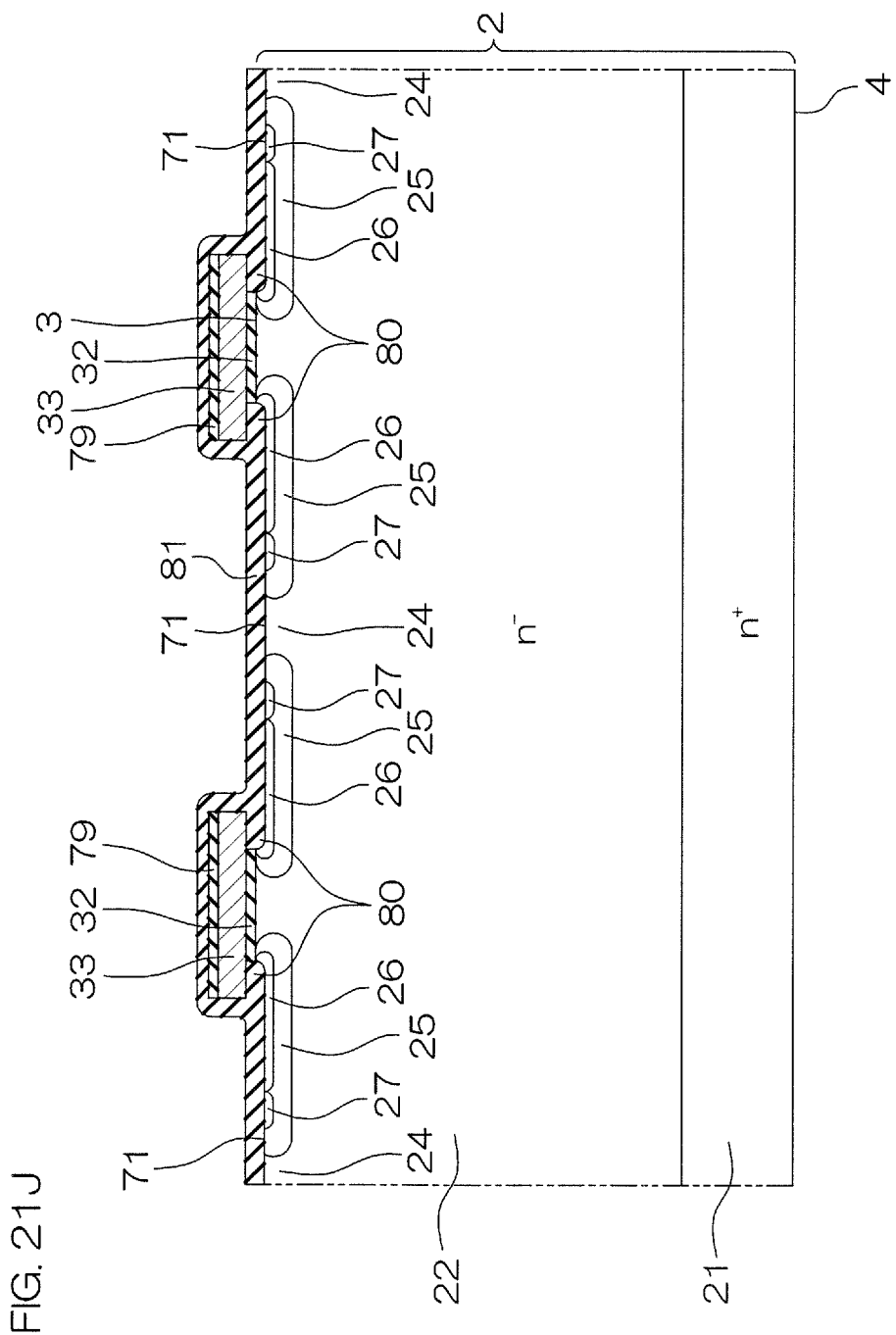
FIG. 21J is a sectional view showing a step after FIG. 21I.
Figure 21K:
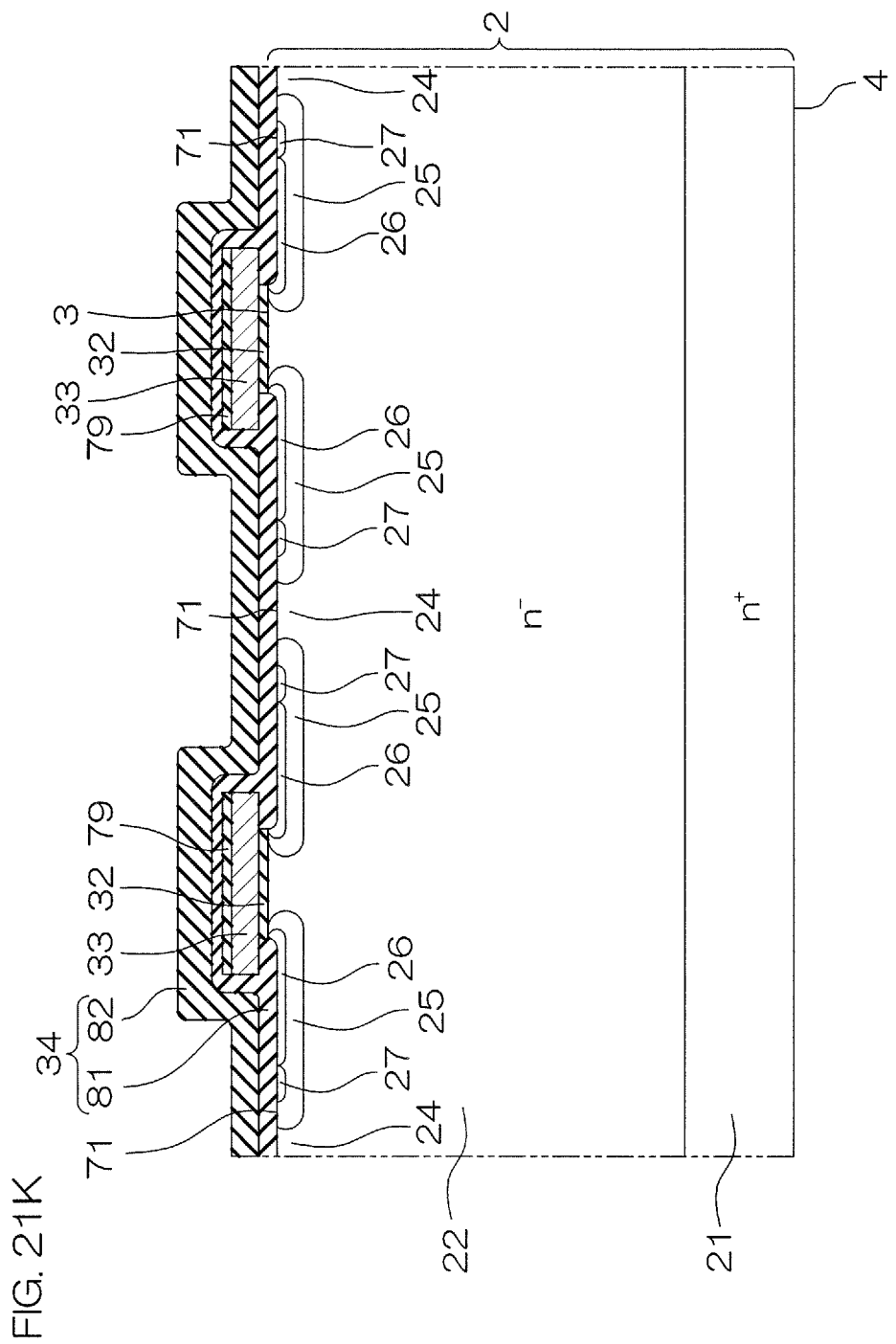
FIG. 21K is a sectional view showing a step after FIG. 21J.
Figure 21L:
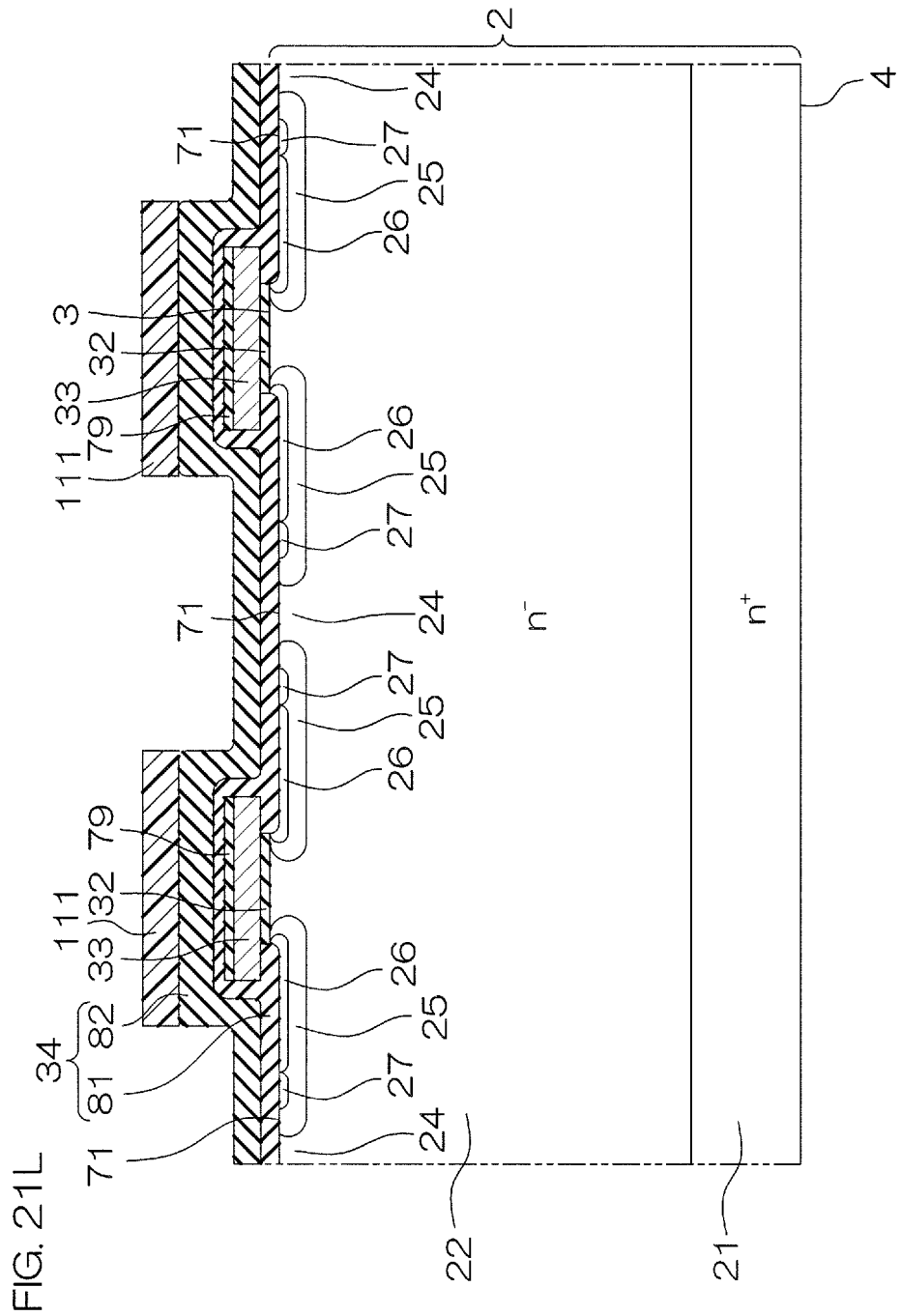
FIG. 21L is a sectional view showing a step after FIG. 21K.
Figure 21M:
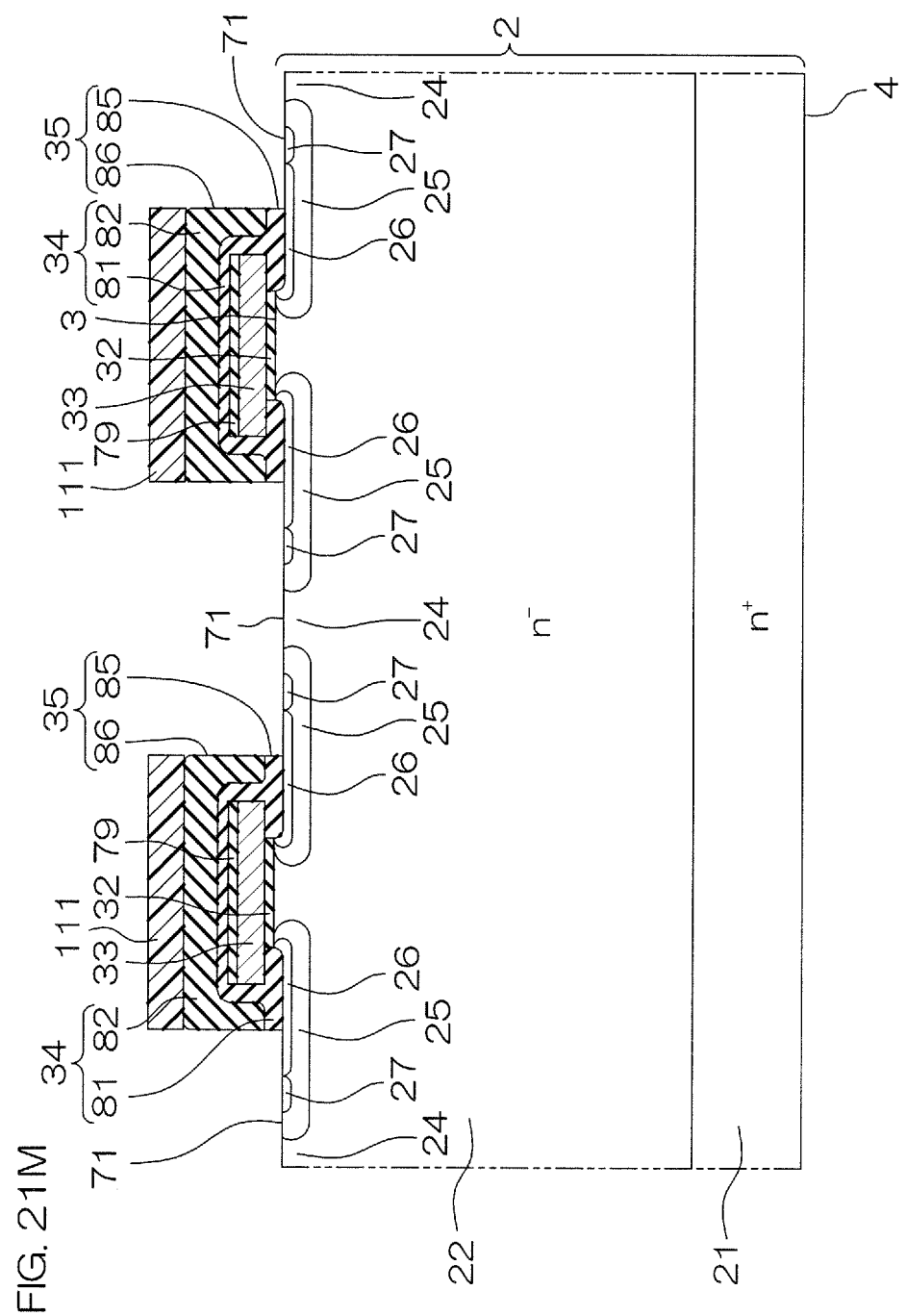
FIG. 21M is a sectional view showing a step after FIG. 21L.
Figure 21N:
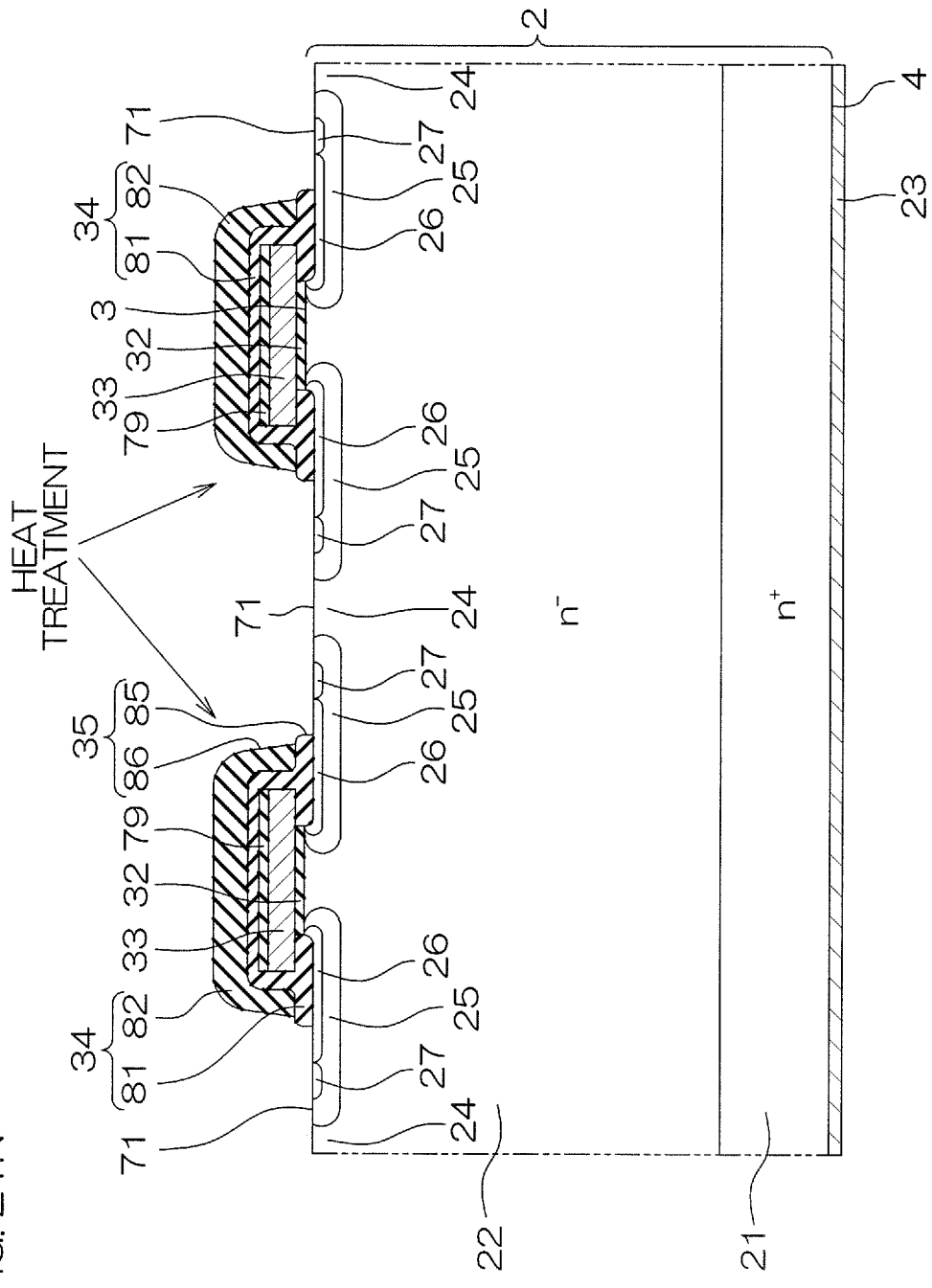
FIG. 21N is a sectional view showing a step after FIG. 21M.
Figure 21O:
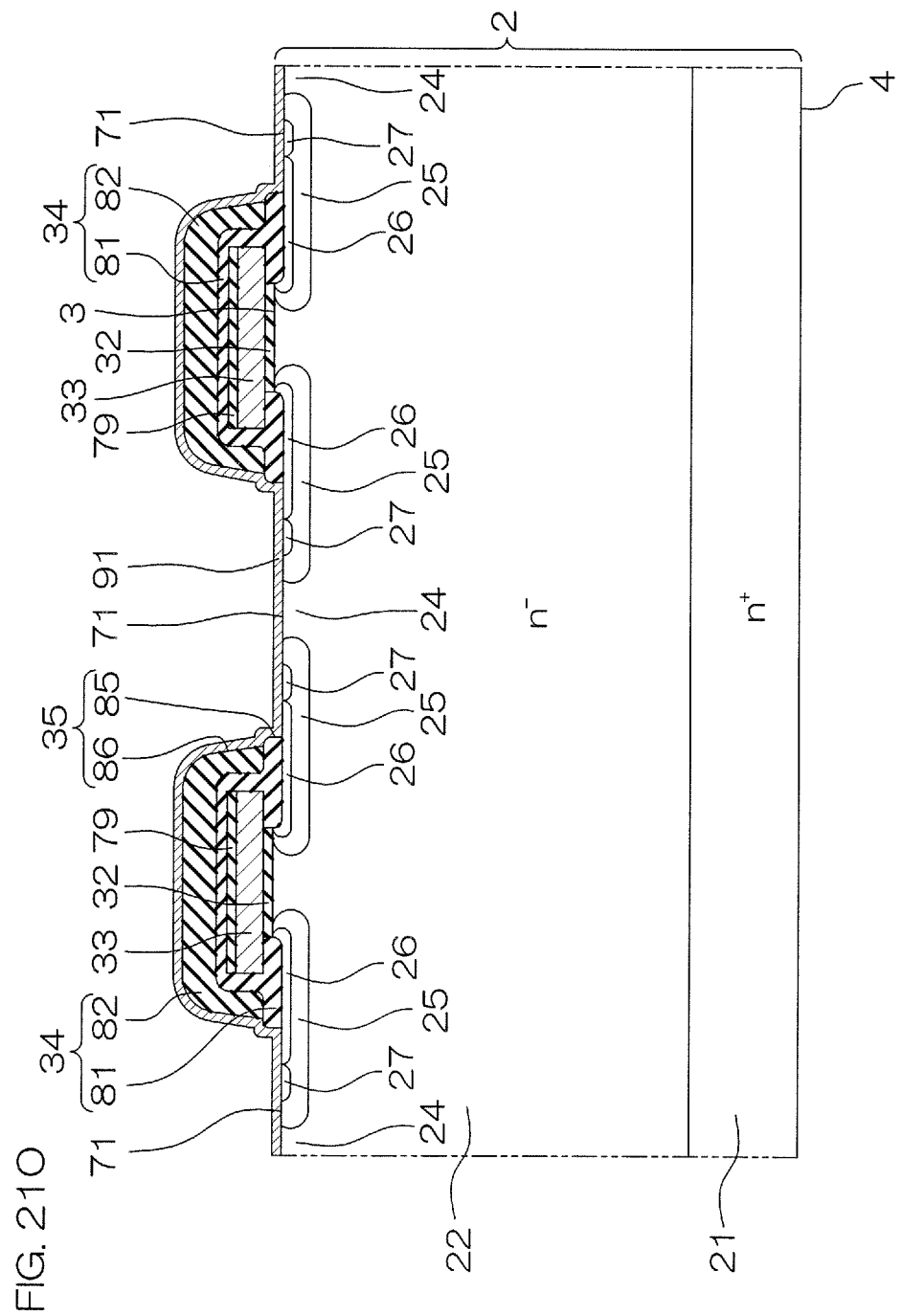
FIG. 21O is a sectional view showing a step after FIG. 21N.
Figure 21P:
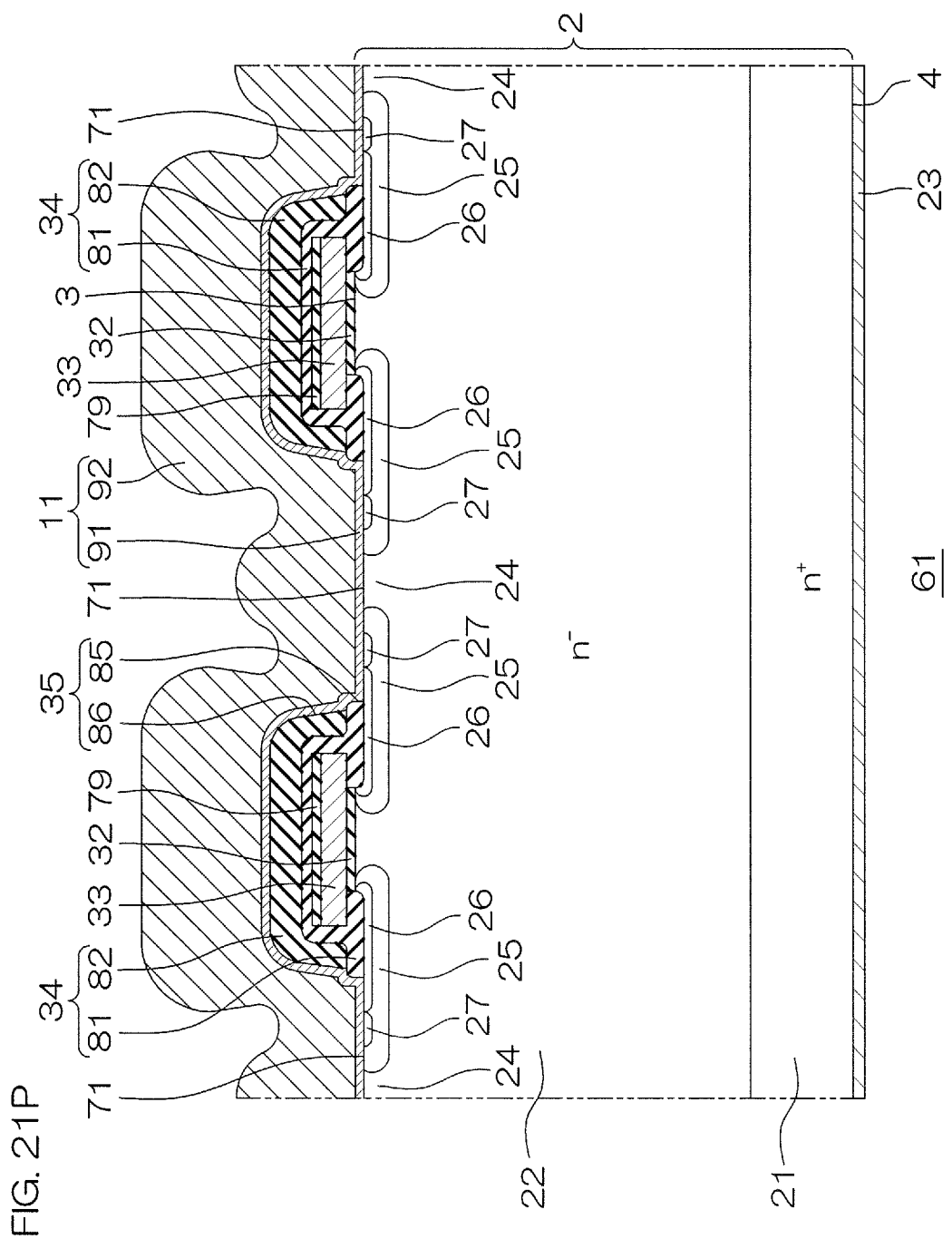
FIG. 21P is a sectional view showing a step after FIG. 21O.

FIGS. 21A to 21P are sectional views for explaining an example of a method of manufacturing the semiconductor device 61 shown in FIG. 15. FIGS. 21A to 21 are sectional views of a portion corresponding to FIG. 18.

Referring to FIG. 21A, the semiconductor layer 2 is prepared. The semiconductor layer 2 is formed through the step of preparing the n⁺-type semiconductor substrate 21 and the step of forming the n⁻-type epitaxial layer 22 on the main surface of the n⁺-type semiconductor substrate 21. The n⁻-type epitaxial layer 22 is formed by epitaxial growth of SiC from the main surface of the n⁺-type semiconductor substrate 21.

Referring to FIG. 21B, the p-type well region 25 is then formed in a main surface portion of the first main surface 3 of the semiconductor layer 2. In the step of forming the p-type well region 25, first of all, an ion implantation mask 101 having a predetermined pattern is formed on the first main surface 3 of the semiconductor layer 2. The ion implantation mask 101 has a plurality of openings 102 for exposing regions in which the p-type well regions 25 should be formed.

A p-type impurity is then implanted into a surface layer portion of the first main surface 3 of the semiconductor layer 2 through the ion implantation mask 101. This forms the p-type well regions 25 in the surface layer portion of the first main surface 3 of the semiconductor layer 2. After the step of forming the p-type well regions 25, the ion implantation mask 101 is removed.

Referring to FIG. 21C, the n⁺-type source regions 26 are then formed in surface layer portions of the p-type well regions 25. In the step of forming the n⁺-type source regions 26, first of all, an ion implantation mask 103 having a predetermined pattern is formed on the first main surface 3 of the semiconductor layer 2. The ion implantation mask 103 has a plurality of openings 104 for exposing regions in which the n⁺-type source regions 26 should be formed.

An n-type impurity is then implanted into surface layer portions of the p-type well regions 25 through the ion implantation mask 103. This forms the n⁺-type source regions 26 in the surface layer portions of the p-type well regions 25. After the step of forming the n⁺-type source regions 26, the ion implantation mask 103 is removed.

Subsequently, referring to FIG. 21D, the p⁺-type contact regions 27 are formed in surface layer portions of the p-type well regions 25. In the step of forming the p⁺-type contact regions 27, first of all, an ion implantation mask 105 having a predetermined pattern is formed on the first main surface 3 of the semiconductor layer 2. The ion implantation mask 105 has a plurality of openings 106 for exposing regions in which the p⁺-type contact regions 27 should be formed.

A p-type impurity is then implanted into surface layer portions of the p-type well regions 25 through the ion implantation mask 105. This forms the p⁺-type contact regions 27 in the surface layer portions of the p-type well regions 25. After the step of forming the p⁺-type contact region 27, the ion implantation mask 105 is removed.

The order of execution of the step of forming the p-type well regions 25 (see FIG. 21B), the step of forming the n⁺-type source regions 26 (see FIG. 21C), and the step of forming the p⁺-type contact regions 27 (see FIG. 21C) is arbitrary, and is not limited to the above order.

Subsequently, referring to FIG. 21E, a base insulating layer 107 serving as the base of each gate insulating layer 32 is formed on the first main surface 3 of the semiconductor layer 2. The base insulating layer 107 may be formed by a thermal oxidation treatment method or chemical vapor deposition (CVD) method. The base insulating layer 107 may contain silicon oxide.

A base electrode layer 108 serving as the base of each gate electrode layer 33 is then formed on the base insulating layer 107. The base electrode layer 108 may be formed by a CVD method. The base electrode layer 108 may contain polysilicon.

An upper surface base insulating layer 109 serving as the base of each upper surface insulating layer 79 is then formed on the base electrode layer 108. The upper surface base insulating layer 109 may be formed by the CVD method. The upper surface base insulating layer 109 may contain silicon nitride.

Referring to FIG. 21F, a resist mask 110 having a predetermined pattern is then formed on the upper surface base insulating layer 109. The resist mask 110 selectively covers regions in which the gate electrode layers 33 should be formed.

Referring to FIG. 21G, unnecessary portions of the upper surface base insulating layer 109 and unnecessary portions of the base electrode layer 108 are then removed. The unnecessary portions of the upper surface base insulating layer 109 and the unnecessary portions of the base electrode layer 108 may be removed by an etching method through the resist mask 110. The etching method may be a dry etching method such as a reactive ion etching (RIE) method. This step forms the gate electrode layers 33 and the upper surface insulating layers 79.

Referring to FIG. 21H, unnecessary portions of the upper surface base insulating layer 109 are then removed. The unnecessary portions of the upper surface base insulating layer 109 may be removed by an etching method through the resist mask 110. The etching method may be a dry etching method such as an RIE method. This step forms the gate insulating layers 32.

Referring to FIG. 21I, surface layer portions of the first main surface 3 of the semiconductor layer 2 which are exposed from the gate insulating layers 32 are selectively removed. Unnecessary portions of the first main surface 3 of the semiconductor layer 2 may be removed by an etching method through the resist mask 110. The etching method may be a dry etching method such as an RIE method.

The unnecessary portions of the first main surface 3 of the semiconductor layer 2 may be removed until regions whose n-type impurity concentrations become peak values (maximal values) are exposed in the n⁺-type source regions 26. The unnecessary portions of the first main surface 3 of the semiconductor layer 2 may be removed until regions whose n-type impurity concentrations become peak values (maximal values) are exposed in the p⁺-type contact regions 27.

In this step, regions located directly below the gate electrode layers 33 in the surface layer portions of the first main surface 3 of the semiconductor layer 2 are removed together with the gate insulating layers 32. This forms the recess portions 71 and simultaneously forms the gate electrode layers 33 including the main body portions 76 and the overhanging portions 77 on the gate insulating layers 32.

Moreover, in this step, owing to the effect of dry etching, the surface roughness Zr of the bottom wall 73 of the recess portion 71 becomes equal to or more than the surface roughness Zs of the first main surface 3 of the semiconductor layer 2 (Zr Zs).

The structure of each recess portion 71 and the structure of each gate electrode layer 33 are the same as those described above, and hence a detailed description of the structures will be omitted. After the recess portions 71 are formed, the resist mask 110 is removed.

Subsequently, referring to FIG. 21J, the insulating film 81 is formed on the first main surface 3 of the semiconductor layer 2. The insulating film 81 may be formed by the CVD method. The insulating film 81 may contain undoped silica glass (USG). The insulating film 81 is formed so as to fill the space between the overhanging portions 77 of the gate electrode layers 33 and the bottom walls 73 of the recess portions 71 and cover the gate electrode layers 33.

Referring to FIG. 21K, an insulating film 82 is then formed on an insulating film 81. The insulating film 82 may be formed by the CVD method. The insulating film 82 contains an insulating material having properties different from those of the insulating material of the insulating film 81. The insulating film 82 may contain phosphosilicate glass (PSG). Each insulating layer 34 is formed from the insulating film 81 and the insulating film 82.

Referring to FIG. 21L, a resist mask 111 having a predetermined pattern is then formed on the insulating film 82. The resist mask 111 selectively exposes regions in which contact holes (not shown) for the gate electrodes 10 and the contact holes 35 for the source electrodes 11 should be formed.

Referring to FIG. 21M, unnecessary portions of the insulating film 82 and unnecessary portions of the insulating film 81 are then removed. The unnecessary portions of the insulating film 82 and the unnecessary portions of the insulating film 81 are removed by an etching method through the resist mask 111.

The etching method may be a dry etching method such as the RIE method. This step forms contact holes (not shown) for the gate electrodes 10 and the contact holes 35 for the source electrodes 11.

Referring to FIG. 21N, a heat treatment method is then executed for the insulating film 81 and the insulating film 82. This improves the film forming properties and strengths of the insulating film 81 and the insulating film 82.

At the same time, corner portions of the insulating film 81 and the insulating film 82 are rounded. The specific shapes of the insulating film 81 and the insulating film 82 are the same as those described above, and hence a description of the shapes will be omitted.

Referring to FIG. 21O, the electrode layer 91 serving as the basses of the gate electrodes 10 and the source electrodes 11 is then formed on the first main surface 3 of the semiconductor layer 2. In the step of forming the electrode layer 91, first of all, the first barrier electrode film 93 containing Ti is formed (see also FIG. 19).

The first barrier electrode film 93 may be formed by a sputtering method. The first barrier electrode film 93 is formed in the form of a film along the first main surface 3 (bottom walls 73 of the recess portions 71) of the semiconductor layer 2 and the outer surface of the insulating layers 34.

The second barrier electrode film 94 containing TiN is then formed on the first barrier electrode film 93 (see also FIG. 19). The second barrier electrode film 94 may be formed by the sputtering method. The second barrier electrode film 94 is formed in the form of a film along the surface of the first barrier electrode film 93.

Referring to FIG. 21P, the electrode layer 92 serving as the bases of the gate electrodes 10 and the source electrodes 11 is then formed on the electrode layer 91. The electrode layer 92 may contain aluminum. The electrode layer 92 may be formed by an electrolytic plating method (more specifically, an electrolytic aluminum plating method).

The electrode layer 91 and the electrode layer 92 are collectively patterned into the gate electrodes 10 and the source electrodes 11. Thereafter, the drain electrode 23 is formed on the second main surface 4 of the semiconductor layer 2. The semiconductor device 61 is formed through the above steps.

Figure 22:
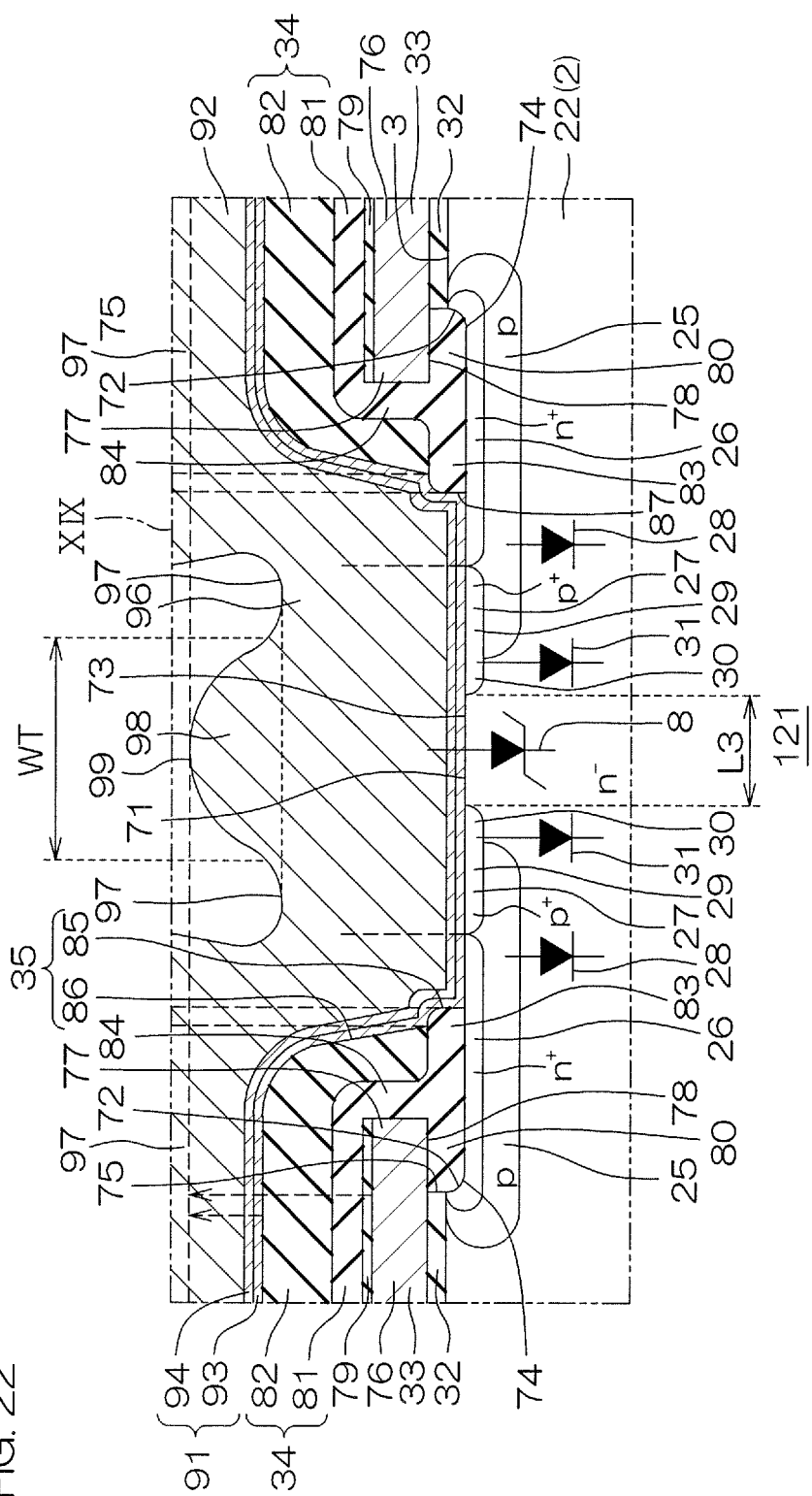
FIG. 22 is a sectional view of a portion corresponding to FIG. 19, showing a semiconductor device according to the fifth preferred embodiment of the present invention.

FIG. 22 is a sectional view of a portion corresponding to FIG. 19, showing a semiconductor device 121 according to the fifth preferred embodiment of the present invention. In the following, the same reference numerals of the constituent elements of the structure of the semiconductor device 61, which have been described above, denote the same constituent elements of a corresponding structure, and a description of the structure will be omitted.

Referring to FIG. 22, each $p^+$-type contact region 27 includes the first region 29 and the second region 30 like the semiconductor device 1. The first region 29 of the $p^+$-type contact region 27 is formed in the p-type well region 25. The second region 30 of the $p^+$-type contact region 27 is drawn out from the first region 29 into the $n^-$-type diode region 24.

In this preferred embodiment, each $n^-$-type diode region 24 is defined by the second region 30 of the $p^+$-type contact region 27. Accordingly, the length L3 of one side and the length L4 of one side of the $n^-$-type diode region 24 each are a size of a region surrounded by the second region 30 of the $p^+$-type contact region 27.

The second region 30 of each $p^+$-type contact region 27 crosses the boundary region between the p-type well region 25 and the $n^-$-type diode region 24. The second region 30 of the $p^+$-type contact region 27 forms a p-n junction portion with the $n^-$-type diode region 24. This p-n junction portion forms the second diode 31 having the $p^+$-type contact region 27 as an anode and the $n^-$-type diode region 24 (drain electrode 23) as a cathode.

In this preferred embodiment, the JBS structure of each unit cell 15 includes the second p-n junction portion formed between the $n^-$-type diode region 24 and the second region 30 of the $p^+$-type contact region 27 in addition to the first p-n junction portion formed between the $n^-$-type diode region 24 and the p-type well region 25.

As described above, according to the semiconductor device 121, the unit cell 15 has a JBS structure including the first p-n junction portion and the second p-n junction portion. Accordingly, a first depletion layer extending from the first p-n junction portion can suppress concentration of currents and electric fields in the $n^-$-type diode region 24. In addition, a second depletion layer extending from the second p-n junction portion can also suppress concentration of currents and electric fields in the $n^-$-type diode region 24.

In particular, the second p-n junction portion is formed in the boundary region between the $n^-$-type diode region 24 and the second region 30 of the $p^+$-type contact region 27.

This can reliably make the second depletion layer extend from the second p-n junction portion. This makes it possible to properly suppress concentration of currents and electric fields in the n⁻-type diode region 24.

Figure 23:
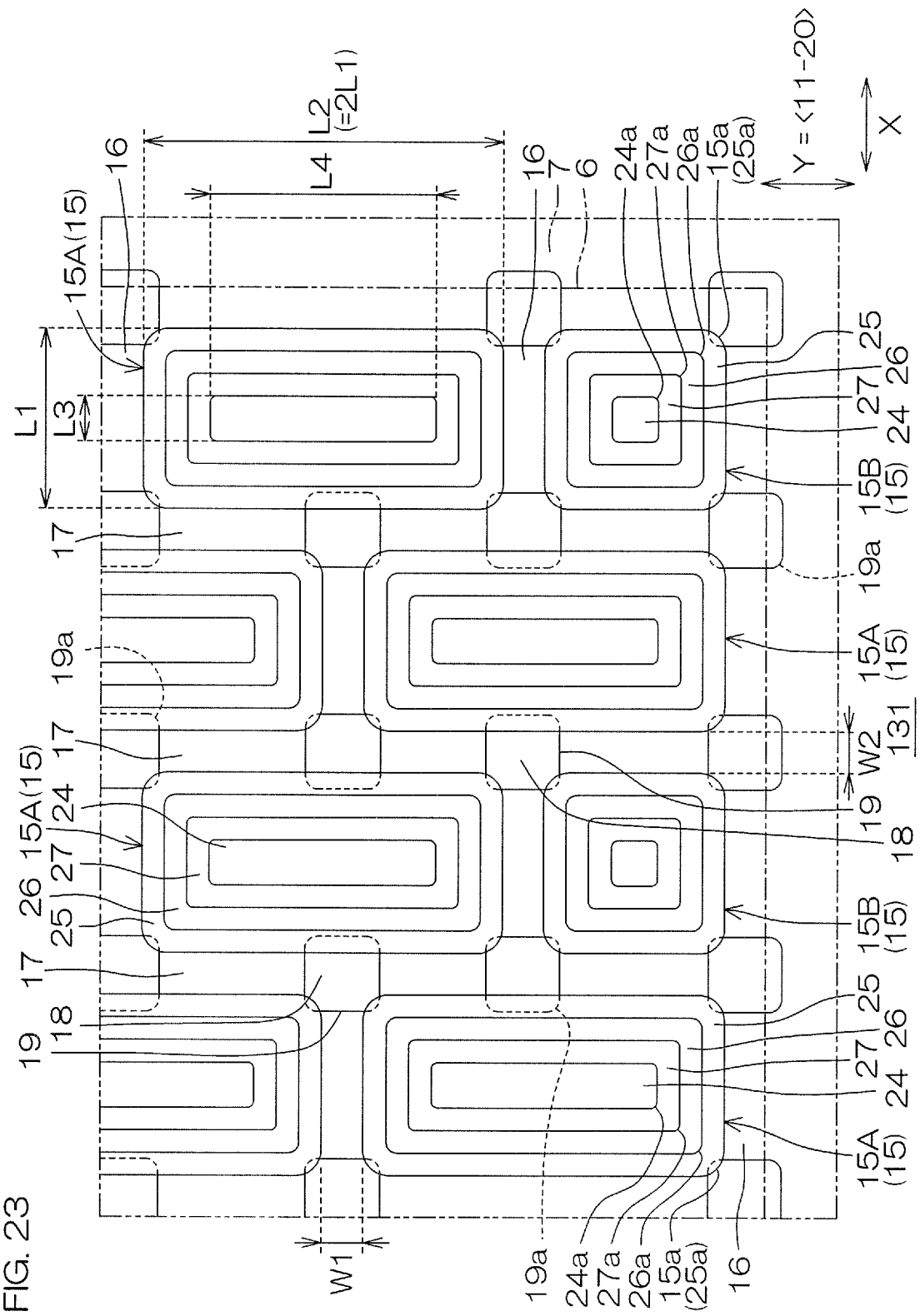
FIG. 23 is a plan view showing a portion of a device formation region of a semiconductor device according to the sixth preferred embodiment of the present invention.

FIG. 23 is a plan view showing a portion of the device formation region 6 of a semiconductor device 131 according to the sixth preferred embodiment of the present invention. In the following, the same reference numerals of the constituent elements of the structure of the semiconductor device 61, which have been described above, denote the same constituent elements of a corresponding structure, and a description of the structure will be omitted.

As shown in FIG. 23, in this preferred embodiment, a plurality of unit cells 15 include a plurality of unit cells 15A each having a relatively large aspect ratio L2/L1 and a plurality of unit cells 15B each having a relatively small aspect ratio L2/L1.

The plurality of unit cells 15A each extend in a strip shape along the second direction Y, that is, the <11-20> direction. The aspect ratio L2/L1 of each of the plurality of unit cells 15A is "2." That is, the unit cells 15 shown in FIG. 11 are used as the plurality of unit cells 15A.

Such a structure can suppress local electric field concentration on each unit cell 15A, and hence is effective in suppressing a reduction in the breakdown voltage of the semiconductor device 1. The plurality of unit cells 15A are arrayed in a staggered pattern in plan view instead of a matrix pattern in plan view.

The aspect ratio L2/L1 of each of the unit cells 15B is less than "2." The plurality of unit cells 15B are formed along the peripheral edge of a device formation region 6. The plurality of unit cells 15B may be formed in a region defined by the peripheral edge of the device formation region 6 and the plurality of unit cells 15A.

As described above, the semiconductor device 131 can also obtain the same effects as those described with reference to the semiconductor device 61. In addition, the plurality of unit cells 15B are formed in the regions defined by the peripheral edge of the device formation region 6 and the plurality of unit cells 15A. This allows the plurality of unit cells 15A and 15B to be formed in the device formation region 6 without any waste, and hence can properly increase current paths.

Figure 24:
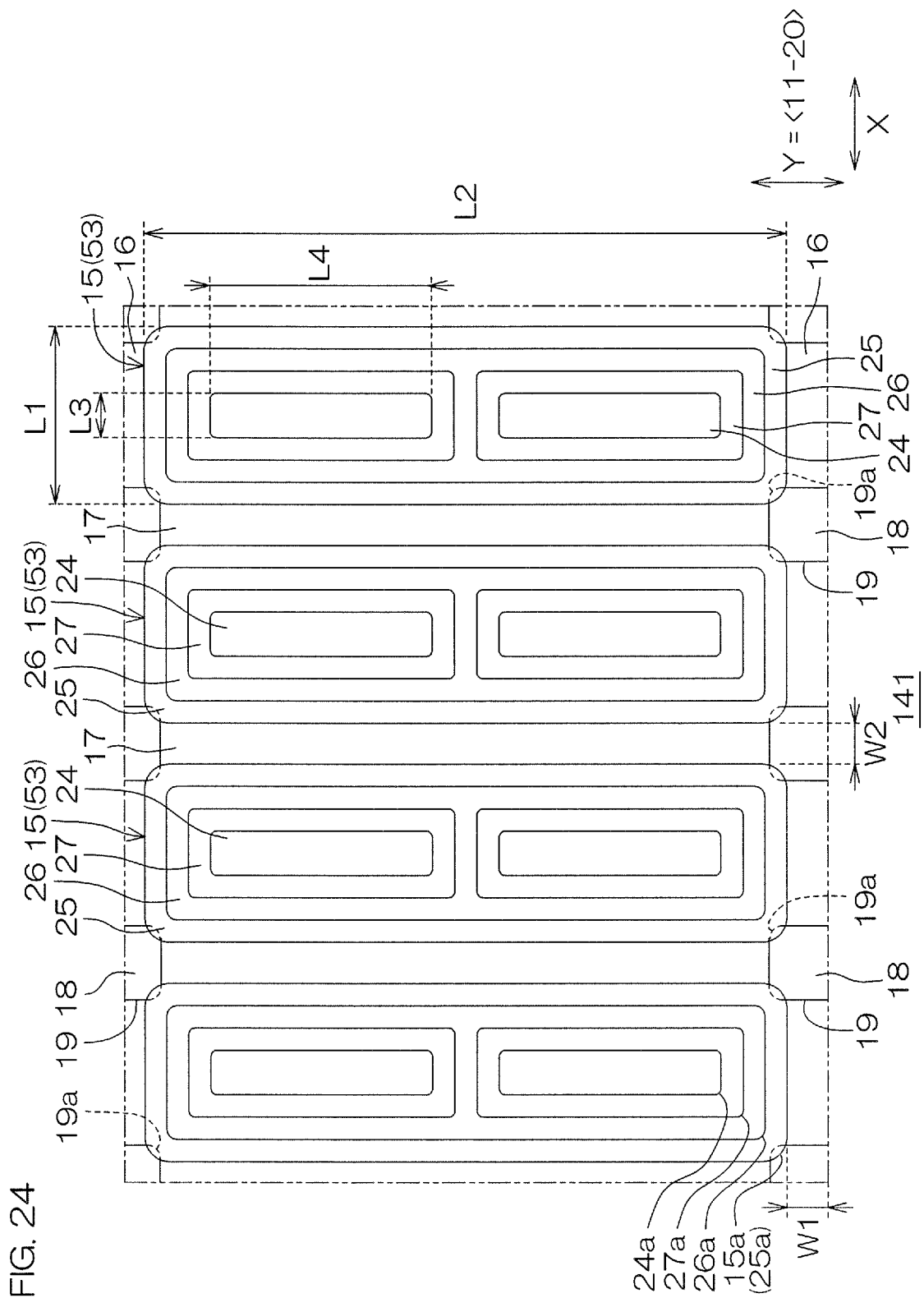
FIG. 24 is a plan view showing a portion of a device formation region of a semiconductor device according to the seventh preferred embodiment of the present invention.

FIG. 24 is a plan view showing a portion of a device formation region 6 of a semiconductor device 141 according to the seventh preferred embodiment of the present invention. In the following, the same reference numerals of the constituent elements of the structure of the semiconductor device 61, which have been described above, denote the same constituent elements of a corresponding structure, and a description of the structure will be omitted.

As shown in FIG. 24, a plurality of unit cells 15 are arrayed along the second direction Y, that is, the <11-20> direction so as to be connected to each other. This makes a plurality of (two or more) unit cells 15 form one linear cell 53 extending in a strip shape along the second direction Y.

The plurality of linear cells 53 may be arrayed at intervals along the first direction X. FIG. 14 shows a structure using the unit cells 15 shown in FIG. 11, with the aspect ratio L2/L1 being "2." This structure can suppress local electric field concentration on the linear cell 53 and hence is effective in suppressing a reduction in the breakdown voltage of the semiconductor device 1.

A p-type well region 25 of one and/or the other of the unit cells 15 adjacent to each other along the second direction Y is interposed between a plurality of n⁻-type diode regions 24 adjacent to each other along the second direction Y. Each linear cell 53 has a structure in which the plurality of n⁻-type diode regions 24 are arrayed at intervals along the second direction Y.

As described above, the semiconductor device 141 can also obtain the same effects as those described with reference to the semiconductor device 61.

Figure 25:
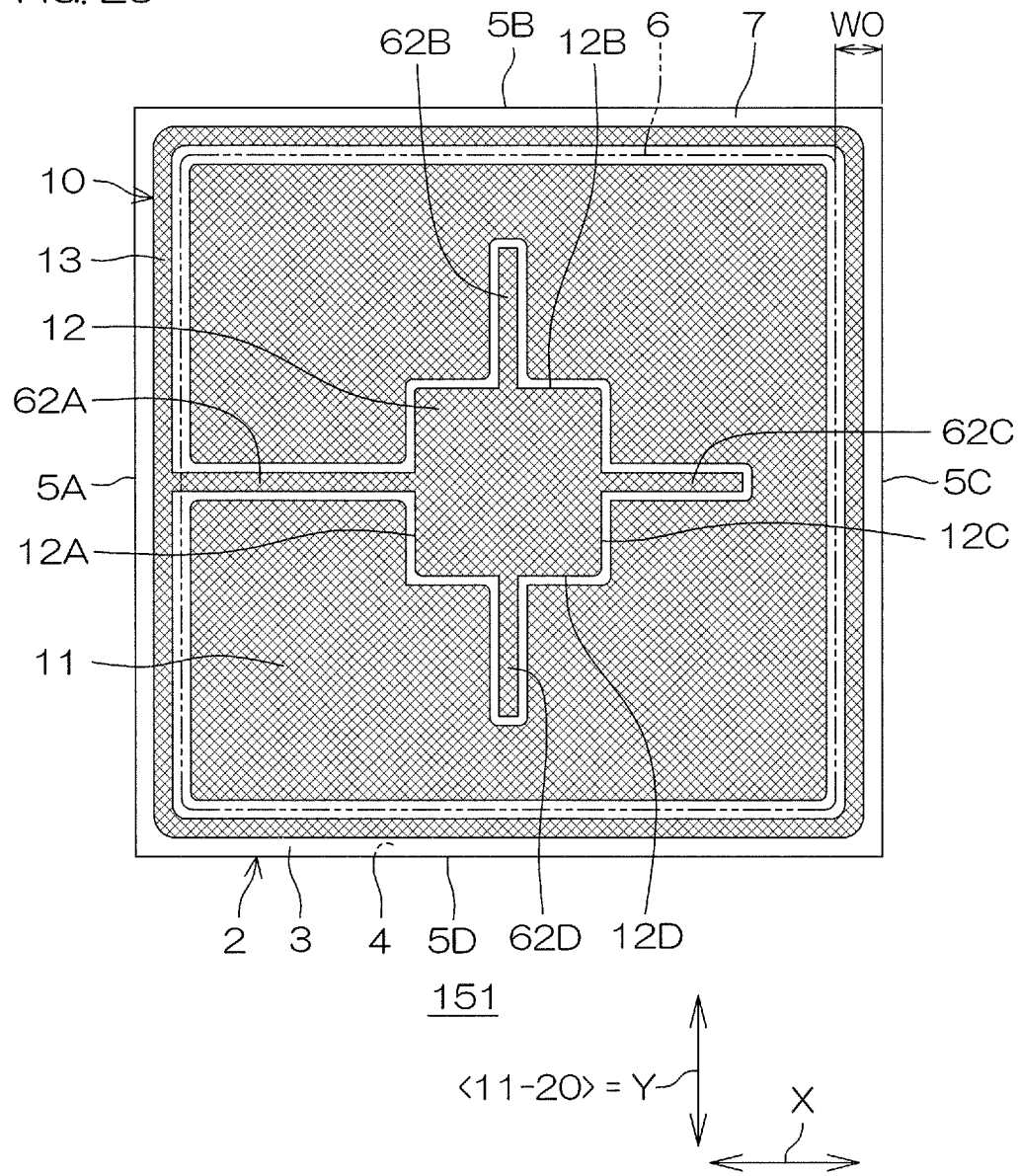
FIG. 25 is a plan view of a semiconductor device according to the eighth preferred embodiment of the present invention.

FIG. 25 is a plan view of a semiconductor device 151 according to the eighth preferred embodiment of the present invention. In the following, the same reference numerals of the constituent elements of the structure of the semiconductor device 61, which have been described above, denote the same constituent elements of a corresponding structure, and a description of the structure will be omitted.

Referring to FIG. 25, in the semiconductor device 151, a gate electrode 10 includes a gate pad 12, a gate finger 13, and a plurality of (four in this preferred embodiment) gate lines 62A, 62B, 62C, and 62D.

The gate pad 12 is formed on a central portion of the first main surface 3 of the semiconductor layer 2 in plan view. In this preferred embodiment, the gate pad 12 is formed in a quadrilateral shape having four side surfaces 12A, 12B, 12C, and 12D parallel to side surfaces 5A, 5B, 5C, and 5D of the semiconductor layer 2 in plan view.

The gate finger 13 is formed in a strip shape so as to extend along the peripheral edge of a device formation region 6 in an outer region 7. In this preferred embodiment, the gate finger 13 is formed in an endless shape (quadrilateral ring shape) surrounding the device formation region 6 in plan view. The gate finger 13 may be formed to partition the device formation region 6 from three directions.

The respective gate lines 62A to 62D are drawn out from the corresponding side surfaces 12A to 12D of the gate pad 12 toward the side surfaces 5A to 5D of the semiconductor layer 2. Each of the plurality of gate lines 62A to 62D is formed in a strip shape linearly extending to a corresponding one of the side surfaces 5A to 5D of the semiconductor layer 2.

More specifically, the plurality of gate lines 62A to 62D include the gate line 62A drawn out from the side surface 12A of the gate pad 12, the gate line 62B drawn out from the side surface 12B of the gate pad 12, the gate line 62C drawn out from the side surface 12C of the gate pad 12, and the gate line 62D drawn out from the side surface 12D of the gate pad 12.

In this preferred embodiment, of the plurality of gate lines 62A to 62D, the gate line 62A is connected to the gate finger 13. With this structure, in plan view, a C-shaped region is defined by the inner edge of the gate electrode 10 in the device formation region 6.

The source electrode 11 is formed into the C-shaped region by being partitioned by the inner edge of the gate electrode 10. In this preferred embodiment, the source electrode 11 is formed in a C shape along the inner edge of the gate electrode 10.

Figure 26:
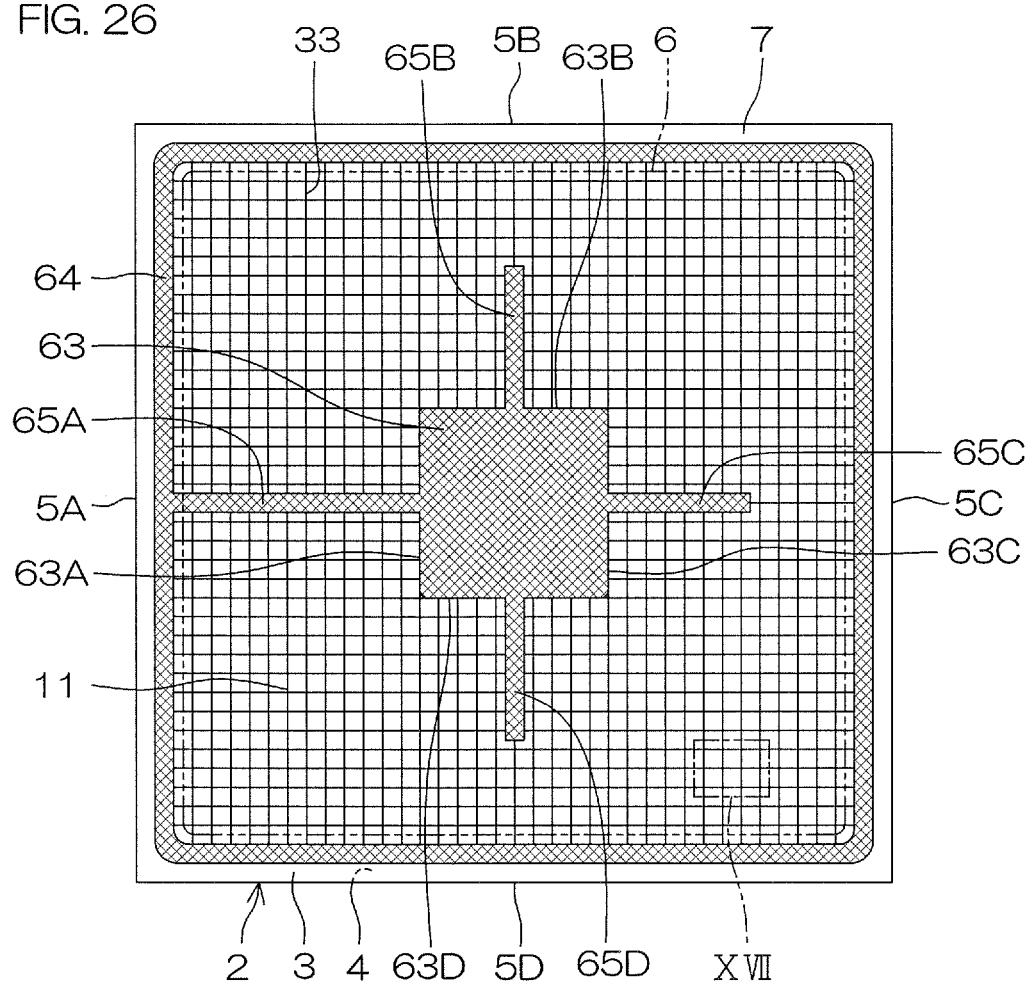
FIG. 26 is a plan view corresponding to FIG. 25, except that a surface electrode is removed, which is for explaining a structure on the first main surface of a semiconductor layer.

FIG. 26 is a plan view corresponding to FIG. 25, except that the gate electrode 10 and the surface electrode 11 are removed, which is for explaining a structure on the first main surface 3 of a semiconductor layer 2.

A gate pad layer 63, a gate finger layer 64, and a plurality of (four in this preferred embodiment) gate line layers 65A, 65B, 65C and 65D are formed on the first main surface 3 of the semiconductor layer 2.

The gate pad layer 63 is formed in a region directly below the gate pad 12. The gate pad layer 63 is electrically connected to the gate pad 12. Although not shown, the gate pad 12 is electrically connected to the gate pad layer 63 via a contact hole formed in the insulating layer 34.

The gate pad layer 63 is formed on a central portion of the first main surface 3 of the semiconductor layer 2 in plan view. In this preferred embodiment, the gate pad layer 63 is set in a quadrilateral shape having four side surfaces 63A, 63B, 63C, and 63D parallel to the side surfaces 5A to 5D of the semiconductor layer 2 in plan view.

The gate finger layer 64 is formed in a region directly below the gate finger 13. The gate finger layer 64 is electrically connected to the gate finger 13. Although not shown, the gate finger 13 is electrically connected to the gate finger layer 64 via a contact hole formed in the insulating layer 34.

The gate finger layer 64 is drawn out in a strip shape from the gate pad layer 63 so as to extend along the peripheral edge of the device formation region 6. In this preferred embodiment, the gate finger layer 64 is formed in an endless shape (quadrilateral ring shape) surrounding the device formation region 6 in plan view. The gate finger layer 64 may be formed to partition the device formation region 6 from three directions.

The plurality of gate line layers 65A to 65D are respectively formed in regions directly below the plurality of gate lines 62A to 62D. The plurality of gate line layers 65A to 65D are electrically connected to the corresponding gate lines 62A to 62D. Although not shown, the gate lines 62A to 62D are electrically connected to the gate line layers 65A to 65D via a contact hole formed in the insulating layer 34.

The respective gate layers 65A to 65D are drawn out from the corresponding side surfaces 63A to 63D of the gate pad layer 63 toward the side surfaces 5A to 5D of the semiconductor layer 2. Each of the plurality of gate line layers 65A to 65D is formed in a strip shape linearly extending to a corresponding one of the side surfaces 5A to 5D of the semiconductor layer 2.

More specifically, the plurality of gate line layers 65A to 65D include the gate line layer 65A drawn out from the side surface 63A of the gate pad layer 63, the gate line layer 65B drawn out from the side surface 63B of the gate pad layer 63, the gate line layer 65C drawn out from the side surface 63C of the gate pad layer 63, and the gate line layer 65D drawn out from the side surface 63D of the gate pad layer 63.

In this preferred embodiment, of the plurality of gate line layers 65A to 65D, the gate line layer 65A is connected to the gate finger layer 64. With this structure, in plan view, a C-shaped region is defined by the inner edge of the gate electrode 10 in the device formation region 6.

The gate electrode layer 33 (planar gate structure) is formed in the C-shaped region defined by the gate pad layer 63, the gate finger layer 64, and the plurality of gate line layers 65A to 65D.

The gate electrode layers 33 are formed in a lattice pattern in plan view. FIG. 26 shows the gate electrode layers 33 by lines in a lattice pattern. The gate electrode layers 33 are drawn out from the gate pad layer 63, the gate finger layer 64, and the plurality of gate line layer 65A to 65D.

With this structure, the gate electrode layers 33 are electrically connected to the gate pad layer 12, the gate finger 13, and the plurality of gate lines 62A to 62D via the gate pad layer 63, the gate finger layer 64, and the plurality of gate line layers 65A to 65D.

As described above, the semiconductor device 151 can also obtain the same effects as those described with reference to the semiconductor device 61.

Figure 27:
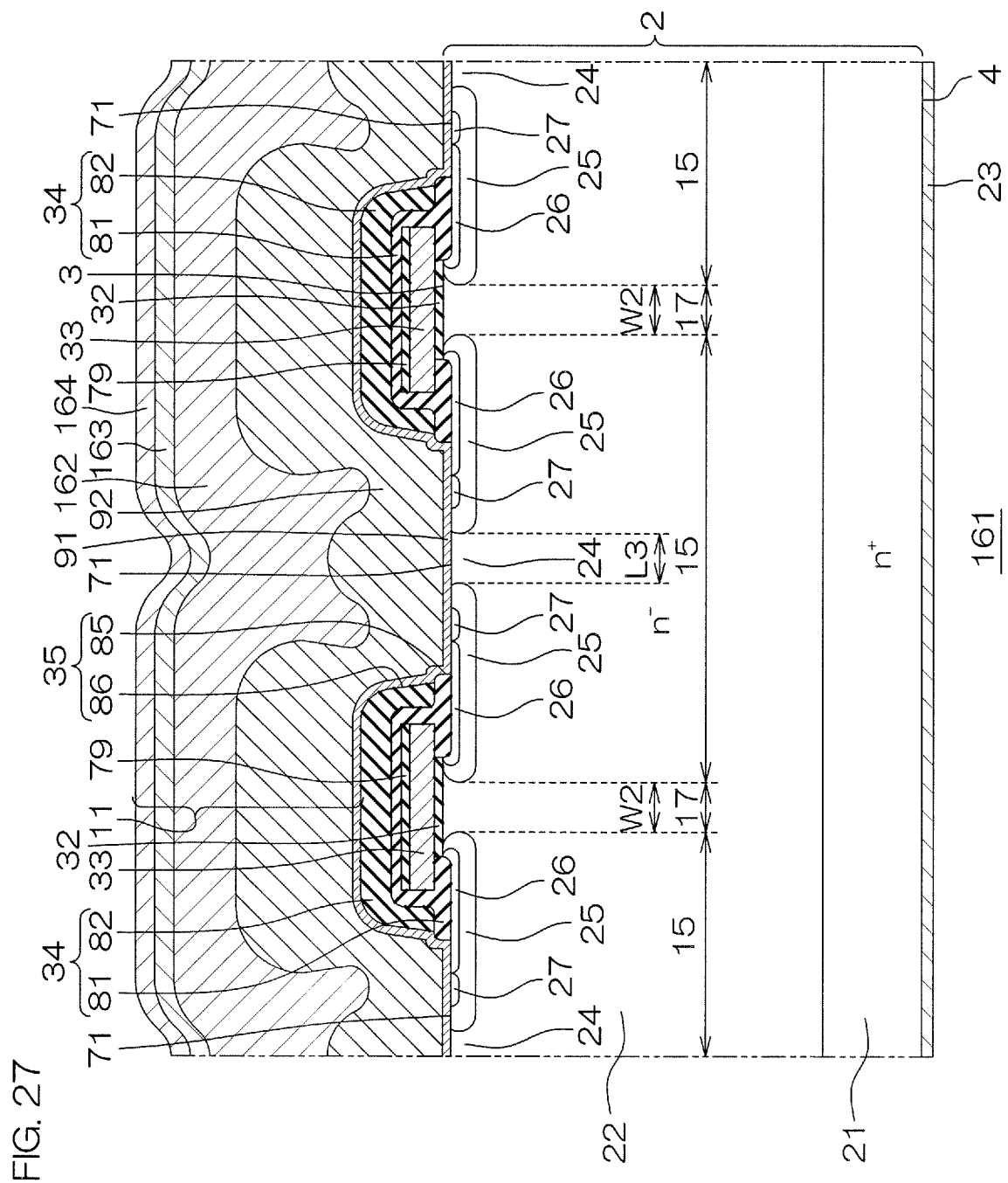
FIG. 27 is a sectional view of a portion corresponding to FIG. 18, showing a semiconductor device according to the ninth preferred embodiment of the present invention.

FIG. 27 is a sectional view of a portion corresponding to FIG. 18, showing a semiconductor device 161 according to the ninth preferred embodiment of the present invention. In the following, the same reference numerals of the constituent elements of the structure of the semiconductor device 61, which have been described above, denote the same constituent elements of a corresponding structure, and a description of the structure will be omitted.

Referring to FIG. 27, in this preferred embodiment, a source electrode 11 includes a nickel layer 162, a gold layer 163, and a solder layer 164 stacked on an electrode layer 92 in the order named. A palladium layer may be provided in the region between the gold layer 163 and the solder layer 164.

Although not shown, like the source electrode 11, a gate electrode 10 also includes a nickel layer 162, a gold layer 163, and a solder layer 164 stacked on the electrode layer 92 in the order named. A palladium layer may be provided in the region between the gold layer 163 and the solder layer 164.

As described above, the semiconductor device 161 can also obtain the same effects as those described with reference to the semiconductor device 61.

According to the semiconductor device 161, the gate electrode 10 and the source electrode 11 each include the solder layer 164. This makes it possible to mount the semiconductor device 161 on a connection target while a first main surface 3 of a semiconductor layer 2 faces the connection target.

Figure 28:
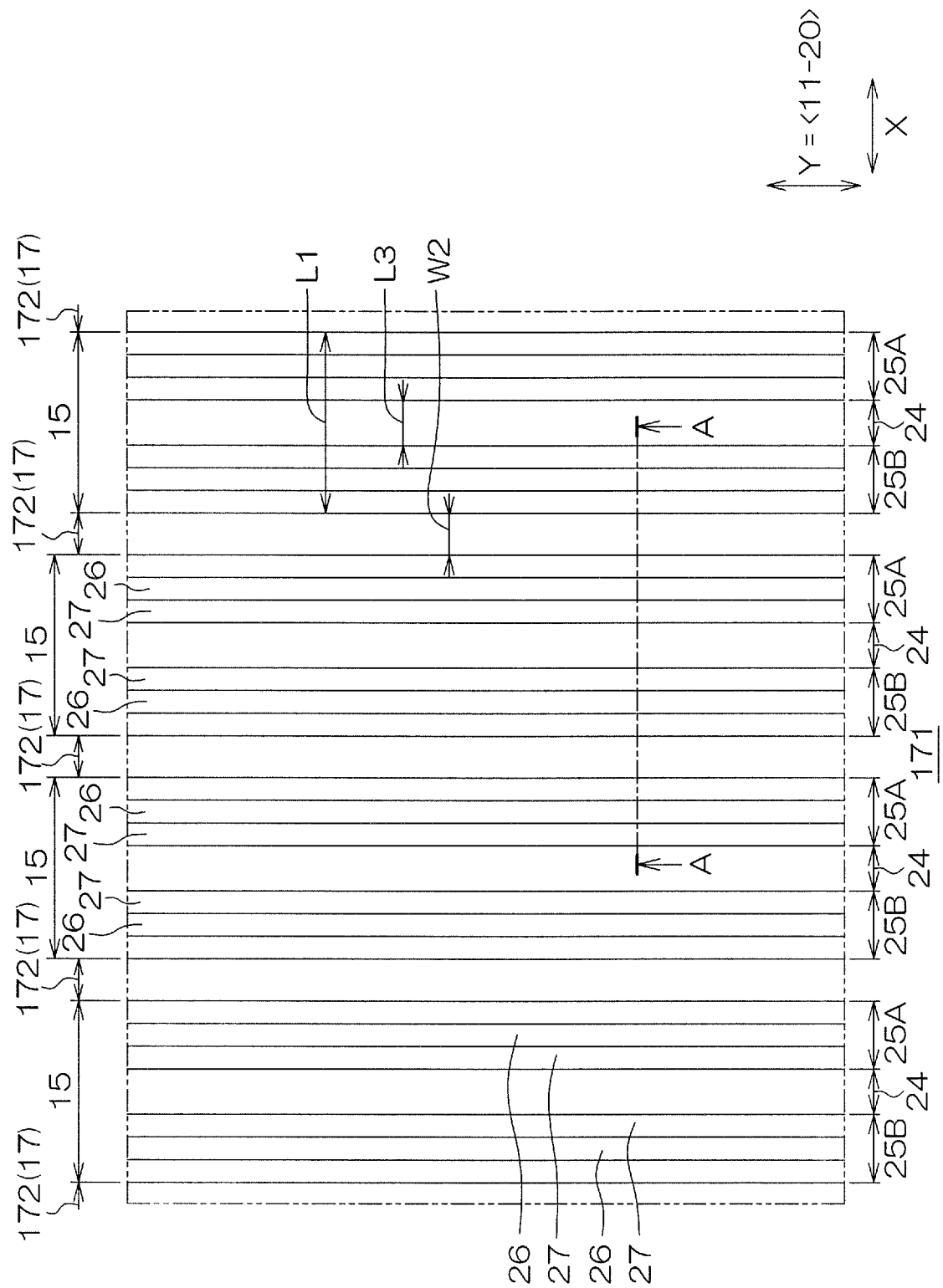
FIG. 28 is a plan view showing a portion of a device formation region of a semiconductor device according to the tenth preferred embodiment of the present invention.

FIG. 28 is a plan view showing a portion of a device formation region 6 of a semiconductor device 171 according to the tenth preferred embodiment of the present invention. A sectional view taken along line A-A in FIG. 28 corresponds to the sectional view shown in FIG. 18. In the following, the same reference numerals of the constituent elements of the structure of the semiconductor device 61, which have been described above, denote the same constituent elements of a corresponding structure, and a description of the structure will be omitted.

Referring to FIG. 28, in this preferred embodiment, each unit cell 15 is formed in a strip shape with ends extending along the second direction Y. In the preferred embodiment, a plurality of unit cells 15 are formed at intervals along the first direction X.

With this structure, the plurality of unit cells 15 are formed in a strip pattern in plan view. Regions between the plurality of unit cells 15 adjacent to each other are defined by line portions 172 extending along the second direction Y. The line portions 172 correspond to the second line portions 17 of the semiconductor device 61 (see also FIG. 17).

Like the semiconductor device 61, each unit cell 15 includes an $n^-$-type diode region 24, a p-type well region 25, an $n^+$-type source region 26, and a $p^+$-type contact region 27. The $n^-$-type diode region 24, the p-type well region 25, the $n^+$-type source region 26, and the $p^+$-type contact region 27 each extend in a strip shape with ends along the second direction Y in plan view.

In this preferred embodiment, each p-type well region 25 includes a p-type well region 25A on one side and a p-type well region 25B on the other side. The p-type well region 25A on the one side extends in a strip shape with ends along one end portion of the $n^-$-type diode region 24 which is located on the first direction X side.

The p-type well region 25B on the other side extends in a strip shape with ends along the other end portion of the $n^-$-type diode region 24 which is located on the first direction X side. In this preferred embodiment, the $n^-$-type diode region 24 is defined by the p-type well region 25A on the one side and the p-type well region 25B on the other side.

The $n^+$-type source region 26 is formed in a surface layer portion of each p-type well region 25. The $n^+$-type source region 26 is formed at distances from the inner peripheral edge and outer peripheral edge of the p-type well region 25. The n+-type source region 26 is formed in a strip shape with ends along the p-type well region 25 in plan view.

The p+-type contact region 27 is formed in the surface layer portion of the p-type well region 25. The p+-type contact region 27 is formed in the region between the n−-type diode region 24 and the n+-type source region 26 in the surface layer portion of the p-type well region 25. In this preferred embodiment, the p+-type contact region 27 extends in a strip shape with ends along the p-type well region 25 in plan view.

As described above, the semiconductor device 171 can also obtain the same effects as those described with reference to the semiconductor device 61.

In the semiconductor device 171, in adjusting electrical properties such as breakdown voltage, the width of each unit cell 15 in the first direction X can be adjusted. In contrast to this, in the semiconductor device 61, in adjusting electrical properties, both the widths of each unit cell 15 along the first direction X and the second direction Y can be finely adjusted. Accordingly, it can be said that the semiconductor device 61 has a higher degree of freedom in design than the semiconductor device 171.

The structure of the semiconductor device 121 described above (see FIG. 22) may be applied to the semiconductor device 171. That is, the p+-type contact region 27 including the first region 29 and the second region 30 may be applied to the semiconductor device 171.

Although preferred embodiments of the present invention have been described above, the present invention can further be carried out in other preferred embodiments.

In each preferred embodiment described above, each unit cell 15 may be formed in a polygonal shape such as a triangular shape, hexagonal shape, or octagonal shape in plan view. In addition, in each preferred embodiment described above, each unit cell 15 may be formed in a circular shape or elliptic shape in plan view.

In each preferred embodiment described above, each n−-type diode region 24 may be formed in a polygonal shape such as a triangular shape, hexagonal shape, or octagonal shape in plan view. In addition, in each preferred embodiment described above, each n−-type diode region 24 may be formed in a circular shape or elliptic shape in plan view.

In each preferred embodiment described above, each impurity region 19 may include a crystal defect region including crystal defects selectively introduced into the semiconductor layer 2 (n−-type epitaxial layer 22). Crystal defects may include lattice defects typified by interstitial atoms, atomic vacancies, and the like.

Each crystal defect region may have a crystal defect density N2 higher than an n-type impurity density N1 of the n−-type epitaxial layer 22 (n-type impurity density N1<crystal defect density N2).

In each preferred embodiment described above, each impurity region 19 may include a high-resistance region. The high-resistance region may have a specific resistance ρ2 higher than a specific resistance ρ1 of the semiconductor layer 2 (n−-type epitaxial layer 22) (specific resistance ρ1<specific resistance ρ2). The high-resistance region may be formed by a crystal defect region containing crystal defects selectively introduced into the semiconductor layer 2 (n−-type epitaxial layer 22).

Each preferred embodiment described above may adopt the semiconductor layer 2 having a structure in which no impurity region 19 is formed in each intersecting portion 18.

Each preferred embodiment described above may use the n+-type semiconductor substrate 21 formed from silicon (Si) instead of a wide band gap semiconductor.

Each preferred embodiment described above may use the n−-type epitaxial layer 22 formed from silicon (Si) instead of a wide band gap semiconductor.

In each preferred embodiment described above, the semiconductor layer 2 may include an n−-type semiconductor substrate manufactured by the FZ method. In this case, each high-resistance region (drift region) corresponding to the n−-type epitaxial layer 22 described above is formed from the n−-type semiconductor substrate. In addition, each low-resistance region (drain region) corresponding to the n+-type semiconductor substrate described above is formed by implanting an n-type impurity into the second main surface 4 of the semiconductor layer 2.

In each preferred embodiment described above, the first direction X and the second direction Y are not limited to directions along the side surfaces 5A to 5D of the semiconductor layer 2. For example, in each preferred embodiment described above, the relationship between the first direction X and the second direction Y may be inverted. That is, the first direction X may be set to the <11-20> direction, and the second direction Y may be set to a direction perpendicular to the <11-20> direction.

In this case, the plurality of unit cells 15 are preferably arrayed at intervals along the <11-20> direction. In addition, when each unit cell 15 is formed in a rectangular shape in plan view, each unit cell 15 is preferably formed in a rectangular shape extending along the <11-20> direction.

Moreover, in each preferred embodiment, the first direction X and the second direction Y may be directions along diagonal directions of the semiconductor layer 2. In this case as well, the plurality of unit cells 15 are preferably arrayed at intervals along the <11-20> direction. In addition, when each unit cell 15 is formed in a rectangular shape in plan view, each unit cell 15 is preferably formed in a rectangular shape extending along the <11-20> direction.

Each preferred embodiment described above may adopt a trench gate structure instead of the planar gate structure. Each trench gate structure may be formed along the first line portion 16 and the second line portion 17 so as to define the unit cell 15.

The trench gate structure may include the gate electrode layer 33 buried in the gate trench formed in a surface layer portion of the first main surface 3 of the semiconductor layer 2 with the gate insulating layer 32 being interposed between them. A side wall of the gate trench may be formed perpendicular to the first main surface 3 of the semiconductor layer 2. The gate trench may be formed into a tapered shape in sectional view, which has a larger opening area than a bottom wall area.

The gate insulating layer 32 may be formed along a side wall and the bottom wall of the gate trench so as to define a concave space in the gate trench. The gate electrode layer 33 may be buried in the concave space defined by the gate insulating layer 32.

A portion of the n−-type epitaxial layer 22, the p-type well region 25, and the n+-type source region 26 may be formed so as to face the gate electrode layer 33 through the gate insulating layer 32. In this case, in the p-type well region 25, a portion sandwiched by the portion of the n−-type epitaxial layer 22 and the n+-type source region 26 is the channel of the MISFET 9.

As described above, even a structure using a trench gate structure can obtain the same effects as those described in each preferred embodiment described above.

Each preferred embodiment described above may adopt a p+-type semiconductor substrate instead of the n+-type semiconductor substrate 21. That is, in each preferred embodiment described above, an insulated gate bipolar transistor (IGBT) as an example of an insulated gate type transistor may be formed instead of the MISFET 9.

In this case, the "source" of the MISFET 9 is read as the "emitter" of the IGBT. In addition, the "drain" of the MISFET 9 is read as the "collector" of the IGBT.

The present application corresponds to Japanese Patent Application No. 2017-011609 filed in the Japanese Patent Office on Jan. 25, 2017, and the entire disclosure of the application is incorporated herein by reference.

While preferred embodiments of the present invention have been described in detail above, these are merely specific examples used to clarify the technical contents of the present invention and the present invention should not be interpreted as being limited to those specific examples, and the scope of the present invention is to be limited only by the appended claims.

REFERENCE SIGNS LIST

1: Semiconductor device
2: Semiconductor layer
3: First main surface of semiconductor layer
4: Second main surface of semiconductor layer
6: Device formation region
7: Outer region
8: SBD
9: MISFET
11: Source electrode (main surface electrode)
15: Unit cell
21: N+-type semiconductor substrate
22: N−-type epitaxial layer
24: N−-type diode region
25: P-type well region
26: N+-type source region (first conductivity type region)
27: P+-type contact region
32: Gate insulating layer
33: Gate electrode layer
51: Semiconductor device
52: Semiconductor device
60: Linear cell
61: Semiconductor device
121: Semiconductor device
131: Semiconductor device
141: Semiconductor device
151: Semiconductor device
161: Semiconductor device
L1: Length of unit cell
L2: Length of unit cell
SE: Plane area of first main surface of semiconductor layer
SF: Plane area of device formation region
SC: Plane area of unit cell
SD: Plane area of n−-type diode region

What is claimed is:

1. A semiconductor device comprising:
a semiconductor layer having a first main surface on one side and a second main surface on the other side;
a unit cell including a diode region of a first conductivity type formed in a surface layer portion of the first main surface, a well region of a second conductivity type formed in the surface layer portion of the first main surface along a peripheral edge of the diode region, and a first conductivity type region formed in a surface layer portion of the well region;
a gate electrode layer that faces the well region and the first conductivity type region across a gate insulating layer, and that has a side wall located on the first conductivity type region;
an insulating film that covers over the gate electrode layer; and
a first main surface electrode electrically connected to the diode region and the first conductivity type region on the first main surface, the first main surface electrode forming a Schottky junction with the diode region,
wherein the first main surface of the semiconductor layer includes a recessed portion that is formed in a region located at a side of the gate electrode layer such as to be recessed toward the second main surface and that exposes at least a part of the first conductivity type region,
the insulating film has a first portion that covers the recessed portion and extends along the recessed portion from the side wall of the gate electrode layer and a second portion that covers the side wall of the gate electrode layer and extends along the side wall of the gate electrode layer, and
a thickness of the first portion of the insulating film perpendicular to an extending direction of the first portion of the insulating film is greater than a thickness of the second portion of the insulating film perpendicular to an extending direction of the second portion of the insulating film.

2. The semiconductor device according to claim 1, wherein the well region forms a p-n junction portion with the diode region, and
the unit cell has a junction barrier Schottky (JBS) structure including the p-n junction portion formed between the well region and the diode region.

3. The semiconductor device according to claim 1, wherein the well region surrounds the diode region in plan view.

4. The semiconductor device according to claim 1, wherein the unit cell includes a contact region of the second conductivity type formed in a region between the diode region and the first conductivity type region in the surface layer portion of the well region and having a second conductivity type impurity concentration higher than a second conductivity type impurity concentration of the well region, and
the recessed portion exposes at least a part of the contact region together with at least the part of the first conductivity type region.

5. The semiconductor device according to claim 4, wherein the contact region forms a p-n junction portion with the diode region, and
the unit cell has a junction barrier Schottky (JBS) structure including the p-n junction portion formed between the contact region and the diode region.

6. The semiconductor device according to claim 1, wherein a plurality of the unit cells are formed in the surface layer portion of the first main surface, and
the gate electrode layer faces a portion of the well region of each the unit cell.

7. The semiconductor device according to claim 6, wherein the plurality of unit cells are arrayed in at least one of a matrix pattern or a staggered pattern at intervals in an arbitrary first direction and a second direction intersecting the first direction.

8. The semiconductor device according to claim 1, wherein the unit cell is formed as a linear cell extending in an arbitrary one direction.

9. The semiconductor device according to claim 1, wherein the semiconductor layer includes a semiconductor substrate that forms the second main surface and an epitaxial layer that is formed on the semiconductor substrate and forms the first main surface.

10. The semiconductor device according to claim 1, further comprising a second main surface electrode which covers the second main surface of the semiconductor layer.

11. A semiconductor device comprising:
a semiconductor layer having a first main surface on one side and a second main surface on the other side;
a unit cell including a diode region of a first conductivity type formed in a surface layer portion of the first main surface, a well region of a second conductivity type formed in the surface layer portion of the first main surface along a peripheral edge of the diode region, and a first conductivity type region formed in a surface layer portion of the well region;
a gate electrode layer that faces the well region and the first conductivity type region across a gate insulating layer, and that has a side wall located on the first conductivity type region;
an insulating layer that covers over the gate electrode layer; and
a first main surface electrode electrically connected to the diode region and the first conductivity type region on the first main surface, the first main surface electrode forming a Schottky junction with the diode region,
wherein the first main surface of the semiconductor layer includes a recessed portion that is formed in a region located at a side of the gate electrode layer such as to be recessed toward the second main surface and that exposes at least a part of the first conductivity type region,
the insulating layer has a first portion that covers the recessed portion and extends along the recessed portion from the side wall of the gate electrode layer and a second portion that covers the side wall of the gate electrode layer and extends along the side wall of the gate electrode layer, and
a thickness of the first portion of the insulating layer along a normal direction of the first main surface is greater than a thickness of the gate insulating layer along the normal direction.

12. The semiconductor device according to claim 11, wherein the well region forms a p-n junction portion with the diode region, and
the unit cell has a junction barrier Schottky (JBS) structure including the p-n junction portion formed between the well region and the diode region.

13. The semiconductor device according to claim 11, wherein the well region surrounds the diode region in plan view.

14. The semiconductor device according to claim 11, wherein the unit cell includes a contact region of the second conductivity type formed in a region between the diode region and the first conductivity type region in the surface layer portion of the well region and having a second conductivity type impurity concentration higher than a second conductivity type impurity concentration of the well region, and
the recessed portion exposes at least a part of the contact region together with at least the part of the first conductivity type region.

15. The semiconductor device according to claim 14, wherein the contact region forms a p-n junction portion with the diode region, and
the unit cell has a junction barrier Schottky (JBS) structure including the p-n junction portion formed between the contact region and the diode region.

16. The semiconductor device according to claim 11, wherein a plurality of the unit cells are formed in the surface layer portion of the first main surface, and
the gate electrode layer faces a portion of the well region of each the unit cell.

17. The semiconductor device according to claim 16, wherein the plurality of unit cells are arrayed in at least one of a matrix pattern or a staggered pattern at intervals in an arbitrary first direction and a second direction intersecting the first direction.

18. The semiconductor device according to claim 11, wherein the unit cell is formed as a linear cell extending in an arbitrary one direction.

19. The semiconductor device according to claim 11, wherein the semiconductor layer includes a semiconductor substrate that forms the second main surface and an epitaxial layer that is formed on the semiconductor substrate and that forms the first main surface.

20. The semiconductor device according to claim 11, further comprising a second main surface electrode which covers the second main surface of the semiconductor layer and forms an ohmic junction with the semiconductor layer.

* * * * *